（12） United States Patent
Obayashi et al.

(10) Patent No.: US 10,807,547 B2
(45) Date of Patent: Oct. 20, 2020

(54) ON-BOARD POWER SUPPLY APPARATUS

(71) Applicant: DENSO CORPORATION, Kariya, Aichi-pref. (JP)

(72) Inventors: Kazuyoshi Obayashi, Kariya (JP); Eisuke Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 705 days.

(21) Appl. No.: 15/429,801

(22) Filed: Feb. 10, 2017

(65) Prior Publication Data
US 2017/0225635 A1 Aug. 10, 2017

(30) Foreign Application Priority Data

Feb. 10, 2016 (JP) .................. 2016-023720
Feb. 11, 2016 (JP) .................. 2016-024226
Oct. 27, 2016 (JP) .................. 2016-211037

(51) Int. Cl.
B60R 16/033 (2006.01)
H02J 7/00 (2006.01)
F02N 11/10 (2006.01)
F02N 11/08 (2006.01)
F02D 41/00 (2006.01)
F02B 39/10 (2006.01)

(52) U.S. Cl.
CPC .......... B60R 16/033 (2013.01); F02B 39/10 (2013.01); F02D 41/0007 (2013.01); F02N 11/0866 (2013.01); F02N 11/108 (2013.01); H02J 7/007 (2013.01); H02J 7/0063 (2013.01); F02D 2400/14 (2013.01)

(58) Field of Classification Search
CPC .................................................. B60R 16/033
See application file for complete search history.

(56) References Cited

U.S. PATENT DOCUMENTS

| 5,162,720 | A | 11/1992 | Lambert |
| 2004/0164616 | A1 | 8/2004 | Obayashi et al. |
| 2010/0194318 | A1 | 8/2010 | Aso |
| 2011/0001352 | A1 | 1/2011 | Tamura et al. |
| 2011/0198920 | A1* | 8/2011 | Komuro ............ B60R 25/00 307/10.1 |
| 2013/0214595 | A1* | 8/2013 | Sierak .............. B60R 16/03 307/10.6 |
| 2014/0091767 | A1 | 4/2014 | Tamura et al. |

(Continued)

FOREIGN PATENT DOCUMENTS

| JP | H04-024758 Y2 | 6/1992 |
| JP | H09-140070 A | 5/1997 |

(Continued)

Primary Examiner — Daniel J Cavallari
(74) Attorney, Agent, or Firm — Oliff PLC

(57) ABSTRACT

A power supply apparatus configures an on-board power supply system that includes a first battery and a second battery. A first module and a first detecting unit are electrically connected to the first battery as a first electrical load. A second module and a second detecting unit are electrically connected to the second battery as a second electrical load. The first module and the second module configure an electric power steering apparatus. A starter is electrically connected to the first battery. The first battery and the second battery are electrically connected by a connection path. A resistor unit is provided on the connection path.

23 Claims, 29 Drawing Sheets

(56) References Cited

U.S. PATENT DOCUMENTS

2014/0252852 A1* 9/2014 Decoster ............... B60R 16/03
          307/10.8
2014/0312809 A1 10/2014 Ishida et al.

FOREIGN PATENT DOCUMENTS

| | | |
|---|---|---|
| JP | 2003-137021 A | 5/2003 |
| JP | 2003-291754 A | 10/2003 |
| JP | 2005-012971 A | 1/2005 |
| JP | 2006-010501 A | 1/2006 |
| JP | 2006029142 A | 2/2006 |
| JP | 2007-022196 A | 2/2007 |
| JP | 2008-054484 A | 3/2008 |
| JP | 2012-035756 A | 2/2012 |
| JP | 2014-034288 A | 2/2014 |
| JP | 2014-096937 A | 5/2014 |
| WO | 2015/059929 A1 | 4/2015 |

* cited by examiner

ON-BOARD POWER SUPPLY APPARATUS

CROSS-REFERENCE TO RELATED APPLICATION

This application is based on and claims the benefit of priority from Japanese Patent Application Nos. 2016-023720, filed Feb. 10, 2016, 2016-024226, filed Feb. 11, 2016, and 2016-211037, filed Oct. 27, 2016. The entire disclosures of the above applications are incorporated herein by reference.

BACKGROUND

Technical Field

The present disclosure relates to an on-board power supply apparatus. The present disclosure also relates to a power supply apparatus that includes first and second batteries, and is mounted in a vehicle.

Related Art

JP-A-H09-140070 describes an on-board system that includes a general-purpose battery, a basic electrical load, an alternator, and a starter. In this on-board system, the basic electrical load and the alternator are electrically connected to the general-purpose battery. The starter is used for engine startup. The on-board system further includes a startup battery, a relay, and a current-limiting resistor. The startup battery serves as an electric power supply source for the general-purpose battery. The relay and the current-limiting resistor connect the general-purpose battery and the startup battery.

In the above-described configuration, the starter is driven by receiving electric power from the startup battery, in a state in which the relay is open. As a result, when the starter is driven, electrical connection between the starter and the general-purpose battery can be interrupted. Voltage fluctuation in the general-purpose battery accompanying the driving of the starter is prevented. Therefore, stable electric power can be supplied to the basic electrical load that uses the general-purpose battery as an electrical power supply source.

In addition, in the above-described on-board system, when the voltage of the startup battery decreases as a result of the starter being driven, the relay is closed when the startup battery is charged by electric power generated by the alternator. In this case, because the voltage of the startup battery has significantly decreased in relation to the output voltage of the alternator, an inrush current may flow from the alternator to the startup battery. Therefore, to prevent the flow of inrush current, the above-described on-board system is provided with the current-limiting resistor.

Aside from the above-described on-board system, a travelling control system has been under development in recent years. The travelling control system assists in improving the reliability of travelling control. This system includes a plurality of individual electrical loads. The individual electrical loads are at least one of a sensor and an actuator used to perform common travelling control. As a result of the plurality of individual electrical loads being provided to perform common travelling control, the reliability of travelling control is improved. Here, in terms of further improving the reliability of travelling control, improved operational reliability of the individual electrical loads is required.

This is not limited to the configuration in which a plurality of individual electrical loads are used for common travelling control. If there is a configuration in which a plurality of individual electrical loads are used for common control, among various types of control performed in a vehicle, improved operational reliability of the individual electrical loads is required in terms of further improving the reliability of the common control.

JP-A-2011-78147 describes a power supply apparatus that includes an electrical load and a metal-oxide field-effect transistor (MOSFET). In this power supply apparatus, the electrical load is electrically connected to a lead battery and a lithium ion battery. The lead battery serves as the first battery and the lithium ion battery serves as the second battery. The MOSFET electrically connects the lead battery and the lithium ion battery. The power supply apparatus further includes a power generator that is electrically connected to the lead battery.

In the above-described power supply apparatus, the lead battery and the lithium ion battery may each be charged by electric power generated by the power generator in a state in which the MOSFET is closed. At this time, there is concern that loss will occur as a result of a charge current outputted from the power generator flowing through the MOSFET.

SUMMARY

A first exemplary embodiment of the present disclosure provides an on-board power supply apparatus that is capable of improving operational reliability of a plurality of individual electrical loads used to perform common control.

According to the first exemplary embodiment, there is provided a power supply apparatus that is mounted in a vehicle including a plurality of power supplies. This power supply apparatus includes: an individual electrical load that is an electrical load individually connected to each of the plurality of power supplies and is at least one of a sensor and an actuator for performing common control of the vehicle; a subject electrical load that an electrical load connected to at least one power supply of the plurality of power supplies; a connection path that connects the plurality of power supplies to each other during a period over which each individual electrical load is operating to perform the common control; and a resistor unit that is provided on the connection path.

In the above-described first exemplary embodiment, an individual electrical load is connected to each of the plurality of power supplies. During the period over which each individual electrical load is operating to perform the common control, the plurality of power supplies are connected by the connection path. As a result of this configuration, when each of the plurality of power supplies are in a normal state, the plurality of power supplies can be respectively used as the power supplies for the individual electrical loads. Meanwhile, when an abnormality occurs in a part of the plurality of power supplies, the remaining power supply can be used as the power supply for each individual electrical load. In this way, as a result of the above-described first exemplary embodiment, the power supply for each individual load can be made redundant. Consequently, power supply for each individual electrical load can be secured, and operational reliability of each individual electrical load can be improved.

In addition, in the above-described first exemplary embodiment, the resistor unit is provided on the connection path. Therefore, when the target electrical load operates using electric power supplied from each of the plurality of power supplies, a discharge current flowing to the target electrical load from a power supply that is not connected to the target electrical load, among the plurality of power supplies, can be suppressed by the resistance of the resistor unit. As a result, voltage decrease in the power supply that is not connected to the target electrical load, among the plurality of power supplies, can be suppressed. Consequently, variation in the voltage applied to each individual electrical load connected to the power supply that is not connected to the target electrical load, among the plurality of power supplies, can be suppressed. A stable voltage can be supplied to each individual electrical load connected to the power supply that is not connected to the target electrical load, among the plurality of power supplies. Therefore, during operation of the target electrical load, operational reliability of the individual electrical loads individually connected to the power supply that is not connected to the target electrical load, among the plurality of power supplies, can be maintained.

An on-board power supply system may be configured by the on-board power supply apparatus of the first exemplary embodiment and the above-described plurality of power supplies being provided.

A second exemplary embodiment of the present disclosure provides an on-board power supply apparatus that is capable of reducing loss that occurs when a first battery and a second battery are both charged by electric power generated by a power generator.

According to the second exemplary embodiment, there is provided a power supply apparatus that includes a first battery and a second battery, and is mounted in a vehicle. This power supply apparatus includes: a connecting unit that electrically connects the first battery and the second battery; a power generator; and an output unit that is electrically connected to each of a first electrical path and a second electrical path, and outputs electric power generated by the power generator, the first electrical path connecting between the connecting unit and the first battery, the second electrical path connecting between the connecting unit and the second battery.

In the above-described second exemplary embodiment, the first battery and the second battery are electrically connected via the connecting unit. The output unit is connected to the electrical path connecting the connecting unit and the first battery. The output unit is also connected to the electrical path connecting the connecting unit and the second battery. Therefore, compared to a configuration in which the output unit is connected to only either of the first and second electrical paths, potential difference between two ends of the connecting unit when electric power generated by the power generator is outputted from the output unit can be reduced. Current flowing through the connecting unit can be reduced. As a result, loss that occurs when the first battery and the second battery are both charged by electric power generated by the power generator can be reduced.

As a result of loss being reduced, heat generation caused by the current flowing through the connecting unit can be suppressed. Therefore, the physical construction of a heat releasing portion, such as fins, can be made smaller. Furthermore, the power supply apparatus can be more easily mounted in the vehicle.

An on-board power supply system may be configured by the on-board power supply apparatus of the second exemplary embodiment, the first battery, and the second battery being provided.

DESCRIPTION OF THE EMBODIMENTS

First Embodiment

A first embodiment of an on-board power supply apparatus will hereinafter be described with reference to the drawings. According to the present embodiment, the power supply apparatus is presumed to be mounted in a vehicle that includes an engine as an on-board main machine.

Figure 1:
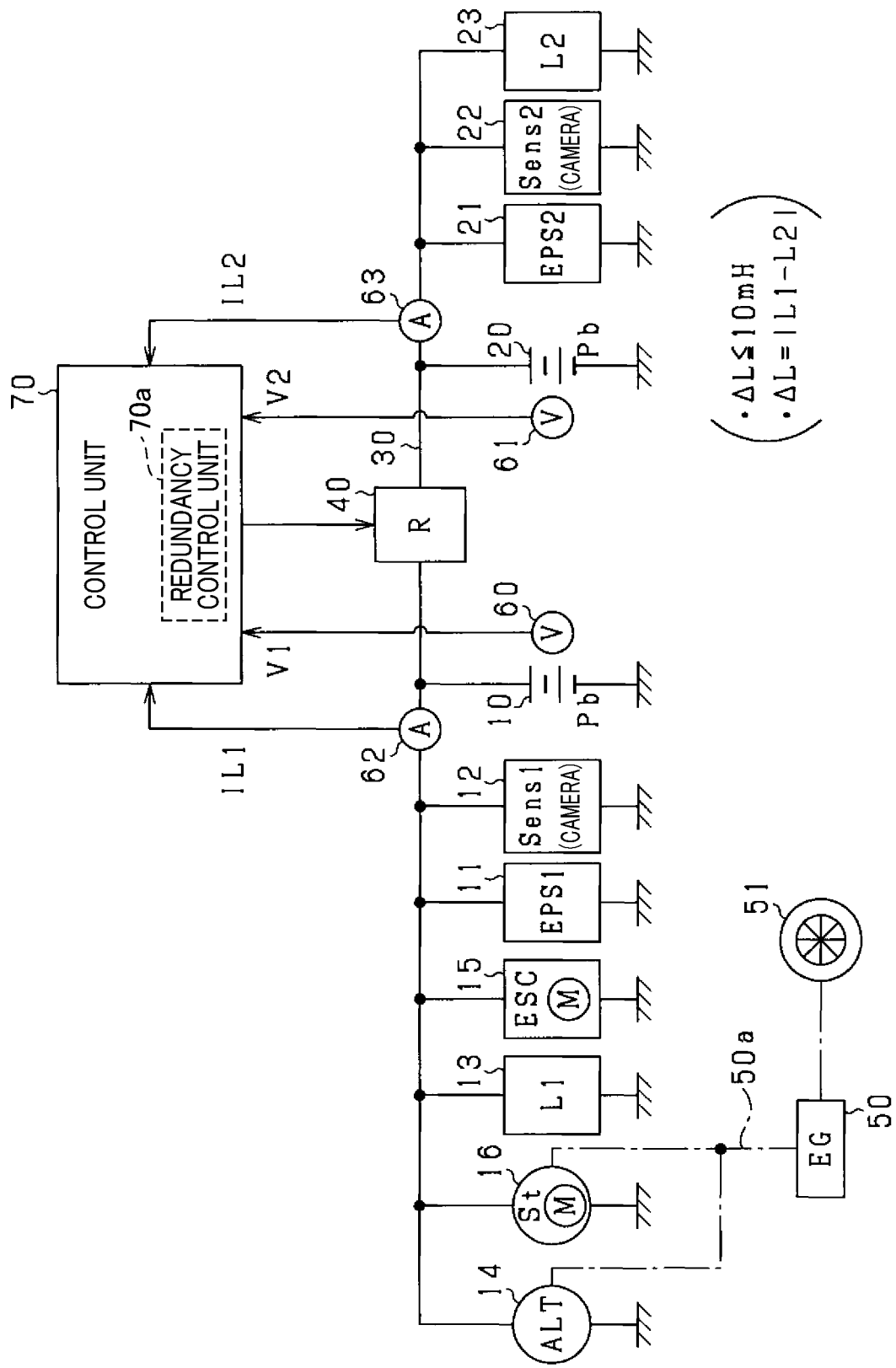
FIG. 1 is an overall configuration diagram of an on-board power supply system according to a first embodiment.

As shown in FIG. 1, the vehicle includes an on-board power supply system. The power supply system includes a first battery 10 and a second battery 20. According to the present embodiment, the first battery 10 and the second battery 20 are lead batteries that have the same full-charge capacity. The respective negative terminals of the first battery 10 and the second battery 20 are grounded to the vehicle body. According to the present embodiment, the respective full-charge capacities of the first battery 10 and the second battery 20 refer to capacities obtained by the full-charge capacity required to operate each on-board electrical load being equally halved. Therefore, the physical structures of the first battery 10 and the second battery 20 are smaller than that of a typical battery.

Figure 2:
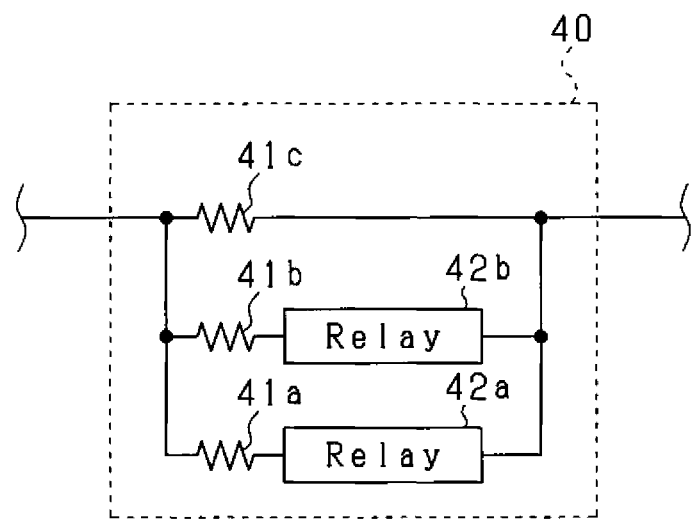
FIG. 2 is a diagram of a configuration of a resistor unit.

A positive terminal of the first battery 10 and a positive terminal of the second battery 20 are electrically connected by a connection path 30. A resistor unit 40 is provided on the connection path 30. As shown in FIG. 2, the resistor unit 40 includes first to third resistors 41a to 41c, and first and second relays 42a and 42b. Specifically, the resistor unit 40 is configured such that a serial-connection body composed of the first resistor 41a and the first relay 42a, a serial-connection body composed of the second resistor 41b and the second relay 42b, and the third resistor 41c are connected in parallel. As a result of this configuration, the first battery 10 and the second battery 20 are electrically connected at all times by at least the third resistor 41c. According to the present embodiment, direct-current relays are used as the first and second relays 42a and 42b. In addition, according to the present embodiment, a resistance value of the resistor unit 40 is presumed to be a value ranging from half to about 20 times an internal resistance value of the first and second batteries 10 and 20.

Returning to the foregoing description of FIG. 1, the power supply system includes a first module 11 and a second module 21. The first module 11 is connected in parallel to the first battery 10. The second module 21 is connected in parallel to the second battery 20. The first module 11 and the second module 12 configure an electric power steering apparatus. The electric power steering apparatus will be described hereafter, with reference to FIG. 3.

The first module 11 corresponds to a first electrical load that includes a first drive circuit 11a and various sensors (not shown). According to the present embodiment, the first drive circuit 11a is a three-phase inverter device that converts direct-current power supplied from the first battery 10 and direct-current power supplied from the second battery 20 via the resistor unit 40 to alternating-current power, and outputs the alternating-current power. The alternating-current power outputted from the first drive circuit 11a is supplied to a first motor 11b. The first motor 11b is driven by receiving the alternating-current power, and generates torque. The various sensors include, for example, a current sensor that detects a current flowing to the first drive circuit 11a. In addition, according to the present embodiment, the first motor 11b is a three-phase motor. Specifically, for example, a permanent magnet synchronous machine can be used as the first motor 11b.

The second module 21 corresponds to a second electrical load that includes a second drive circuit 21a and various sensors (not shown). According to the present embodiment, the configuration of the second module 21 is similar to that of the first module 11. Therefore, according to the present embodiment, a detailed description of the second module 21 is omitted.

Figure 3:
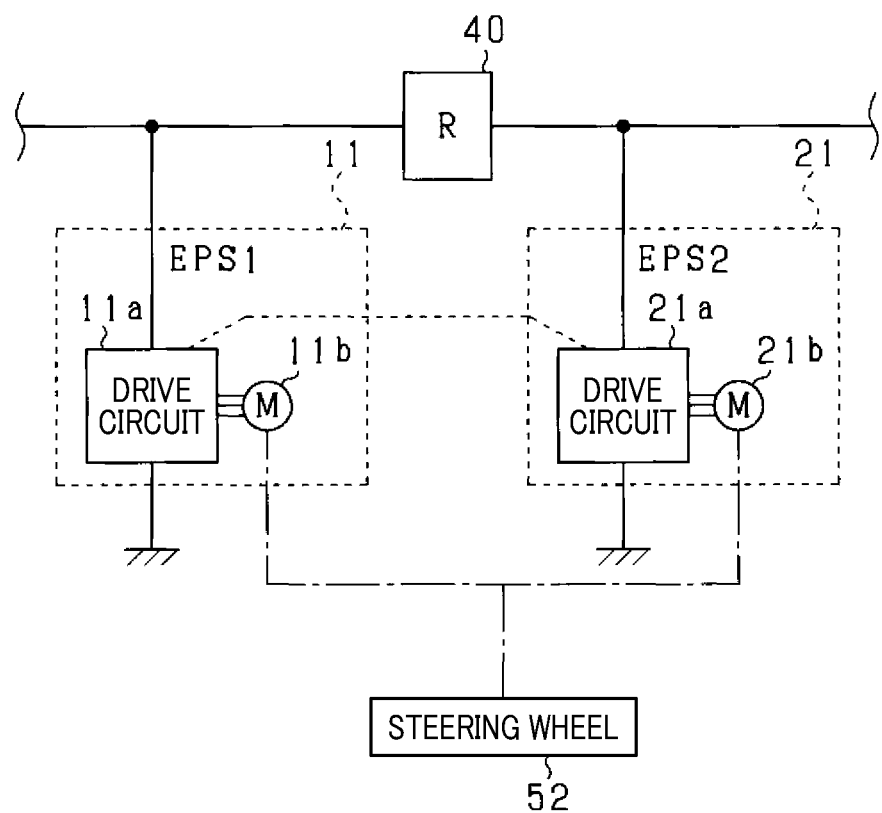
FIG. 3 is a diagram of a configuration of an electric power steering apparatus.

An output shaft (not shown) is connected to respective rotors of the first motor 11b and the second motor 21b. A steering wheel 52 for steering is connected to the output shafts, via a reducer or the like. In cooperation, the first module 11 and the second module 21 generate assistance torque to assist steering by a driver, while exchanging information between the first drive circuit 11a and the second drive circuit 21a. In FIG. 3, a configuration in which two motors are separately installed is shown for convenience. However, the configuration is not limited thereto. For example, a configuration in which two sets of three-phase windings are wound in a single motor, and the sets of windings are respectively energized by drive circuits can also be used.

Returning to the foregoing description of FIG. 1, the power supply system includes a first detecting unit 12 and a second detecting unit 22. The first detecting unit 12 is connected in parallel to the first battery 10 and serves as the first electrical load. The second detecting unit 22 is connected in parallel to the second battery 20 and serves as the second electrical load. According to the present embodiment, the first detecting unit 12 and the second detecting unit 22 are on-board cameras that capture images of a course ahead of the own vehicle. The first detecting unit 12 and the second detecting unit 22 are respectively operated using the first battery 10 and the second battery 20 as the power supply.

According to the present embodiment, the first module 11, the first detecting unit 12, the second module 21, and the second detecting unit 22 each correspond to an individual electrical load. In addition, according to the present embodiment, an electric supercharger 15 and a starter 16 are examples of a target electrical load.

The power supply system includes a first basic electrical load 13 and a second basic electrical load 23. The first basic electrical load 13 is connected in parallel to the first battery 10. The second basic electrical load 23 is connected in parallel to the second battery 20. The first basic electrical load 13 and the second basic electrical load 23 are respectively operated using the first battery 10 and the second battery 20 as the power supply.

The power supply system includes an alternator 14, the electric supercharger 15, and the starter 16. The alternator 14, the electric supercharger 15, and the starter 16 are each connected in parallel to the first battery 10. According to the present embodiment, the electric supercharger 15, the starter 16, and apparatuses (not shown) of which power consumption exceeds 300 W are examples of a third electrical load. The apparatuses of which power consumption exceeds 300 W include, for example, at least one of a compressor for an electric air-conditioner and an electric stabilizer.

The alternator 14 generates electric power by receiving power from a crank shaft 50a of an on-board engine 50. The first battery 10 and the second battery 20 can be charged, and other electrical loads can be supplied electric power, through the electric power generated by the alternator 16.

The electric supercharger 15 is an apparatus that is driven by receiving electric power, thereby compressing intake air supplied to a combustion chamber of the engine 50. Specifically, the electric supercharger 15 is an electric supercharger that is set in an intake pipe connected to the combustion chamber or an electric turbocharger that is set in an intake and exhaust turbine. The starter 16 is driven by receiving electric power, thereby applying an initial rotation to the crank shaft 50a and starting the engine 50. After startup of the engine 50 is completed, power outputted from the engine 50 is transmitted to a drive wheel 51. According to the present embodiment, power consumption when the electric supercharger 15 and the starter 16 each operate exceeds 300 W, in a manner similar to other large electrical loads.

The electric supercharger 15 and the starter 16 are driven by receiving electric power from the first battery 10, and electric power from the second battery 20 via the connection path 30. As a result, the electric supercharger 15 and the starter 16 can be supplied sufficient electric power from the two batteries. In addition, because the resistor unit 40 is provided on the connection path 30, even when the electric supercharger 15 and the starter 16 are driven and electric power is consumed, the amount of decrease in the output voltage of the second battery 20 is less than the amount of decrease in the output voltage of the first battery 10. Therefore, supply voltage supplied to an electrical load connected further to the second battery 20 side than the resistor unit 40 on the connection path 30 can be stabilized. In particular, according to the present embodiment, an allowable lower-limit value of the supply voltage to the second basic electrical load 23 at which operational reliability can be guaranteed is higher than the respective allowable lower-limit values of the supply voltages of the first basic electrical load 13 and the third electrical load. Therefore, as a result of the second basic electrical load 23 being connected further to the second battery 20 side than the resistor unit 40 on the connection path 30, operational reliability of the second basic electrical load 23 when the electric supercharger 15 and the starter 16 are driven can be guaranteed.

According to the present embodiment, wiring of the power supply system is configured such that a difference ΔL between an inductance L1 and an inductance L2 is equal to or less than 10 mH. The inductance L1 is that of an electrical path from the positive terminal of the first battery 10 to the respective positive terminal sides of the electric supercharger 15 and the starter 16. The inductance L2 is that of an electrical path from the positive terminal of the second battery 20 to the respective positive terminal sides of the electric supercharger 15 and the starter 16. As a result, voltage variation between when the first battery 10 and the second battery 20 start supplying electric power to the electric supercharger 15 and the starter 16, and when the first battery 10 and the second battery 20 complete supplying electric power to the electric supercharger 15 and the starter 16 can be reduced.

The power supply system includes a first voltage detecting unit 60 and a second voltage detecting unit 61. The first voltage detecting unit 60 detects the output voltage of the first battery 10. The second voltage detecting unit 61 detects the output voltage of the second battery 20. The power supply system includes a first current detecting unit 62 and a second current detecting unit 63. The first current detecting unit 62 detects a load current supplied from the first battery 10 to the electrical loads 11 to 13 and 15. The second current detecting unit 63 detects a load current supplied from the second battery 20 to the electrical loads 21 to 23.

The power supply system includes a control unit 70 that performs various types of control in the vehicle. Detection values from the detecting units 60 to 63 are inputted to the control unit 70. The control unit 70 performs open-close control of the first and second relays 42a and 42b of the resistor unit 40, power generation control of the alternator 14, drive control of the electric supercharger 15, drive control of the starter 16, combustion control of the engine 50, and the like. In addition, the control unit 70 performs charge-discharge control to control the state of charge (SOC) of the first battery 10 and the second battery 20 to a target value thereof. According to the present embodiment, the first battery 10 and the second battery 20 are of the same type. The full-charge capacities of the first battery 10 and the second battery 20 are the same. Therefore, SOC control can be simplified. The controls described above may actually be executed by separate control units. However, these control units are collectively expressed by the single control unit 70 in FIG. 1.

The control unit 70 includes a redundancy control unit 70a. The redundancy control unit 70a performs control to improve the reliability of various types of travelling control. In particular, according to the present embodiment, the redundancy control unit 70a configures a lane keeping assistance system, together with the first and second modules 11 and 21 and the first and second detecting units 12 and 22. The system recognizes a traffic lane on a road in which an own vehicle is traveling, based on detection information from the first and second detecting units 12 and 22. The first and second detecting units 12 and 22 are on-board cameras. When the own vehicle attempts to deviate from the traffic lane in which the own vehicle is traveling, the system performs control to return the own vehicle to the center of the traffic lane through assistance torque from the electric power steering apparatus.

According to the present embodiment, the electric power steering apparatus is divided into the first and second modules 11 and 21, and includes two detecting units, that is, the first and second detecting units 12 and 22 as the on-board cameras, for lane keeping assistance control performed by the lane keeping assistance system. As a result, for example, even in cases in which an abnormality occurs in either of the first and second detecting units 12 and 22, the detection information from the other can be used for control. A situation in which the lane keeping assistance control is suddenly unable to be performed can be avoided. In addition, as a result of the first battery 10 and the second battery 20 being included, even in cases in which an abnormality occurs in either of the first and second batteries 10 and 20, the power supply can be made redundant. Operational reliability of the first and second modules 11 and 21 and the first and second detecting units 12 and 22 can be improved. As a result, reliability of the lane keeping assistance control can be improved.

Figure 4:
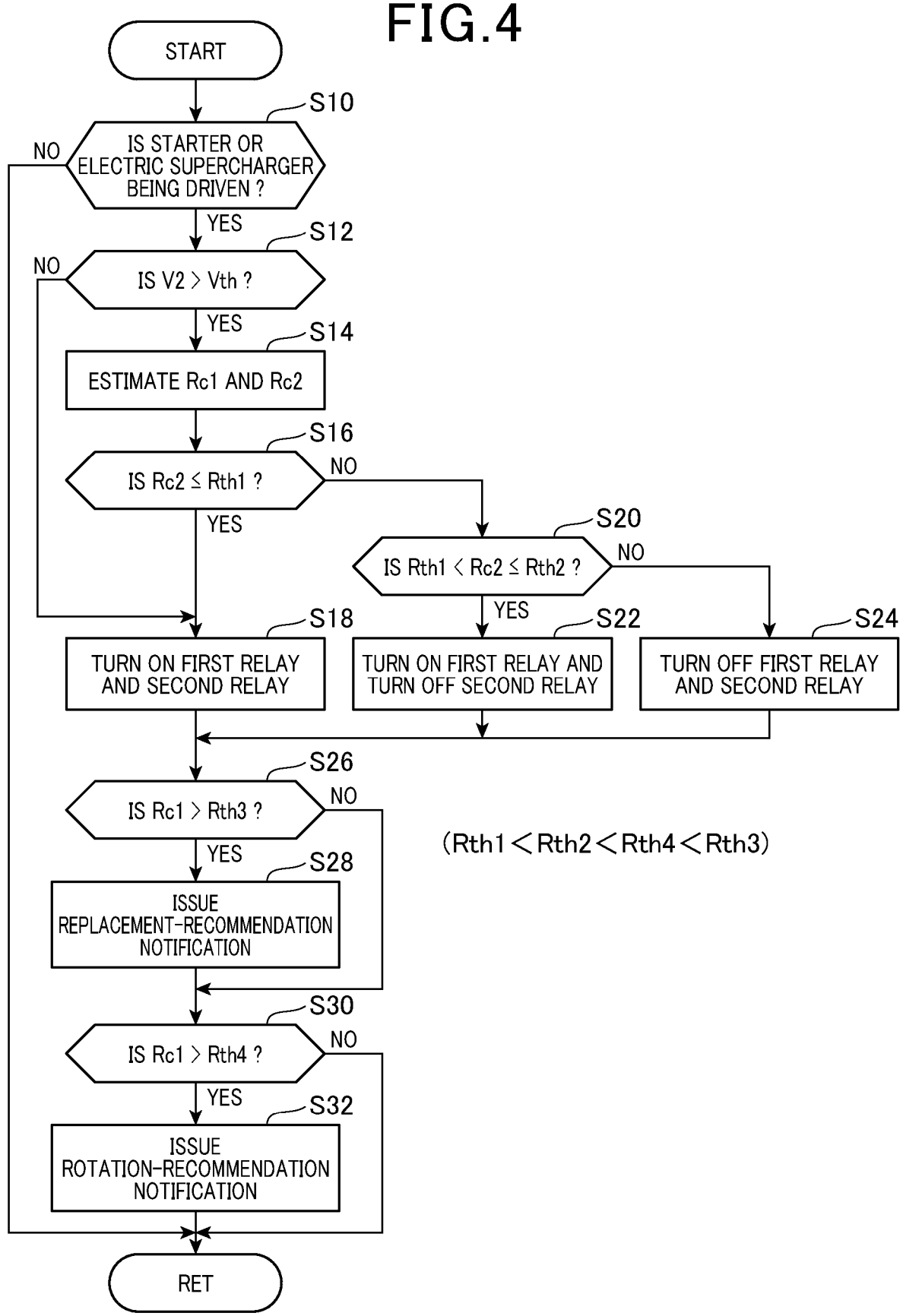
FIG. 4 is a flowchart of the steps in a process performed by a control unit.

The control unit 70 performs a process as a measure to be taken in cases in which the first battery 10 and the second battery 20 become degraded. FIG. 4 shows the steps in this process. The process is repeatedly performed by the control unit 70, for example, at a predetermined cycle.

In this series of processes, first, at step S10, the control unit 70 determines whether or not the starter 16 or the electric supercharger 15 is receiving electric power from the first battery 10 or the second battery 20 and is being driven.

When determined that the starter 16 or the electric supercharger 15 is being driven at step S10, the control unit 70 proceeds to step S12. The control unit 70 determines whether or not the output voltage (referred to, hereafter, as a "second voltage detection value V2") detected by the second voltage detecting unit 61 is lower than a predetermined voltage Vth. The control unit 70 performs this process to determine whether or not the probability that the second battery 20 has become degraded is high. That is, when the second battery 20 becomes degraded, the internal resistance value of the second battery 20 increases relative to an initial value thereof. Therefore, for example, the amount of decrease in the output voltage of the second battery 20 when the starter 16 is driven increases. According to the present embodiment, the process at step S12 corresponds to a voltage determining unit.

When determined that the output voltage is lower than the predetermined voltage Vth at step S12, the control unit 70 proceeds to step S14. The control unit 70 estimates a first internal resistance value Rc1 and a second internal resistance value Rc2. The first internal resistance value Rc1 is the internal resistance value of the first battery 10. The second internal resistance value Rc2 is the internal resistance value of the second battery 20.

Specifically, the control unit 70 may estimate the first internal resistance value Rc1 based on the output voltage (referred to hereafter as a "first voltage detection value V1") detected by the first voltage detecting unit 60 and a load current (referred to, hereafter, as a "first current detection value IL1") detected by the first current detecting unit 62. Specifically, for example, the control unit 70 may estimate the first internal resistance value Rc1 based on a relationship expressed by $Rc1=(Vx-Vy)/(Iy-Ix)$ with Vx and Ix that are the first voltage detection value V1 and the first voltage current value IL1 before the starter 16 is started and Vy and Iy that are the first voltage detection value V1 and the first current detection value IL1 when the starter 16 is driven as inputs. The estimation can also be made by a similar method using, for example, the values before and after operation of another large electrical load of which power consumption exceeds 300 W, instead of the starter 16.

In addition, the control unit 70 may estimate the second internal resistance value Rc2 by a method similar to the method for estimating the first internal resistance value Rc1, based on the second voltage detection value V2 and the load current (referred to, hereafter, as a "second current detection value IL2") detected by the second current detecting unit 63. According to the present embodiment, the process at step S14 corresponds to a resistance estimating unit.

After completing step S14, the control unit 70 proceeds to step S16. The control unit 70 determines whether or not the second internal resistance value Rc2 estimated at step S14 is equal to or less than a first threshold Rth1.

When determined that the second internal resistance value Rc2 estimated at step S14 is equal to or less than the first threshold Rth1, or when determined NO at step S12, the control unit 70 determines that the second battery 20 has not become degraded and proceeds to step S18. At step S18, the control unit 70 operates the first relay 42a and the second relay 42b so as to be kept in the closed state, which is the initial state.

Meanwhile, when determined that the second internal resistance value Rc2 is greater than the first threshold Rth1 at step S16, the control unit 70 determines that the second battery 20 has become degraded and proceeds to step S20. At step S20, the control unit 70 determines whether or not the second internal resistance value Rc2 is greater than the first threshold Rth and equal to or less than a second threshold Rth2 (>Rth1).

When determined YES at step S20, the control unit 70 proceeds to step S22. The control unit 70 keeps the first relay 42a closed, and opens the second relay 42b. As a result, the resistance value of the resistor unit 40 becomes greater than the resistance value of the resistor unit 40 when the process at step S18 is performed.

Meanwhile, when determined NO at step S20, the control unit 70 determines that the degradation of the second battery 20 has further progressed and proceeds to step S24. At step S24, the control unit 70 opens the first relay 42a, while keeping the second relay 42b open. As a result, the resistance value of the resistor unit 40 becomes greater than the resistance value of the resistor unit 40 when the process at step S22 is performed. According to the present embodiment, the processes at step S16 and S20 correspond to a resistance determining unit. In addition, the processes at steps S18, S22, and S24 correspond to an operating unit.

As a result of the processes at steps S16 to S24, the resistance value of the resistor unit 40 can be increased as the degree of degradation of the second battery 20 increases. Therefore, even in cases in which the degree of degradation of the second battery 20 is high, for example, the discharge current of the second battery 20 when the starter 16 is driven can be suppressed. The output voltage of the second battery 20 can be maintained at an appropriate level.

After completing the process at step S18, S22, or S24, the control unit 70 proceeds to step S26. At step S26, the control unit determines whether or not the first internal resistance value Rc1 estimated at step S14 is greater than a third threshold Rth3 (>Rth2). The control unit 70 performs this process to notify the user of replacement-recommendation information that recommends that the first battery 10 currently mounted in the vehicle is replaced with a new battery. According to the present embodiment, the process at step S26 corresponds to a second determining unit. The third threshold Rth3 corresponds to a second predetermined value.

When determined YES at step S26, the control unit 70 proceeds to step S28. The control unit 70 notifies the user of the replacement-recommendation information. Here, for example, notification of the replacement-recommendation information may be issued by a display unit, such as a warning lamp, provided on an instrument panel of the vehicle, or through transmission of electronic mail to a portable terminal belonging to the user.

After completing the process at step S28 or determining NO at step S26, the control unit 70 proceeds to step S30. At step S30, the control unit 70 determines whether or not the first internal resistance value Rc1 is greater than a fourth threshold Rth4. The fourth threshold Rth4 is set to a value that is greater than the second threshold Rth2 and less than the third threshold Rth3. The fourth threshold Rth4 corresponds to a first predetermined value. The control unit 70 performs this process to determine whether or not to notify the user of rotation-recommendation information. The rotation-recommendation information recommends that the user temporarily remove the first battery 10 and the second battery 20 from the current installation locations, and subsequently set the removed second battery 20 in the former installation location of the first battery 10 and set the removed first battery 10 in the former installation location of the second battery 20. According to the present embodiment, the process at step S30 corresponds to a first determining unit.

When determined YES at step S30, the control unit 70 proceeds to step S32. The control unit 70 notifies the user of the rotation-recommendation information. Here, notification of the rotation-recommendation information may be issued by a method similar to that described at step S28.

Electrical loads that consume large amounts of electric power, that is, the electric supercharger 15 and the starter 16, are connected to the first battery 10. Therefore, degradation tends to progress more quickly in the first battery 10 than in the second battery 20. Therefore, as a result of the user being notified of the rotation-recommendation information, the user can be prompted to rotate between the first battery 10 and the second battery 20. As a result, either of the first and second batteries 10 and 20 becoming more degraded than the other can be prevented.

When the batteries are rotated or when a battery is replaced, the internal resistance value estimated at step S14 that is subsequently performed changes. Then, at steps S16 to S24, the resistance value of the resistor unit 40 that is based on the current internal resistance value is set. For example, when only either of the first battery 10 and the second battery 20 is replaced with a new battery, the control unit 70 determines YES at step S20 and performs the process at step S22 to reduce the resistance value of the resistor unit 40. In addition, for example, when both the first battery 10 and the second battery 20 are replaced with new batteries, the control unit 70 determines YES at step S16 and performs the process at step S18 to reset the resistance value of the resistor unit 40 to the initial value thereof. Because degradation of the battery gradually progresses, the control unit 70 may consider the condition determining degradation to be established when the condition is established a consecutive number of times in the determinations performed at steps S16, S20, S24, S26, and S30. For example, when the condition is established in the five most recent measurement operations, the control unit 70 may determine that degradation has progressed a single stage. As a result, measurement error in the detection values of the detecting units and the like can be prevented.

According to the present embodiment, described in detail above, the following effects can be achieved.

The first module 11 and the first detecting unit 12 are electrically connected to the first battery 10. The second module 21 and the second detecting unit 22 are electrically connected to the second battery 20. The first battery 10 and the second battery 20 are electrically connected at all times by the connection path 30. As a result of this configuration, power supply to the first and second modules 11 and 21 and the first and second detecting units 12 and 22 can be made redundant. Operational reliability of the first and second modules 11 and 21 and the first and second detecting units 12 and 22 can be improved.

In addition, the resistor unit 40 is provided on the connection path 30. Therefore, when the electric supercharger 15 or the starter 16 is driven, the discharge current flowing from the second battery 20 to the electric supercharger 15 or the starter 16 can be suppressed by the resistance in the resistor unit 40. As a result, voltage decrease in the second battery 20 can be suppressed. Operational reliability of the second module 21, the second detecting unit 22, and the second basic electrical load 23 can be maintained.

When determined that the second voltage detection value V2 is equal to or higher than the predetermined voltage Vth, the control unit 70 determines that the probability that the second battery 20 is not degraded is high. The control unit 70 then proceeds to the process at step S18. As a result, the control unit 70 can transition to the process at step S18 without performing the estimation process for the internal resistance value. Calculation load placed on the control unit 70 can be reduced.

When determined that the second internal resistance value Rc2 is greater than the first threshold Rth1 and equal to or less than the second threshold Rth2, the control unit 70 increases the resistance value of the resistor unit 40 from the initial value thereof. In addition, when determined that the second internal resistance value Rc2 is greater than the second threshold Rth2, the control unit 70 further increases the resistance value of the resistor unit 40. As a result, the resistance value of the resistor unit 40 can be changed based on the degree of degradation of the second battery 20. The ratio of burden between the first battery 10 and the second battery 20, that is, the ratio of the current supplied to the electrical loads from the first battery 10 and from the second battery 20 can be adjusted. As a result, decrease in the output voltage of the second battery 20 can be prevented.

The direct-current relays are used as the switches configuring the resistor unit 40. The resistance value of the resistor unit 40 according to the present embodiment is increased when the degradation of the battery progresses. Therefore, the operating states of the switches are not frequently changed. In addition, high responsiveness is not required. Therefore, the direct-current relay that has a lower responsiveness than a semiconductor switching element can be used.

The resistor unit 40 is configured as shown in FIG. 2. As a result of this configuration, compared to a configuration in which the first battery 10 and the second battery 20 are connected by a direct current-to direct current (DC-DC) converter or the like, a fewer number of switches are required to be operated. Therefore, reliability of the resistor unit 40 can be improved.

In addition, in the configuration shown in FIG. 2, the first battery 10 and the second battery 20 are connected at all times by the third resistor 41c. Therefore, when the degree of degradation of the second battery 20 becomes high, decrease in the output voltage of the second battery 20 resulting from electric power being carried from the second battery 20 can be easily prevented by the third resistor 41c. A control sequence in which the first battery 10 and the second battery 20 are electrically blocked from each other by, for example, a relay, is not required to be performed.

Second Embodiment

Figure 5:
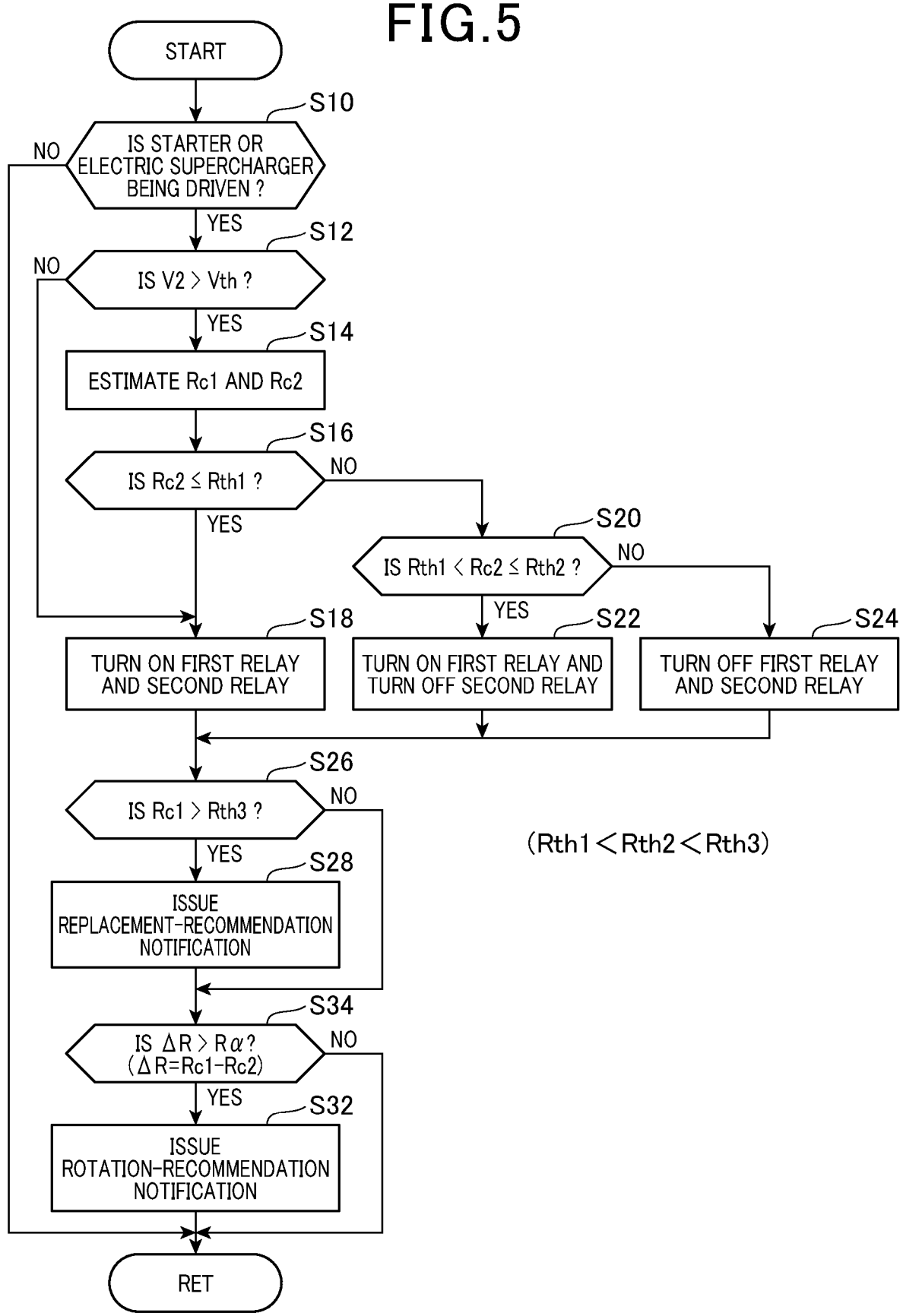
FIG. 5 is a flowchart of the steps in a process performed by a control unit according to a second embodiment.

A second embodiment will be described below with reference to the drawings, mainly focusing on the differences from the above-described first embodiment. According to the present embodiment, as shown at step S34 in FIG. 5, the method for determining whether or not to issue notification of the rotation-recommendation information is modified. In FIG. 5, processes that are identical to the processes shown in foregoing FIG. 4 are given the same reference numbers for convenience.

As shown in FIG. 5, at step S34, the control unit 70 determines whether or not a resistance difference ΔR is greater than a predetermined value Rα. The resistance difference ΔR is a value obtained by the second internal resistance value Rc2 being subtracted from the first internal resistance value Rc1. According to the present embodiment, the process at step S34 corresponds to a main determining unit.

According to the above-described present embodiment as well, effects similar to those according to the above-described first embodiment can be achieved.

Third Embodiment

Figure 6:
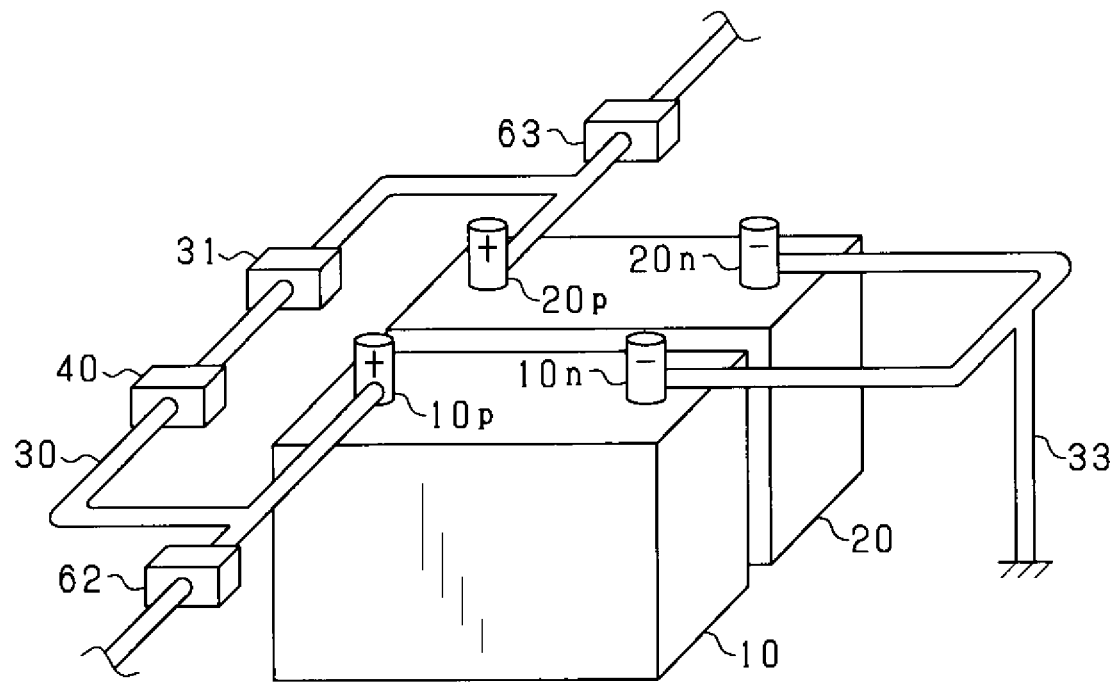
FIG. 6 is a diagram of an arrangement aspect of a safety plug according to a third embodiment.
Figure 7:
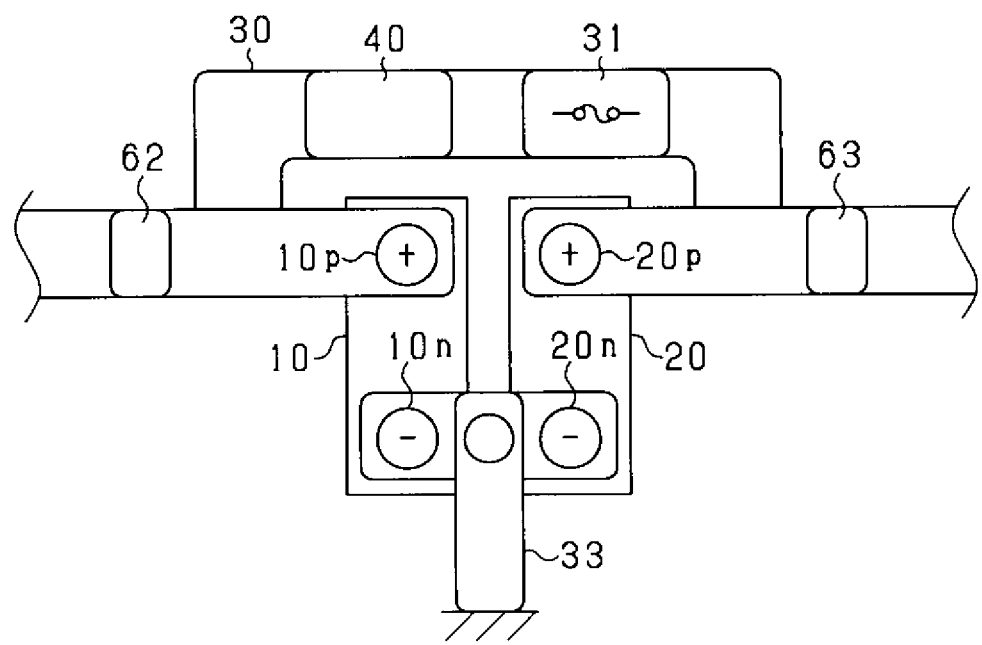
FIG. 7 is a diagram of an arrangement aspect of the safety plug.

A third embodiment will be described below with reference to the drawings, mainly focusing on the differences from the above-described first embodiment. According to the present embodiment, as shown in FIG. 6 and FIG. 7, a safety plug 31 that serves as a blocking member is provided on the connection path 30. In FIG. 6 and FIG. 7, configurations that are identical to the configurations shown in foregoing FIG. 1 are given the same reference numbers for convenience.

As shown in FIG. 6 and FIG. 7, the safety plug 31 electrically connects the first battery 10 and the second battery 20 in a state in which the safety plug 31 is inserted into the connection path 30. Meanwhile, as a result of the user removing the safety plug 31 from the connection path 30, the first battery 10 and the second battery 20 are electrically blocked from each other.

In FIG. 6 and FIG. 7, the positive and negative terminals of the first battery 10 are indicated by 10p and 10n. The positive and negative terminals of the second battery 20 are indicated by 20p and 20n. In addition, an electrical path connecting the negative terminals 10n and 20n to ground potential is indicated by 33.

The user removes the safety plug 31 when the user does not use the vehicle over a long period of time. Subsequently, the user inserts the safety plug 31 when the user uses the vehicle. Here, a case in which the user does not use the vehicle for a long period of time is when, for example, the vehicle is parked for a long period of time in a parking lot of an airport. The effects of the safety plug 31 will be described below.

In a state in which the first battery 10 and the second battery 20 are connected via the connection path 30, dark current flows between the first battery 10 and the second battery 20. Electric power is consumed in the resistor unit 40. When this electric power consumption continues for a long period of time, the charge capacities of the first battery 10 and the second battery 20 decrease. A situation such as this can be prevented by the safety plug 31 being removed. An electrical load that operates a vehicle theft prevention function and an electrical load for locking the doors of the vehicle may be electrically connected to the second battery 20.

According to the present embodiment, the safety plug 31 is provided with a fuse. In a state in which the safety plug 31 is inserted into the connection path 30, the fuse is connected in series to the first battery 10 and the second battery 20. The effect of the fuse will be described below.

In foregoing FIG. 1, when a short circuit occurs at a grounding site in a portion of wiring that connects the positive terminal of the second battery 20 to each of: the second battery 20 side of the resistor unit 40; the electrical loads 21 to 23; and the alternator 14, a large current flows from the first battery 10 towards the second battery 20 side via the connection path 30. Meanwhile, when a short circuit occurs at a grounding site in a portion of wiring from the positive terminal of the first battery 10 to the first battery 10 side of the resistor unit 40 that connects to the electrical loads 11 to 13 and 15 and the starter 16, a large current flows from the second battery 20 towards the first battery 10 side via the connection path 30. In this case, as a result of the fuse melting, the first battery 10 and the second battery 20 are electrically blocked from each other. As a result, the functions of the system, of the first battery 10 or the second battery 20, in which the short circuit has not occurred can be maintained. That is, either of the first electrical load and the second electrical load can be operated.

Fourth Embodiment

Figure 8:
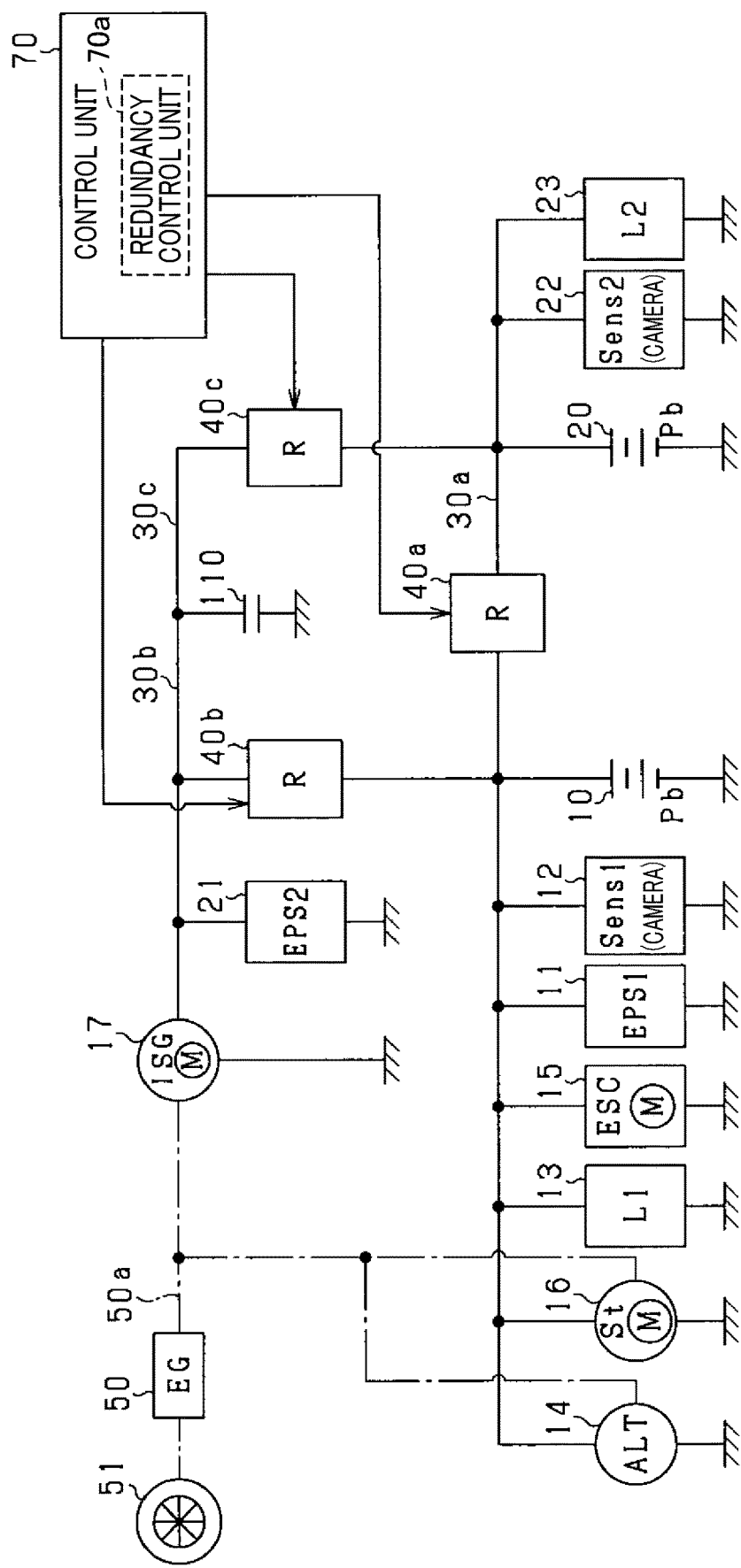
FIG. 8 is an overall configuration diagram of an on-board power supply system according to a fourth embodiment.

A fourth embodiment will be described below with reference to the drawings, mainly focusing on the differences from the above-described first embodiment. According to the present embodiment, as shown in FIG. 8, the vehicle includes three power supplies. In FIG. 8, configurations that are identical to the configurations shown in foregoing FIG. 1 are given the same reference numbers for convenience. In addition, according to the present embodiment, the resistor unit 40 is referred to as a first resistor unit 40a. The connection path 30 is referred to as a first connection path 30a.

As shown in FIG. 8, the power supply system includes a capacitor 110 as a third power supply. For example, an electric double-layer capacitor can be used as the capacitor 110.

A high-potential side terminal of the capacitor 110 and the positive terminal of the first battery 10 are electrically connected by a second connection path 30b. In addition, the high-potential side terminal of the capacitor 110 and the positive terminal of the second battery 20 are electrically connected by a third connection path 30c. A low-potential side terminal of the capacitor 110 is grounded to the vehicle body.

A second resistor unit 40b is provided on the second connection path 30b. A third resistor unit 40c is provided on the third connection path 30c. According to the present embodiment, the configurations of the second resistor unit 40b and the third resistor unit 40c are the same as the configuration of the first resistor unit 40a shown in foregoing FIG. 2. As a result of the second resistor unit 40b, the first battery 10 and the capacitor 110 are electrically connected at all times by at least the third resistor 41c. In addition, as a result of the third resistor unit 40c, the second battery 20 and the capacitor 110 are electrically connected at all times by at least the third resistor 41c. The resistance values of the second resistor unit 40b and the third resistor unit 40c are controlled by the control unit 70.

The power supply system includes an integrated starter generator (ISG) 17. The ISG 17 is connected in parallel to the capacitor 110. The ISG 17 includes a rotating electric machine that integrates the functions of a power generator and an engine starter. When functioning as the power generator, the ISG 17 generates electric power by receiving power from the crank shaft 50a. The first battery 10, the second battery 20, and the capacitor 110 can be charged, and other electrical loads can be supplied electric power, through the electric power generated by the ISG 17. Meanwhile, when functioning as the engine starter, the ISG 17 is driven by receiving electric power, thereby applying an initial rotation to the crank shaft 50a and starting the engine 50.

According to the present embodiment, in addition to the initial startup of the engine 50, the ISG 17 or the starter 16 functions as the engine starter when an idling stop function is performed. In the idling stop function, the engine 50 is automatically stopped when a predetermined automatic stop condition is met, and subsequently automatically restarted when a predetermined restart condition is met.

According to the present embodiment, the second module 21 is connected to the capacitor 110 instead of the second battery 20.

According to the present embodiment described above, the starter 16 that is connected to the first battery 10 and the ISG 17 that is connected to the capacitor 110 are included as the engine starters. Therefore, even when an abnormality occurs in either of the first battery 10 and the capacitor 110, the engine 50 can be started by the engine starter connected to the other when, for example, the engine 50 is automatically stopped during the idling stop function.

In addition, according to the present embodiment, the alternator 14 that is connected to the first battery 10 and the ISG 17 that is connected to the capacitor 110 are included as the power generators. Therefore, the amounts of electric power collected in the first battery 10, the second battery 20, and the capacitor 110 as a result of power generation by the alternator 14 and the ISG 17 becoming insufficient after the engine 50 is started can be prevented.

According to the present embodiment, when the degree of degradation of any of the first battery 10, the second battery 20, and the capacitor 110 becomes high, the resistance value of the resistor unit connected to the power supply having the highest degree of degradation among the power supplies can be increased from the initial value thereof. For example, when the degree of degradation of the second battery 20 is the highest, the respective resistance values of the first resistor unit 40a and the third resistor unit 40c connected to the second battery 20 can be increased from the initial values thereof.

Fifth Embodiment

A fifth embodiment will be described below with reference to the drawings, mainly focusing on the differences from the above-described first embodiment. According to the present embodiment, the method for setting the resistance value Rc1 of the resistor unit 40 is a characteristic feature. According to the present embodiment, the resistance value Rc1 includes, in addition to the resistance values of the resistors 41a to 41c, the resistance values of the fuse configuring the safety plug 31, the relays 42a and 42b, and the connection path 30. The method for setting the resistance value Rc1 will be described below.

Figure 9:
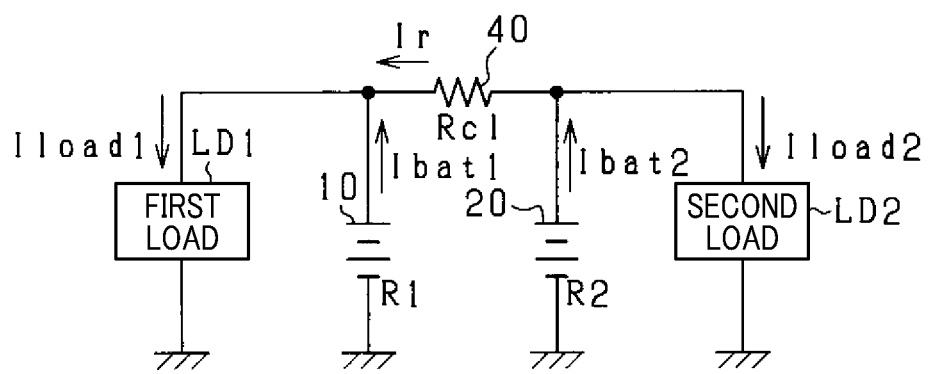
FIG. 9 is a diagram of a circuit model of a power supply system according to a fifth embodiment.

FIG. 9 shows a model of a circuit that is used to set the resistance value. In FIG. 9, a current flowing from the negative terminal side to the positive terminal side of the first battery 10 is indicated as Ibat1. A current flowing from the negative terminal side to the positive terminal side of the second battery 20 is indicated as Ibt2. The internal resistance value of the first battery 10 is indicated as R1. The internal resistance value of the second battery 20 is indicated as R2. In addition, the electrical loads connected in parallel to the first battery 10 further towards the first battery 10 side than the resistor unit 40 are collectively indicated as a first load LD1. The electrical loads connected in parallel to the second battery 20 further towards the second battery 20 side than the resistor unit 40 are collectively indicated as a second load LD2. The maximum current flowing to the first load LD1 is indicated as Iload1, and the maximum current flowing to the second load LD2 is indicated as Iload2.

An open-circuit voltage of the first battery 10 is indicated as Vbat1 (such as 12 V). An open-circuit voltage of the second battery 20 is indicated as Vbat2 (such as 12 V). In addition, an allowable lower limit value of the terminal voltage of the first battery 10 is indicated as Vt1 (such as 6 V). An allowable lower limit value of the terminal voltage of the second battery 20 is indicated as Vt2 (such as 6 V). In this case, a following expression (e1) is required to be satisfied to set the terminal voltage of the first battery 10 when a current is flowing to the first battery 10 to the allowable lower limit value Vt1 or greater.

$$\Delta V1 = Vbat1 - Vt1 \geq Ibat1 \times R1 \tag{e1}$$

In the above-described expression (e1), $\Delta V1$ is referred to as a first voltage deviation. Meanwhile, a following expression (e2) is required to be satisfied to set the terminal voltage of the second battery 20 when a current is flowing to the second battery 20 to the allowable lower limit value Vt2 or greater.

$$\Delta V2 = Vbat2 - Vt2 \geq Ibat2 \times Rb2 \tag{e2}$$

In the above-described expression (e2), $\Delta V2$ is referred to as a second voltage deviation Here, the current Ibat1 flowing to the first battery 10 is expressed by a following expression (e3). The current Ibat2 flowing to the second battery 20 is expressed by a following expression (e4).

$$Ibat1 = \frac{Iload2 \times R2}{R1 + R2 + Rcl} + \frac{Iload1(R2 + Rcl)}{R1 + R2 + Rcl} \tag{e3}$$

$$Ibat2 = \frac{Iload1 \times R1}{R1 + R2 + Rcl} + \frac{Iload2(R1 + Rcl)}{R1 + R2 + Rcl} \tag{e4}$$

Here, following expressions (e5) and (e6) are derived from the above-described expressions (e1) and (e3).

$$Rcl \geq \frac{(Iload1 + Iload2)R1 \times R2 - \Delta V1(R1 + R2))}{\Delta V1 - Iload1 \times R1} \tag{e5}$$

where $\Delta V1 - Iload1 \times R1 > 0$ $$Rcl \leq \frac{(Iload1 + Iload2)R1 \times R2 - \Delta V1(R1 + R2))}{\Delta V1 - Iload1 \times R1} \tag{e6}$$

where $\Delta V1 - Iload1 \times R1 < 0$

Meanwhile, following expressions (e7) and (e8) are derived from the above-described expressions (e2) and (e4).

$$Rcl \geq \frac{(Iload1 + Iload2)R1 \times R2 - \Delta V2(R1 + R2))}{\Delta V2 - Iload2 \times R2} \tag{e7}$$

where $\Delta V2 - Iload2 \times R2 > 0$ $$Rcl \leq \frac{(Iload1 + Iload2)R1 \times R2 - \Delta V2(R1 + R2))}{\Delta V2 - Iload2 \times R2} \tag{e8}$$

where $\Delta V2 - Iload2 \times R2 < 0$

As a result of the resistance value Rc1 being set within a range over which the range of the resistance value Rc1 prescribed by either of the above-described expressions (e5) and (e6) and the range of the resistance value Rc1 prescribed by either of the above-described expressions (e7) and (e8) overlap, the terminal voltage of the first battery 10 when a current is flowing to the first battery 10 can be set to the allowable lower limit value Vt1 or greater, and the terminal voltage of the second battery 20 when a current is flowing to the second battery 20 can be set to the allowable lower limit value Vt2 or greater.

Next, a method for setting the resistance value Rc1 to reduce loss that occurs as a result of a current flowing to the resistor unit 40 will be described. Here, in FIG. 9, the current flowing to the resistor unit 40 is indicated as Ir.

The current Ir flowing to the resistor unit 40 is expressed by a following expression (e9).

$$Ir = \left| \frac{Iload1 \times R1}{R1 + R2 + Rcl} - \frac{Iload2 \times R2}{R1 + R2 + Rcl} \right| \quad (e\ 9)$$

Loss Pr in the resistor unit 40 is expressed by a following expression (e10)

$$Pr = Ir^2 \times Rcl \quad (e\ 10)$$

$$= \left( \frac{Iload1 \times R1}{R1 + R2 + Rcl} - \frac{Iload2 \times R2}{R1 + R2 + Rcl} \right)^2 \times Rcl$$

As a result of the resistance value Rc1 that can reduce the right-hand side of the above-described expression (e10) being set, the loss Pr can be reduced. According to the present embodiment, a condition is applied when the resistance value Rc1 is set. That is, the maximum current Iload2 flowing to the second load LD2 is to be sufficiently smaller than the maximum load Iload1 flowing to the first load LD1. When this condition is applied, the above-described expression (e9) becomes a following expression (e11).

$$Ir \approx \left| \frac{Iload1 \times R1}{R1 + R2 + Rcl} \right| \quad (e\ 11)$$

In this case, the above-described expression (e10) becomes a following expression (e12).

$$Pr = \left( \frac{Iload1 \times R1}{R1 + R2 + Rcl} \right)^2 \times Rcl \quad (e\ 12)$$

As a result of the resistance value Rc1 that can reduce the right-hand side of the above-described expression (e12) being set, the loss Pr can be reduced. For example, the resistance value Rc1 can be set that minimizes the loss Pr based on a differentiation result obtained by the above-described expression (e12) being differentiated once with respect to Rc1. As a result, the loss Pr can be minimized. When the resistance value Rc1 that minimizes the loss Pr is set, the resistance value Rc1 may be set within a range over the range of the resistance value Rc1 prescribed by either of the above-described expressions (e5) and (e6) and the range of the resistance value Rc1 prescribed by either of the above-described expressions (e7) and (e8) overlap.

The resistance value is prescribed by the method described above. In this case, the resistance values of the first to third resistors 41a to 41c may be set such that a combined resistance value of the first to third resistors 41a to 41c when the first relay 42a and the second relay 42b are turned ON becomes the prescribed resistance value Rc1.

Sixth Embodiment

Figure 10:
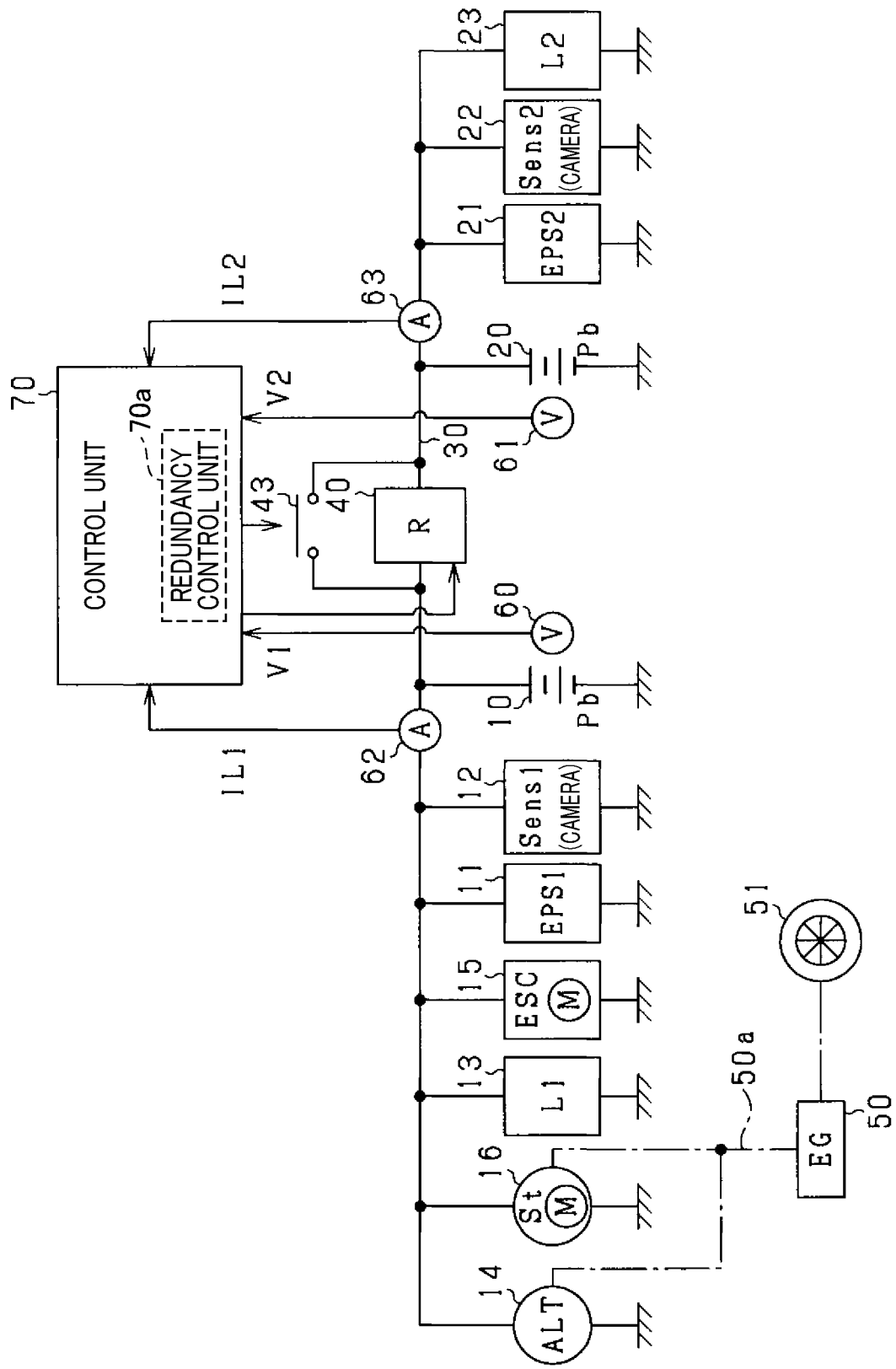
FIG. 10 is an overall configuration diagram of an on-board power supply apparatus according to a sixth embodiment.

A sixth embodiment will be described below with reference to the drawings, mainly focusing on the differences from the above-described first embodiment. According to the present embodiment, as shown in FIG. 10, a relay 43 is provided so as to bypass the resistor unit 40. In FIG. 10, configurations that are identical to the configurations shown in foregoing FIG. 1 are given the same reference numbers for convenience.

As shown in FIG. 10, the side of the connection path 30 that is further towards the first battery 10 side than the resistor 40 and the side of the connection path 30 that is further towards the second battery 20 side than the resistor unit 40 are connected by the relay 43. For example, a normally open relay can be used as the relay 43. The relay 43 is operated by the control unit 70.

Figure 11:
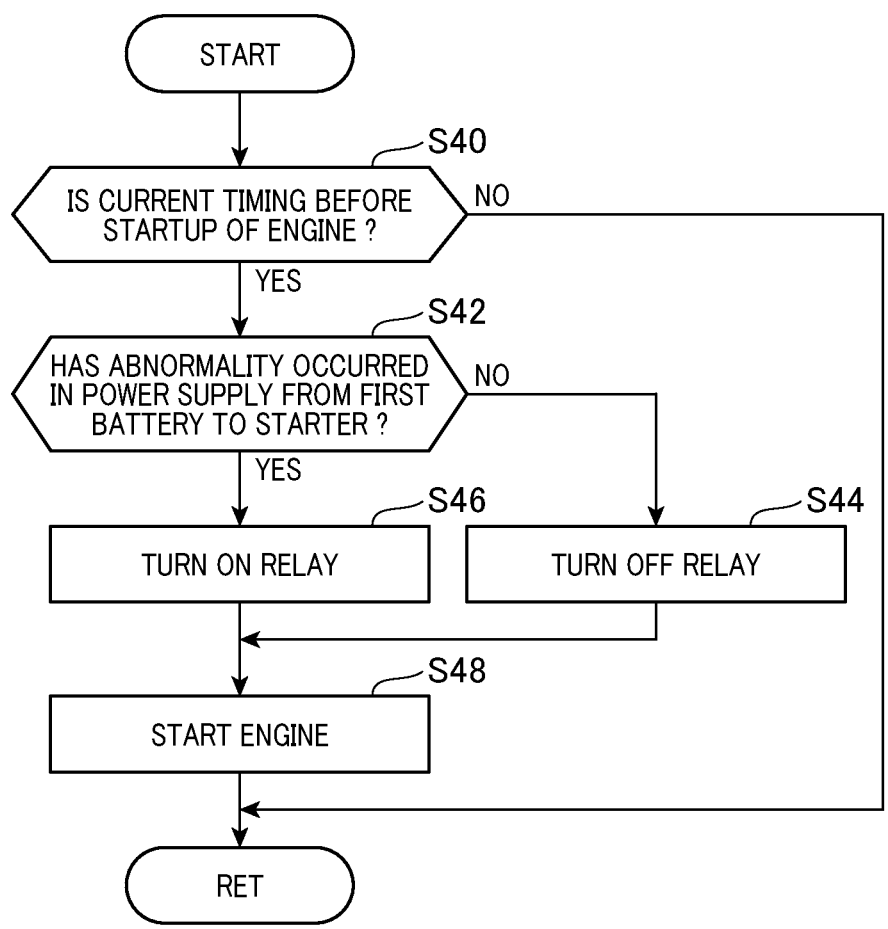
FIG. 11 is a flowchart of the steps in a process performed by a control unit.

Next, FIG. 11 shows the steps in a process performed when the engine 50 is started. The process is repeatedly performed by the control unit 70, for example, at a predetermined cycle.

In this series of processes, first, at step S40, the control unit 70 determines whether or not a current timing is before startup of the engine 50 using the starter 16.

When determined YES at step S40, the control unit 70 proceeds to step S42. The control unit 70 determines whether or not a power supply abnormality in which electric power can no longer be supplied from the first battery 10 to the starter 16 has occurred. According to the present embodiment, the power supply abnormality includes an open circuit fault between the positive terminal of the first battery 10 and the electrical loads 11 to 16. This open circuit fault occurs, for example, when a power supply line connecting the positive terminal of the first battery 10 and the electrical loads 11 to 16 becomes detached from the positive terminal of the first battery 10. According to the present embodiment, the process at step S42 corresponds to an abnormality determining unit.

When determined that a power supply abnormality has not occurred at step S42, the control unit 70 proceeds to step S44 and turns OFF the relay 43.

Meanwhile, when determined that a power supply abnormality has occurred at step S42, the control unit 70 proceeds to step S46 and turns ON the relay 43. As a result, a short circuit occurs between the positive terminal of the second battery 20 and the electrical loads 11 to 16. According to the present embodiment, the process at step S46 corresponds to a during-abnormality operating unit.

After completing the process at step S44 or S46, the control unit 70 proceeds to step S48. The control unit 70 drives the starter 16 and starts the engine 50.

According to the present embodiment, when a power supply abnormality occurs, the starter 16 receives electric power from the second battery 20 via the relay 43. Therefore, the supply voltage supplied to the starter 16 when the starter 16 is driven does not decrease, and the engine 50 can be appropriately started.

Conversely, when the relay 43 is not provided, a large voltage drop occurs in the resistor unit 40 when the starter 16 is driven. Consequently, the starter 16 cannot be driven using the second battery 20 as the power supply source, and the engine 50 may not be started.

According to the present embodiment, the relay 43 is provided outside of the resistor unit 40. However, the relay 43 is not limited thereto. The relay 43 may be provided within the resistor unit 40.

In addition, the configuration in which a short circuit is induced between the positive terminal of the second battery 20 and the electrical loads 11 to 16 during a power supply abnormality is not limited to that using the relay. For example, the configuration may be a serial-connection body composed of a resistor and a switch. Here, the resistor has a resistance value that is less than the combined resistance value of the first to third resistors 41a to 41c that are connected in parallel. In this case, the starter 16 can be driven using the second battery 20 as a power supply source, without a short circuit being induced between the positive terminal of the second battery 20 and the electrical loads 11 to 16.

Seventh Embodiment

A seventh embodiment will be described below with reference to the drawings, mainly focusing on the differences from the above-described first embodiment. According to the present embodiment, a configuration for detecting an abnormality in the resistor unit 40 is provided.

Figure 12:
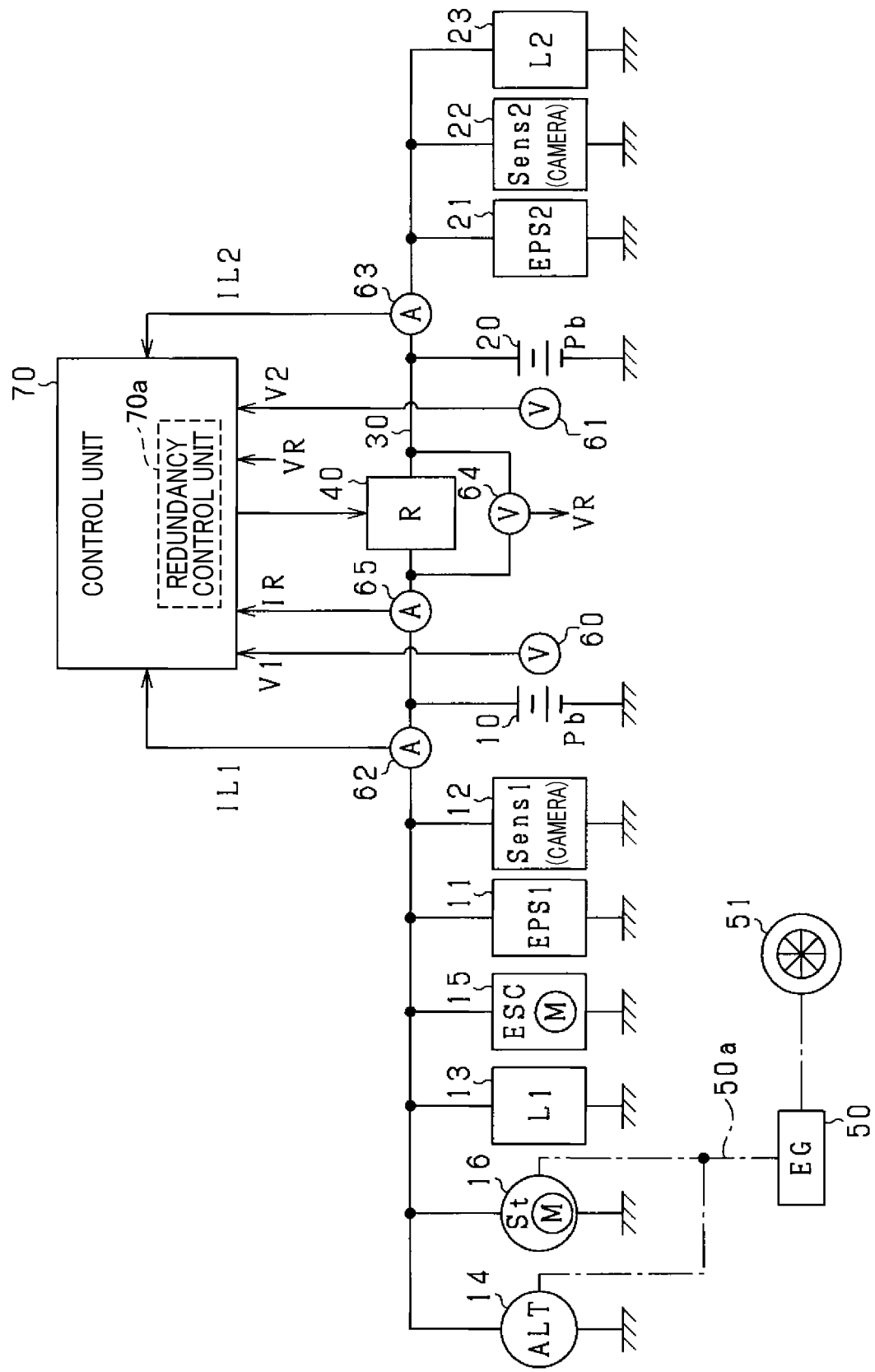
FIG. 12 is an overall configuration diagram of an on-board power supply apparatus according to a seventh embodiment.

FIG. 12 shows an overall configuration of an on-board power supply system according to the present embodiment. In FIG. 12, configurations that are identical to the configurations shown in foregoing FIG. 1 are given the same reference numbers for convenience.

As shown in FIG. 12, the power supply system includes a resistor voltage detecting unit 64 and a resistor current detecting unit 65. The resistor voltage detecting unit 64 detects a voltage drop amount VR in the resistor unit 40. The resistor current detecting unit 65 detects a current IR flowing to the resistor unit 40. The detection values of the resistor voltage detecting unit 64 and the resistor current detecting unit 65 are inputted to the control unit 70.

Figure 13:
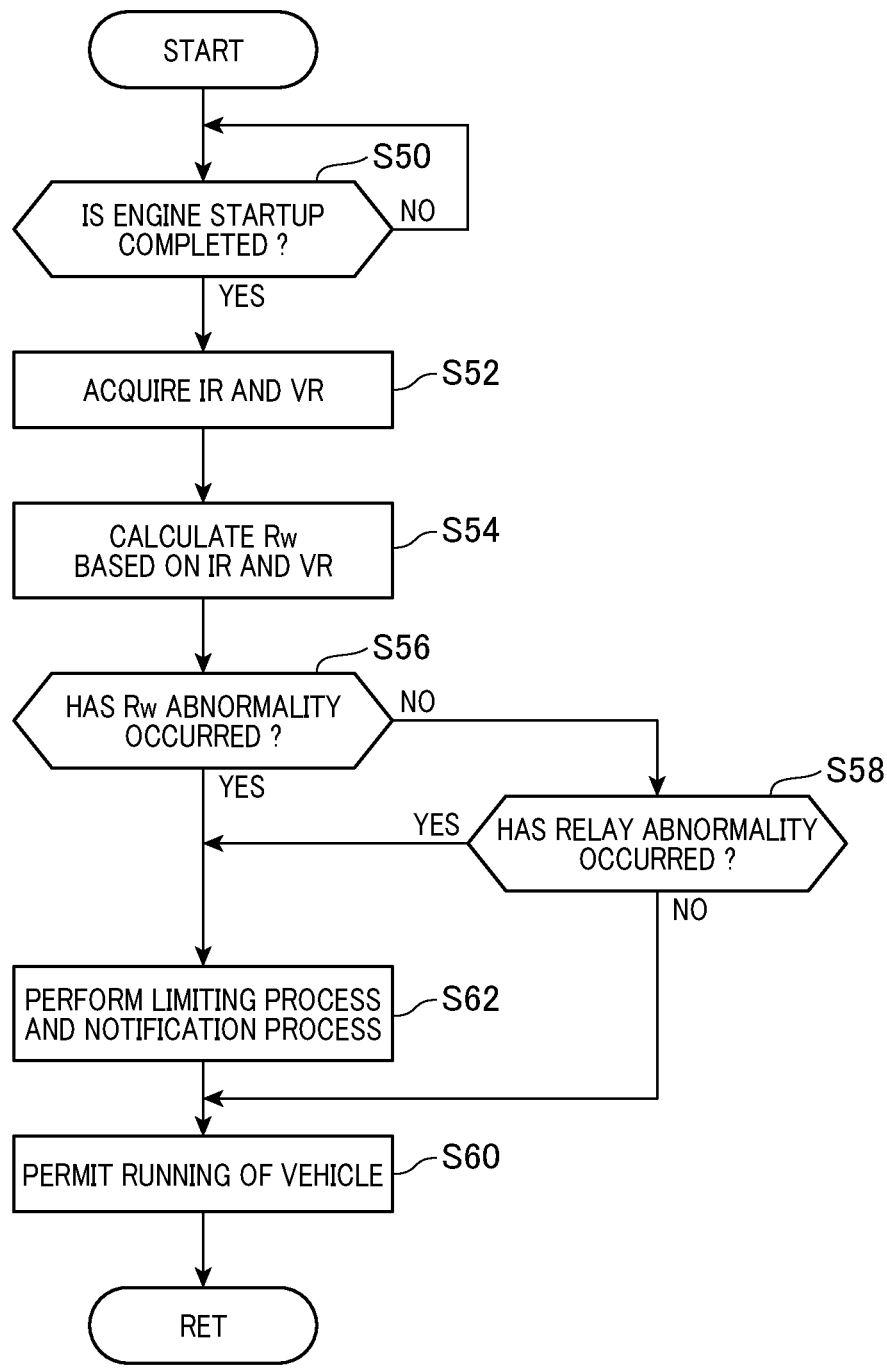
FIG. 13 is a flowchart of the steps in a process performed by a control unit.

Next, FIG. 13 shows the steps in an abnormality detection process for the resistor unit 40. The process is repeatedly performed by the control unit 70, for example, at a predetermined cycle.

In this series of processes, first, at step S50, the control unit 70 determines whether or not startup of the engine 50 using the starter 16 is completed.

When determined YES at step S50, the control unit 70 proceeds to step S52. The control unit 70 acquires the detection value VR of the resistor voltage detecting unit 64 and the detection value IR of the resistor current detecting unit 65.

At subsequent step S54, the control unit 70 calculates a resistance value Rw of the resistor unit 40 based on the detection values VR and IR. Specifically, for example, the control unit 70 may calculate the resistance value Rw using a relational expression expressed by Rw=VR/IR. According to the present embodiment, the process at step S54 corresponds to a resistance calculating unit.

At subsequent step S56, the control unit 70 determines whether or not a resistance value abnormality in which the resistance value Rw deviates from the initial value thereof has occurred. Here, the initial value of the resistance value Rw is, for example, the initial value of the combined resistance value of the first to third resistors 41a to 41c configuring the resistor unit 40 in a state in which the first relay 42a and the second relay 42b, shown in foregoing FIG. 2, are turned ON, when the control unit 70 acquires the detection values VR and IR at step S54 in a state in which the first relay 42a and the second relay 42b are turned ON. Meanwhile, for example, when the control unit 70 acquires the detection values VR and IR at step S54 in a state in which only the first relay 42a, of the first relay 42a and the second relay 42b, is turned ON, the initial value of the resistance value Rw is the initial value of the combined resistance value of the first and third resistors 41a and 41c in a state in which only the first relay 42a is turned ON.

For example, the resistance value of the resistor unit 40 increases from the initial value thereof as a result of degradation over time in the resistor unit 40. In addition, the resistance value of the resistor unit 40 decreases from the initial value and becomes a value near zero as a result of a short circuit fault in the resistor unit 40.

When determined that a resistance value abnormality has not occurred at step S56, the control unit 70 proceeds to step S58. The control unit 70 determines whether or not a relay abnormality has occurred. In the relay abnormality, neither of the first relay 42a and the second relay 42b configuring the resistor unit 40 can be turned ON and OFF in a normal manner. According to the present embodiment, the processes at steps S56 and S58 correspond to a determining unit.

When determined that a relay abnormality has not occurred at step S58, the control unit 70 proceeds to step S60. The control unit 70 permits traveling of the vehicle Meanwhile, when determined that a relay abnormality has occurred at step S58 or a resistance value abnormality has occurred at step S56, the control unit 62 proceeds to step S62. The control unit 70 performs a limiting process and a notification process.

According to the present embodiment, the limiting process includes a process for reducing the execution frequency of the idling stop function or prohibiting execution of the idling stop function, and a process for prohibiting execution of an automatic driving function, such as the lane keeping assistance control. For example, the limiting process regarding the idling stop function may be performed when the resistance value of the resistor unit 40 becomes excessively greater than the initial value as a result of the occurrence of an open circuit fault in a resistor of the resistor unit 70. For example, when the open circuit fault occurs in the resistor unit 40, electric power cannot be supplied from the second battery 20 to the starter 16, and the starter 16 cannot be driven. As a result, when the engine 50 temporarily stops as a result of the idling stop function, the engine 50 may not be able to be restarted.

Meanwhile, the control unit 70 performs the notification process to notify the user of information indicating that the resistance value abnormality or the relay abnormality has occurred, as well as information recommending that the resistor unit 40 is replaced with a new resistor unit. According to the present embodiment, the process at step S60 corresponds to an abnormality notifying unit.

In the process shown in FIG. 13, the resistor value abnormality or the relay abnormality can be detected immediately after startup of the engine 50 and before the vehicle starts traveling. Therefore, the vehicle can be prevented from traveling in a state in which the user is unaware that an abnormality has occurred in the resistor unit 40.

Eighth Embodiment

An eighth embodiment will be described below with reference to the drawings, mainly focusing on the differences from the above-described first embodiment.

Figure 14:
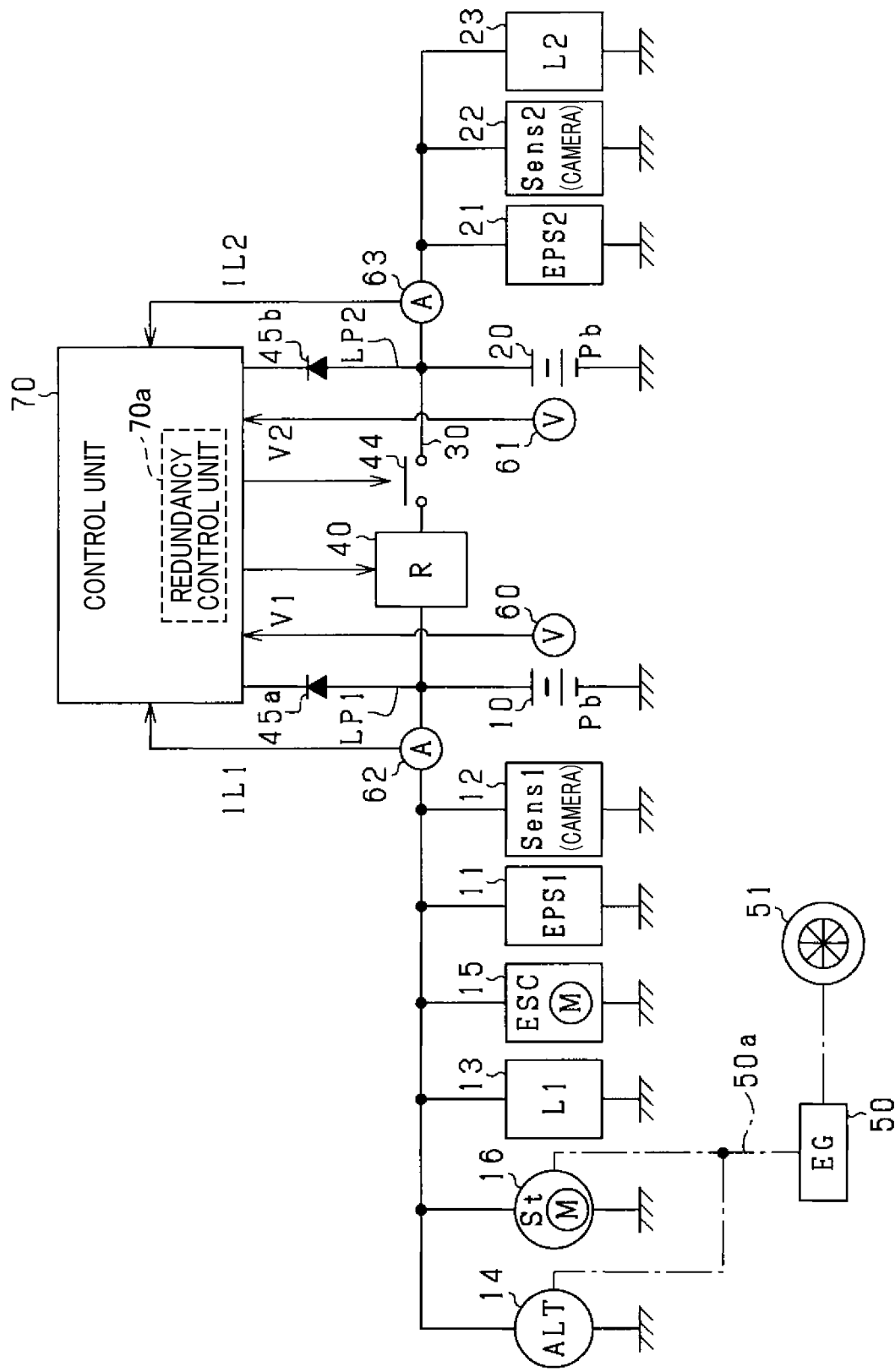
FIG. 14 is an overall configuration diagram of an on-board power supply apparatus according to an eighth embodiment.

FIG. 14 shows an overall configuration of an on-board power supply system according to the present embodiment. In FIG. 14, configurations that are identical to the configurations shown in foregoing FIG. 1 are given the same reference numbers for convenience.

As shown in FIG. 14, a relay 44 is provided on the connection path 30 between the resistor unit 40 and the positive terminal of the second battery 20. For example, a normally open relay can be used as the relay 44. The relay 44 is operated by the control unit 70.

According to the present embodiment, the control unit 70 is receives electric power from the first battery 10 via a first power supply path LP1 that is connected to the positive terminal of the first battery 10. In addition, the control unit 70 is receives electric power from the second battery 20 via a second power supply path LP2 that is connected to the positive terminal of the second battery 20.

The first power supply path LP1 is provided with a first diode 45a. An anode of the first diode 45a is on the positive terminal side of the first battery 10 and a cathode is on the control unit 70 side. The first diode 45a is a first limiting element that allows a flow of current on the first power supply path LP1 in a first direction and prevents a flow of current in a direction opposite the first direction. The first direction is from the positive terminal side of the first battery 10 towards the control unit 70 side.

The second power supply path LP2 is provided with a second diode 45b. An anode of the second diode 45b is on the positive terminal side of the second battery 20 and a cathode is on the control unit 70 side. The second diode 45b is a second limiting element that allows a flow of current on the second power supply path LP2 in a second direction and prevents a flow of current in a direction opposite the second direction. The second direction is from the positive terminal side of the second battery 20 towards the control unit 70 side.

The first limiting element and the second limiting element are not limited to the diodes. For example, the first limiting element and the second limiting element may be a pair of n-channel metal-oxide field-effect transistors (MOSFETs) of which the sources are connected together. In this case, the pair of n-channel MOSFETs may be operated by the control unit 70.

Figure 15:
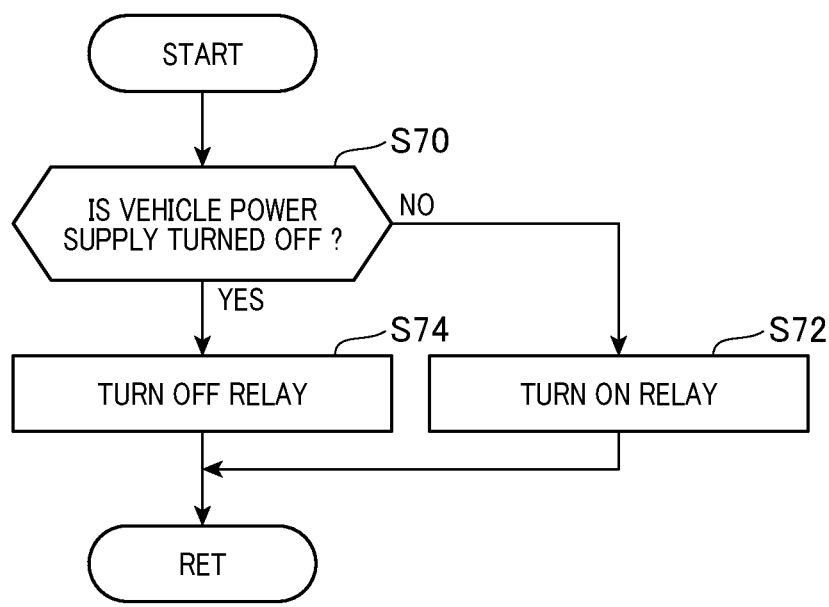
FIG. 15 is a flowchart of the steps in a process performed by a control unit.

Next, FIG. 15 shows the steps in an at-power-OFF process. The process is repeatedly performed by the control unit 70, for example, at a predetermined cycle.

In this series of processes, first, at step S70, the control unit 70 determines whether or not the power supply system is in an OFF state. According to the present embodiment, the OFF state refers to a state in which the user has issued a command to stop use of the power supply system. Alternatively, the OFF state refers to a state in which the vehicle is not traveling, such as when the vehicle is parked or stopped, regardless of the user having issued a command to use the power supply system. For example, the user issues the command to stop use of the power supply by turning OFF an ignition switch or a start switch. The user issues the command to use the power supply system by turning ON the ignition switch or the start switch.

When determined NO at step S70, the control unit 70 determines that the power supply system is in the ON state and proceeds to step S72. At step S72, the control unit 70 turns ON the relay 44.

Meanwhile, when determined that the power supply system is in the OFF state at step S70, the control unit 70 proceeds to step S74. The control unit 70 turns OFF the relay 44. According to the present embodiment, the process at step S74 corresponds to an at-power-OFF operating unit.

As a result of the process described above, when either of the first battery 10 and the second battery 20 becomes degraded, the occurrence of a dead battery can be prevented. The dead battery is a phenomenon in which the amount of electric power stored in the other battery becomes excessively low.

In other words, for example, the second battery 20 becomes degraded as a result of loss of an active material. In this case, the terminal voltage of the second battery 20 becomes lower than the terminal voltage of the first battery 10. In this state, should the power supply system be turned OFF and the vehicle parked, for example, a current continuously flows from the first battery 10 to the second battery 20 via the resistor unit 40, when the relay 44 is not provided. As a result, the first battery 10 that had been in a normal state dies.

According to the present embodiment, the relay 44 is provided. As a result, when the power supply system is turned OFF, the flow of current from the second battery 20 to the first battery 10 can be prevented. At this time, because the control unit 70 receives electric power from the first and second batteries 10 and 20 via the first and second power supply paths LP1 and LP2, even should either of the first and second batteries 10 and 20 become degraded, the control unit 70 can secure electric power to perform a process for operating the relay 44 and the like.

Ninth Embodiment

Figure 16:
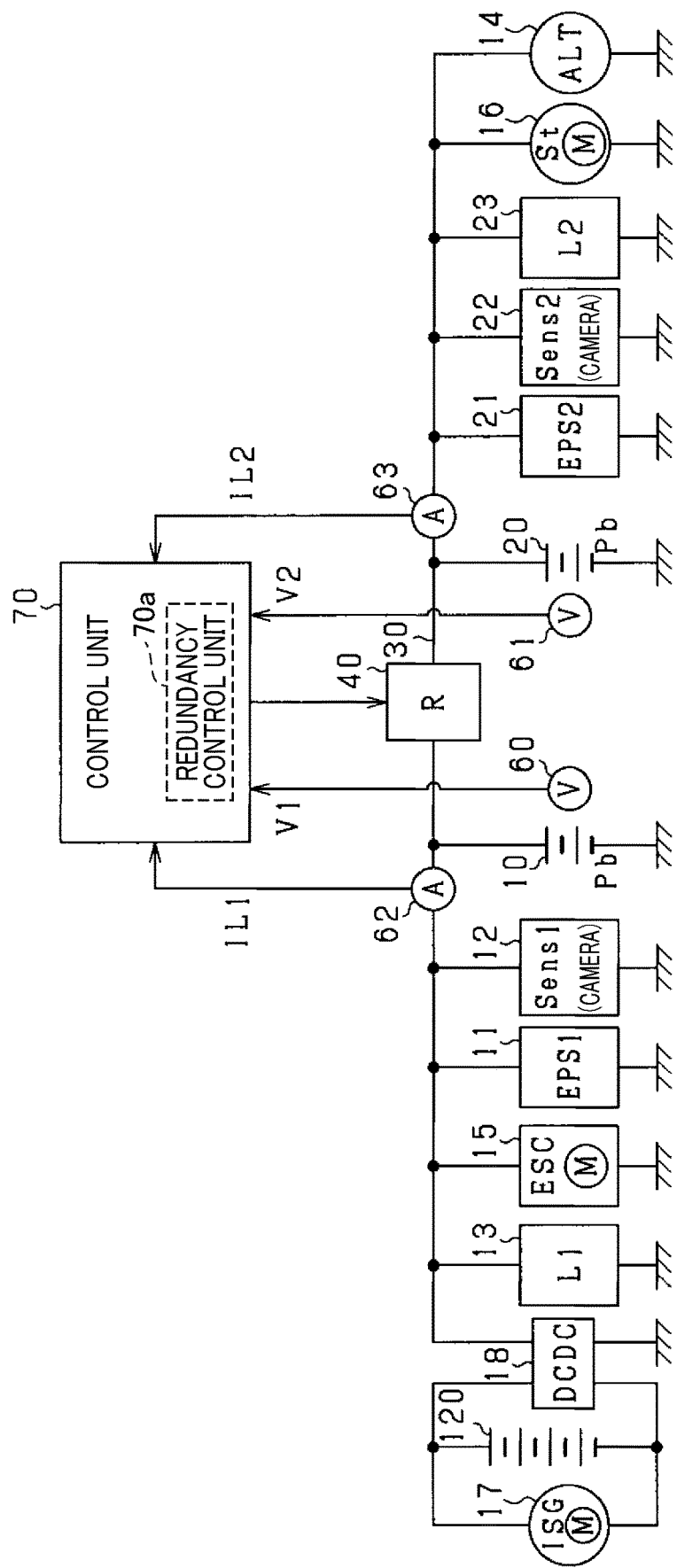
FIG. 16 is an overall configuration diagram of an on-board power supply apparatus according to a ninth embodiment.

A ninth embodiment will be described below with reference to the drawings, mainly focusing on the differences from the above-described first embodiment FIG. 16 shows an overall configuration of an on-board power supply system according to the present embodiment. In FIG. 16, configurations that are identical to the configurations shown in foregoing FIG. 1 are given the same reference numbers for convenience. In addition, the engine 50 and the like are omitted in FIG. 16.

As shown in FIG. 16, according to the present embodiment, the alternator 14 and the starter 16 are each connected in parallel to the second battery 20.

The power supply system includes a DC-DC converter 18, the ISG 17, and a third battery 120. The third battery 120 is a secondary battery. According to the present embodiment, the output voltage of the third battery 120 is set to be higher than the output voltages of the first battery 10 and the second battery 20. The output voltage of the third battery 120 can be set within a range from 48 V to 288 V, both inclusive. According to the present embodiment, the third battery 120 corresponds to a target power supply.

The third battery 120 is connected to the positive terminal of the first battery 10 via the DC-DC converter 18. The ISG 17 is connected in parallel to the third battery 120. The power supply system may include a main motor generator instead of or in addition to the ISG 17. The main motor generator is capable of performing power transmission with a drive wheel (not shown) and serves as a driving power source of the vehicle. The main motor generator may be connected in parallel to the third battery 120.

The DC-DC converter 18 is configured to be capable of stepping down the output voltage of the third battery 120 and supplying the stepped-down voltage to the first battery 10 and the electrical loads 11, 12, 13, and 15. According to the present embodiment, the DC-DC converter 18 is operated by the control unit 70. The DC-DC converter 18 may be an isolated type or a non-isolated type depending on the output voltages of the first battery 10 and the third battery 120.

According to the embodiment described above, electric power generated by the ISG 17 and electric power from the third battery 120 can be supplied to the first battery 10 side via the DC-DC converter 18. As a result, for example, the first battery 10 can be charged via the DC-DC converter 18. Reliability of the power supply system can be further improved.

Tenth Embodiment

Figure 17:
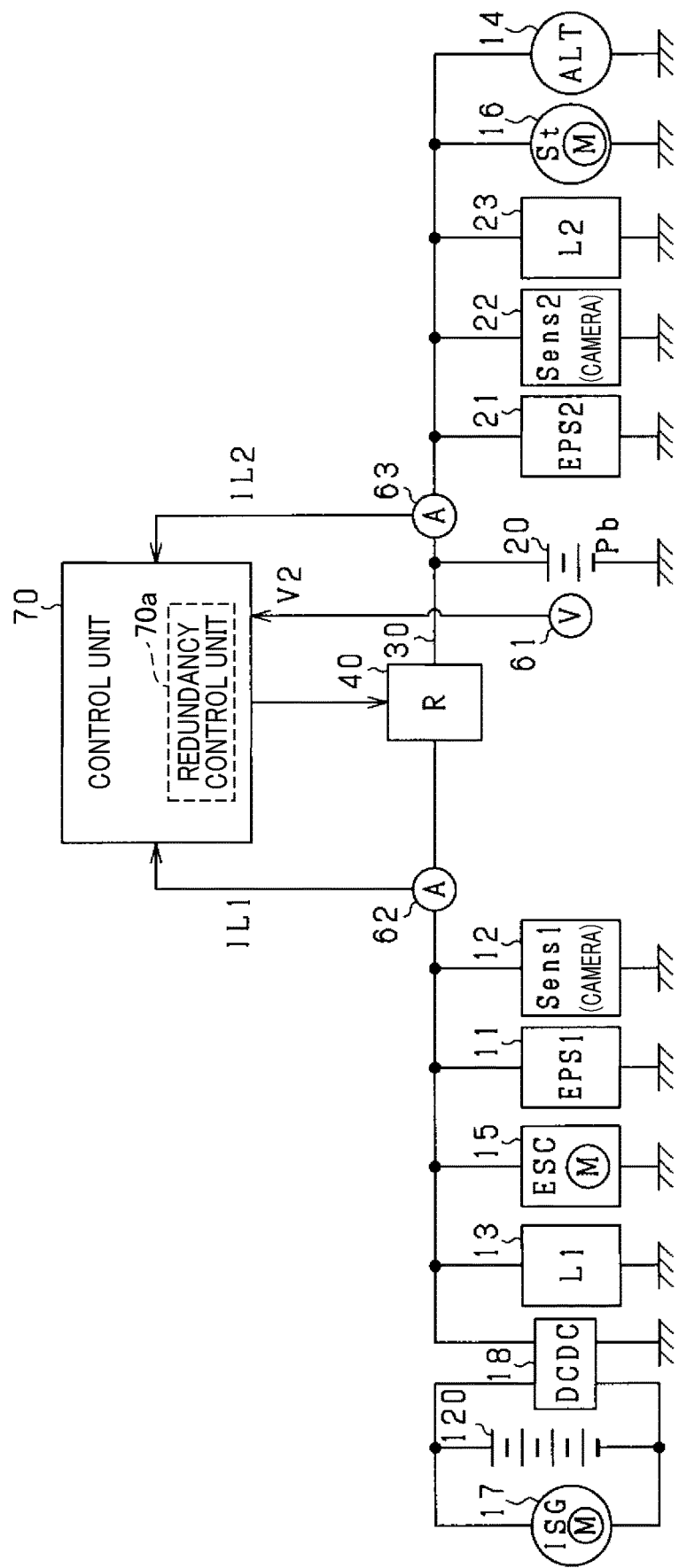
FIG. 17 is an overall configuration diagram of an on-board power supply apparatus according to a tenth embodiment.

A tenth embodiment will be described below with reference to the drawings, mainly focusing on the differences from the above-described ninth embodiment. According to the present embodiment, as shown in FIG. 17, the power supply system is not provided with the first battery 10. In FIG. 17, configurations that are identical to the configurations shown in foregoing FIG. 16 are given the same reference numbers for convenience.

According to the present embodiment, the third battery 120 corresponds to a first power supply and the second battery 20 corresponds to a second power supply. In addition, according to the present embodiment, an electrical path from the positive terminal of the second battery 20 to the positive terminal of the third battery 120 via the DC-DC converter 18 corresponds to a connection path. The resistor unit 40 is provided on this connection path, further towards the positive terminal side of the second battery 20 than the connection points between the electrical loads 11, 12, 13, and 15 and the DC-DC converter 18.

According to the embodiment described above as well, effects similar to those according to the ninth embodiment can be achieved.

Modifications

The above-described first to tenth embodiments may be modified in the following manner.

Figure 18:
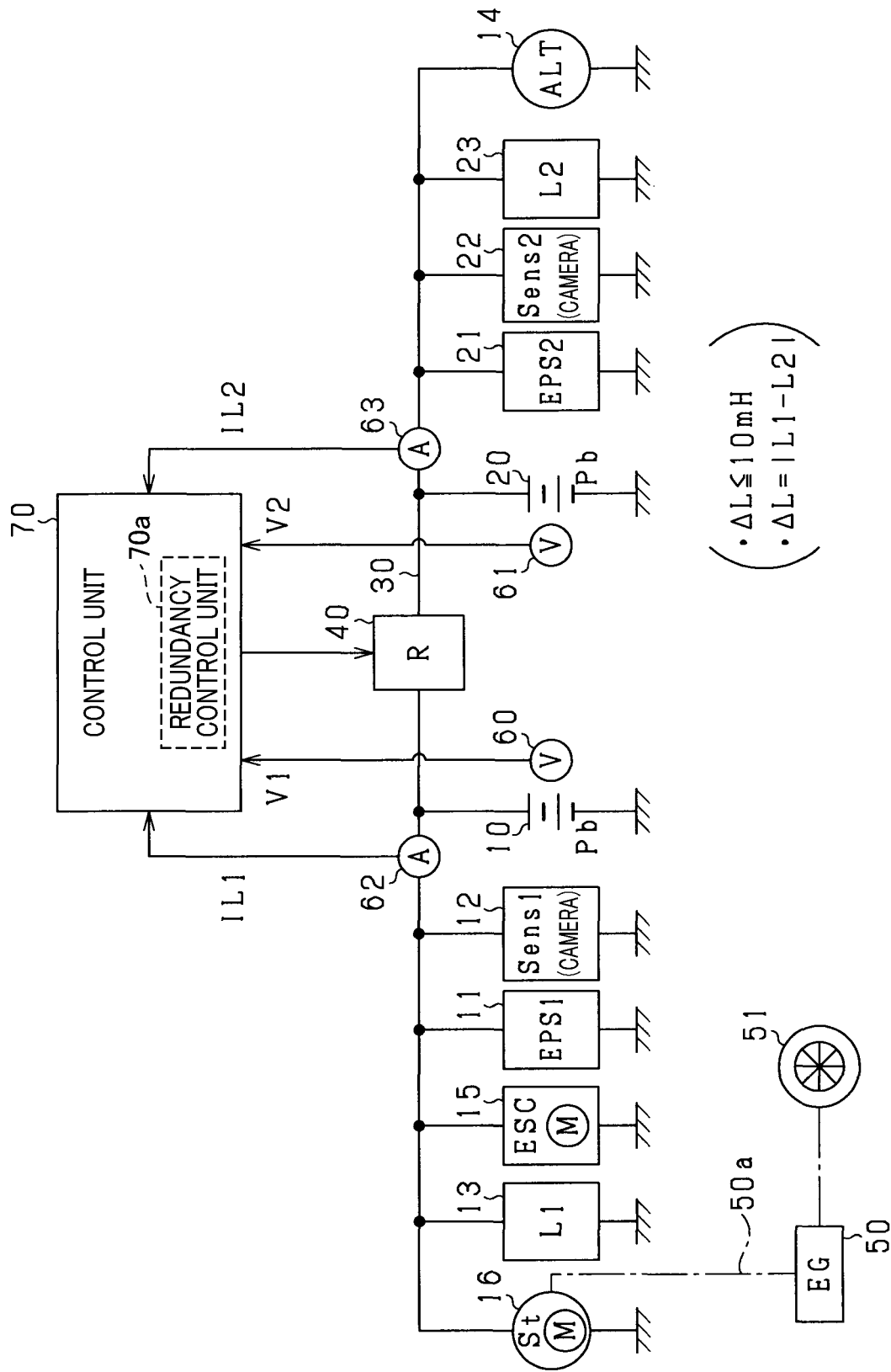
FIG. 18 is an overall configuration diagram of an on-board power supply apparatus according to a modification of the first embodiment.

According to the above-described first embodiment, the alternator 14 is not limited to being connected to the first battery 10. The alternator 14 may be connected to the second battery 20 as shown in FIG. 18.

Figure 19:
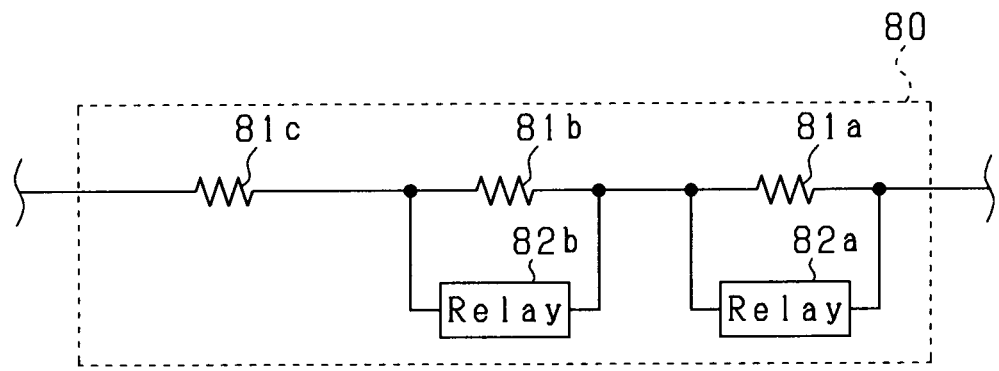
FIG. 19 is a diagram of a configuration of a resistor unit according to the modification of the first embodiment.

The resistor unit is not limited to that according to the above-described first embodiment. For example, the resistor unit may be a resistor unit 80 shown in FIG. 19. Specifically, the resistor unit 80 includes a serial-connection body composed of first to third resistors 81a to 81c, and first and second relays 82a and 82b. The first relay 82a is connected in parallel to the first resistor 81a. The second relay 82b is connected in parallel to the second resistor 81b. In this configuration, the first relay 42a may be replaced by the first relay 82a and the second relay 42b may be replaced by the second relay 82b in the processes at steps S18, S22, and S24 in FIG. 4.

Figure 20:
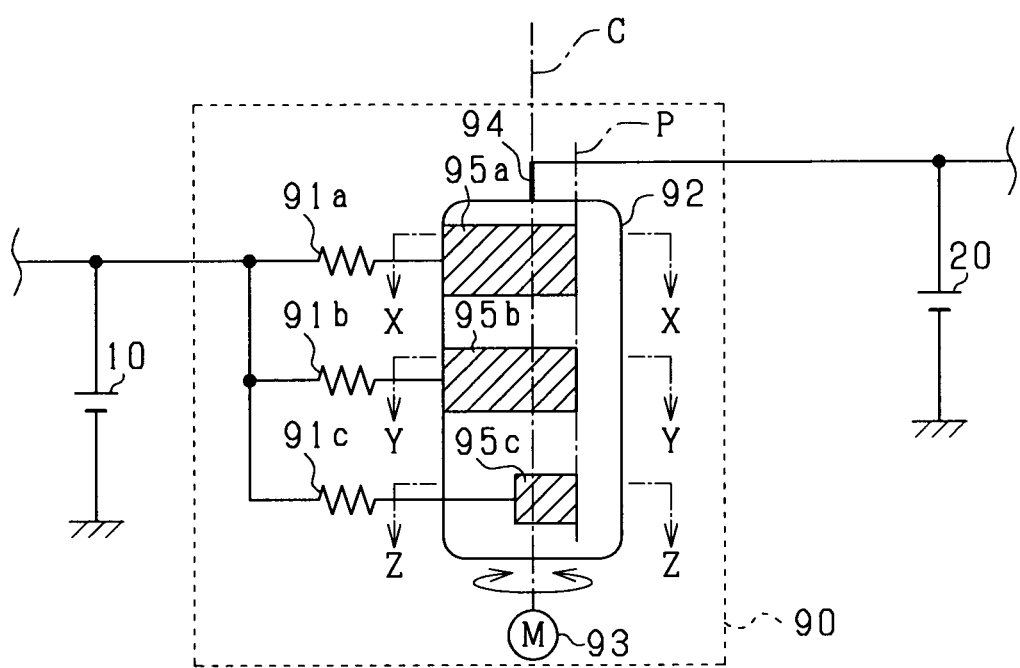
FIG. 20 is a diagram of a configuration of a resistor unit according to the modification of the first embodiment.
Figure 21:
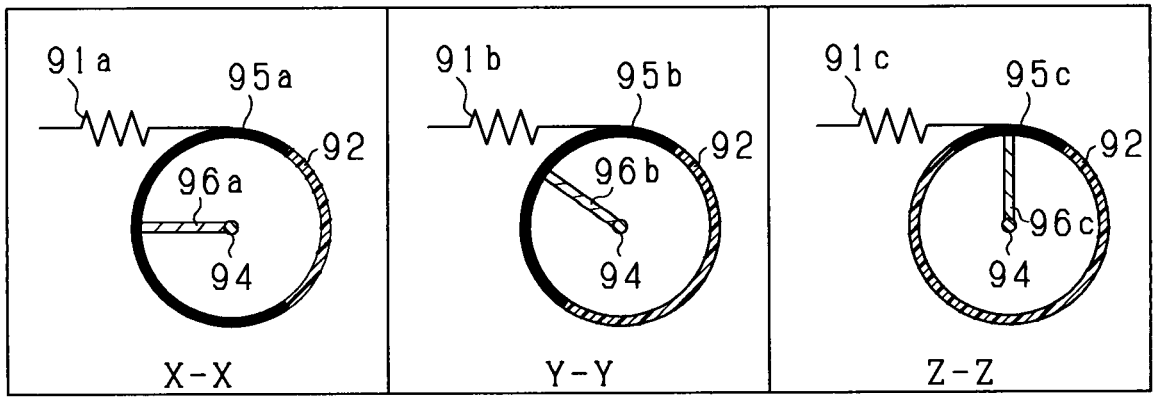
FIG. 21 is cross-sectional views of a rotary switch taken along line X-X, line Y-Y, and line Z-Z.

In addition, for example, the resistor unit may be a resistor unit 90 shown in FIG. 20 and FIG. 21. Specifically, the resistor unit 90 includes first to third resistors 91a to 91c and a rotary switch. The rotary switch includes a cylindrical member 92, a motor 93, and a main conductive member 94. The cylindrical member 92 has a circular cylindrical shape and is not conductive. The motor 93 rotates the cylindrical member 92 with a center axis line C of the cylindrical member 92 as the center of rotation. The motor 93 is driven by the control unit 70. The main conductive member 94 is formed so as to extend in the direction of the center axis line C and is disposed on the inner circumferential side of the cylindrical member 92. The main conductive member 94 is connected to the positive terminal of the second battery 20.

A plurality of surface electrodes (in this case, three) 95a to 95c are provided in the cylindrical member 92 so as to be exposed on the outer circumferential side of the cylindrical member 92. The surface electrodes 95a to 95c extend in the circumferential direction. According to the present embodiment, the surface electrodes are referred to as a first electrode 95a, a second electrode 95b, and a third electrode 95c.

The first to third electrodes 95a to 95c are provided so as to correspond to the first to third resistors 91a to 91c in a state in which the first to third electrodes 95a to 95c are separated in the direction of the center axis line C. In FIG. 21, the thicknesses of the first to third electrodes 95a to 95c in the radial direction of the cylindrical member 92 are shown to be the same as the thickness of the cylindrical member 92 in the radial direction, for convenience.

When the cylindrical member 92 is viewed from the direction of the center axis line C, the first to third electrodes 95a to 95c are formed such that the lengths thereof extending from a reference axis line P in the circumferential direction differ from one another. The reference axis line P passes through the outer circumferential surface of the cylindrical member 92 and extends in the direction of the center axis line C. According to the present embodiment, the electrode lengths from the reference axis line P in the circumferential direction increase in order from the first electrode 95a to the second electrode 95b to the third electrode 95c. According to the present embodiment, when the cylindrical member 92 is viewed from the direction of the center axis line C, a portion of the cylindrical member 92 in which none of the first to third electrodes 95a to 95c are formed is present.

The first electrode 95a is connected to the main conductive member 94 via a first auxiliary conductive member 96a. The second electrode 95b is connected to the main conductive member 94 via a second auxiliary conductive member 96b. The third electrode 95c is connected to the main conductive member 94 via a third auxiliary conductive member 96c. The cylindrical member 92, the main conductive member 94, the first to third electrodes 95a to 95c, and the first to third auxiliary conductive members 96a to 96c are integrally rotated by the motor 93 being driven.

First ends of the first to third resistors 91a to 91c are electrically connected to the first battery 10 side, and second ends are in contact with the outer circumferential surface of the cylindrical member 92. As a result of the motor 93 being driven, the cylindrical member 92 rotates with the center axis line C as the center of rotation. As a result, depending on the rotation position of the cylindrical member 92 with the center axis line C as the center of rotation, a conducting state is achieved between at least any one of the first to third resistors 91a to 91c and the positive terminal of the second battery 20. Alternatively, a conducting state is not achieved between any of the first to third resistors 91 to 91c and the positive terminal of the second battery 20. That is, the resistor unit 90 is configured to be capable of variably setting the resistance value thereof based on the rotation of the cylindrical member 92.

Figure 22:
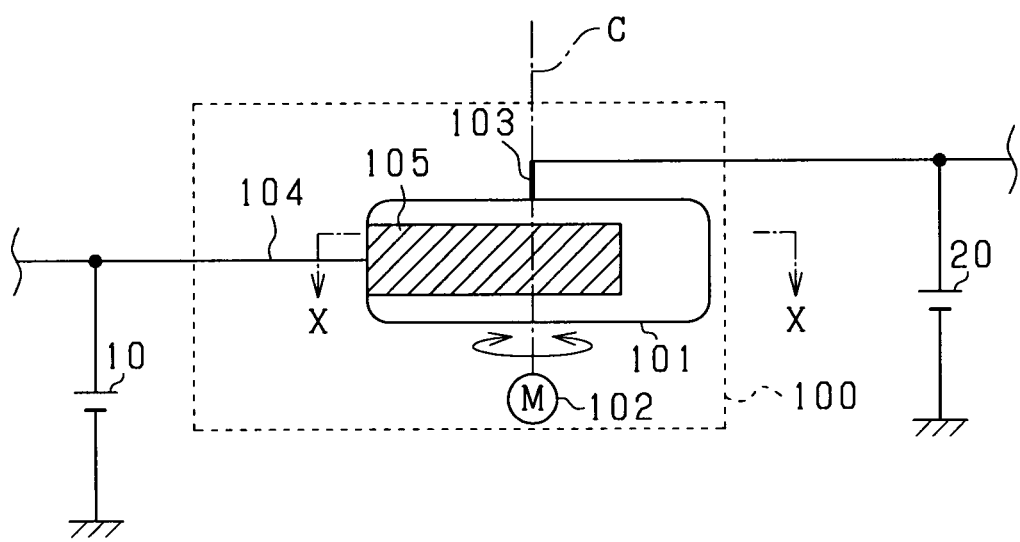
FIG. 22 is a diagram of a configuration of a resistor unit according to the modification of the first embodiment.

In addition, the resistor unit is not limited to that including the first to third resistors 91a to 91c. For example, the resistor unit may be a resistor unit 100 shown in FIG. 22 and FIG. 23. Specifically, the resistor unit 100 includes a cylindrical member 101, a motor 102, a first conductive member 103, and a second conductive member 104. The cylindrical member 101 has a circular cylindrical shape and is not conductive. The motor 102 rotates the cylindrical member 101 with the center axis line C of the cylindrical member 101 as the center of rotation. The motor 102 is driven by the control unit 70. The first conductive member 103 is formed so as to extend in the direction of the center axis line C and is disposed on the inner circumferential side of the cylindrical member 101.

Figure 23:
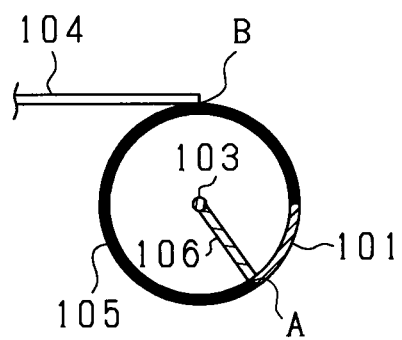
FIG. 23 is a cross-sectional view of a resistor unit taken along line X-X.

A single surface electrode 105 is provided in the cylindrical member 101 so as to be exposed on the outer circumferential side of the cylindrical member 101. The surface electrode 105 extends in the circumferential direction. When the cylindrical member 101 is viewed from the direction of the center axis line C, the electrode 105 is provided such as not to extend completely around the outer circumferential surface of the cylindrical member 101. According to the present embodiment, the electrode 105 is composed of a resistor. The resistance value per unit length of the electrode 105 in the circumferential direction is fixed. The electrode 105 is connected to the first conductive member 103 via an auxiliary conductive member 106. According to the present embodiment, the auxiliary conductive member 106 is connected to an end portion of the electrode 105 that extends in the circumferential direction. The first conductive member 103 is connected to the positive terminal of the second battery 20. In FIG. 23, the thickness of the electrode 105 in the radial direction of the cylindrical member 101 is shown to be the same as the thickness of the cylindrical member 101 in the radial direction, for convenience.

A first end of the second conductive member 104 is connected to the positive terminal of the first battery 10. A second end of the second conductive member 104 is in contact with the electrode 105 on the outer circumferential surface side of the cylindrical member 101. Here, in FIG. 23, a connection point between the electrode 105 and the auxiliary conductive member 106 is point A. A connection point between the second conductive member 104 and the electrode 105 is point B. As a result of the motor 102 being driven, the cylindrical member 101 rotates with the center axis line C as the center of rotation. As a result, depending on the rotation position of the cylindrical member 101 with the center axis line C as the center of rotation, the length of an arc from point A to point B on the outer circumferential surface of the cylindrical member 101 changes. The resistance value of the resistor unit 100 thereby changes. Specifically, the resistance value of the resistor unit 100 increases as the length of the arc from point A to point B increases.

A relay may be connected in series to the third resistor 41*c* in FIG. 2. Alternatively, a relay may be connected in parallel to the third resistor 81*c* in FIG. 19. In this case, the functions of the safety plug 31 according to the above-described third embodiment can be actualized by all of the relays configuring the resistor unit 40 in FIG. 2 being opened, or all of the relays configuring the resistor unit 80 in FIG. 19 being opened. In addition, in the configuration shown in FIG. 20 and FIG. 21, the functions of the safety plug 31 according to the above-described third embodiment can be actualized by the cylindrical member 92 being rotated to a rotation position in which the conducting state is not achieved between any of the resistors 91*a* to 91*c* and the positive terminal of the second battery 20.

In the process shown in FIG. 4 according to the above-described first embodiment, the processes at steps S14, S16, and S20 may be omitted. In this case, for example, the control unit 70 may proceed to step S18 when determined NO at step S12. The control unit 70 may proceed to step S22 or S24 when determined YES at step S12.

In the process shown in FIG. 4 according to the above-described first embodiment, the process at step S12 may be omitted. In this case, the control unit 70 may proceed to step S14 when determined YES at step S10.

According to the above-described first embodiment, the configuration is such that the first battery 10 and the second battery 20 are connected at all times by the connection path 30. However, the configuration is not limited thereto. A configuration in which the first battery 10 and the second battery 20 are not connected at all times may be used. Specifically, for example, a third relay is provided in the resistor unit 40 in FIG. 2. The third relay is connected in series to the third resistor 41*c*. In this configuration, for example, at least one of the first to third relays is closed only during a period over which at least the first and second modules 11 and 21 and the first and second detecting units 12 and 22 are being operated. Meanwhile, when the vehicle is not being used or the like, all of the first to third relays are opened.

According to the above-described first embodiment, the lane keeping assistance control is performed as travelling control. However, travelling control is not limited thereto. For example, the following types of control may be performed.

Anti-lock brake control may be performed. In anti-lock brake control, wheels are prevented from locking when brakes are applied by brake control. In this case, anti-lock braking system (ABS) actuators may be used as the first and second modules. The ABS actuator is capable of independently adjusting the hydraulic pressure of the brake for each wheel during braking.

Cruising control may be performed. In this cruising control, when a leading vehicle that is traveling slower than a set vehicle speed is detected, the own vehicle is decelerated by brake control and a fixed inter-vehicle distance is maintained. When the leading vehicle is no longer detected, the own vehicle is accelerated again and driven at the set vehicle speed. In this configuration, the leading vehicle may be detected by the first and second detecting units 12 and 22. In this case, at least one of the first and second detecting units 12 and 22 may be a millimeter-wave radar. In addition, in this case, the above-described ABS actuator may be used as the first and second modules.

Automatic brake control may be performed. In automatic brake control, when the first and second detecting units 12 and 22 detect a vehicle or a pedestrian ahead of the own vehicle, braking force is automatically applied to the wheels. In this case, at least one of the first and second detecting units 12 and 22 may be a millimeter-wave radar. In addition, in this case, the above-described ABS actuator may be used as the first and second modules.

Lane change assistance control may be performed. In lane change assistance control, the first and second detecting units 12 and 22 monitor blind spots behind the own vehicle and issue a warning of danger to the driver during lane change. In addition, lane deviation warning control may be performed. In lane deviation warning control, the driver is prompted to use caution when the own vehicle is about to deviate from the traffic lane in which the own vehicle is traveling based on detection information from the first and second detecting units 12 and 22.

As control of the vehicle, parking assistance control may be performed. In parking assistance control, assistance in parking the own vehicle is provided. In this case, the first and second detecting units 12 and 22 may be ultrasonic sensors.

According to the above-described first embodiment, the resistor unit 40 is configured such that the resistance value can be variably set among three stages, depending on the opening and closing of the first and second relays 42a and 42b. However, the resistor unit 40 is not limited thereto. The resistor unit 40 may be configured such that the resistance value can be variably set between two stages or among four or more stages. In addition, the resistor unit is not limited to that configured such that the resistance value can be variably set in stages. The resistor unit may be configured such that the resistor value can be variably set in a continuous manner.

According to the above-described first embodiment, the resistance value of the resistor unit may be set to a fixed value rather than being variably set.

According to the above-described first embodiment, the switches configuring the resistor unit are not limited to relays. For example, the switches may be semiconductor switching elements. For example, a MOSFET or an insulted-gate bipolar transistor (IGBT) may be used as the semiconductor switching element.

Either of the electric supercharger 15 and the starter 16 may not be provided in the on-board power supply system.

According to the above-described fourth embodiment, a power supply system including three power supplies is described as an example. However, the power supply system is not limited thereto. The power supply system may include four or more power supplies.

According to the above-described ninth and tenth embodiments, the output voltage of the third battery 120 may be set to be lower than the output voltage of the second battery 20. In this case, the DC-DC converter 18 steps up the output voltage of the third battery 120 and outputs the stepped-up voltage.

According to the above-described embodiments, at least one of the batteries may be changed to a capacitor.

The battery type is not limited to a lead battery. For example, the battery may be a lithium ion battery or a nickel-metal hydride battery.

The first battery and the second battery are not limited to the same type of battery and may be of differing types. In this case, first and second batteries that are of differing types but have the same full-charge capacities may be used. In addition, the first and second batteries are not limited to batteries having the same full-charge capacity, and may be batteries having differing full-charge capacities.

The alternator 14 may be omitted from the configurations shown in FIG. 16 and FIG. 17. As a result of this configuration, electric power can be supplied to the first battery 10, the second battery 20, and the like using electric power generated by the ISG 17 or the main motor generator connected to the third battery 120, while reducing the cost of the power supply system.

According to the above-described third embodiment, the fuse may optionally not be provided in the safety plug 31. The fuse may be provided separately from the safety plug 31 on the connection path 30. In addition, according to the above-described third embodiment, only the fuse, of the fuse and the safety plug 31, may be provided on the connection path 30. Alternatively, only a safety plug 31 that does not include a fuse may be provided on the connection path 30.

Eleventh Embodiment

An eleventh embodiment of an on-board power supply apparatus will hereinafter be described with reference to the drawings. According to the present embodiment, the power supply apparatus is presumed to be mounted in a vehicle that includes an engine as an on-board main machine.

Figure 24:
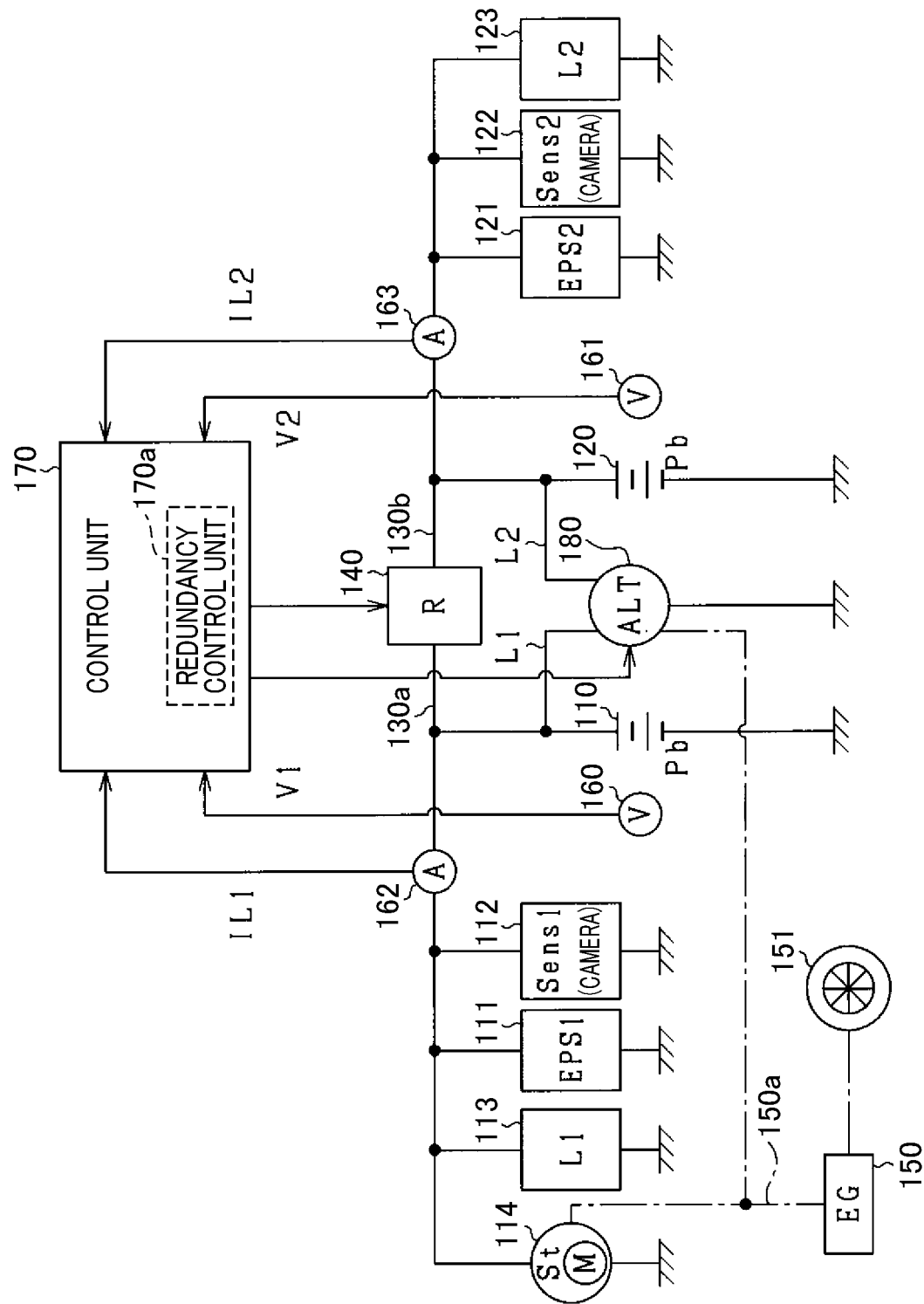
FIG. 24 is an overall configuration diagram of an on-board power supply system according to an eleventh embodiment.

As shown in FIG. 24, the vehicle includes an on-board power supply system. The power supply system includes a first battery 110 and a second battery 120. According to the present embodiment, the first battery 110 and the second battery 120 are lead batteries that have the same full-charge capacity. The respective negative terminals of the first battery 110 and the second battery 120 are grounded to the vehicle body. According to the present embodiment, the respective full-charge capacities of the first battery 110 and the second battery 120 refer to capacities obtained by the full-charge capacity required to operate each on-board electrical load being divided between the first battery 110 and the second battery 120.

The first battery 110 and the second battery 120 are electrically connected with a first electrical path 130a, a connecting unit 140, and a second electrical path 130b therebetween. Specifically, a first end of the connecting unit 140 is connected to a positive terminal of the first battery 110, via the first electrical path 130a. A positive terminal of the second battery 120 is connected to a second end of the connecting unit 140 via the second electrical path 130b.

Figure 25:
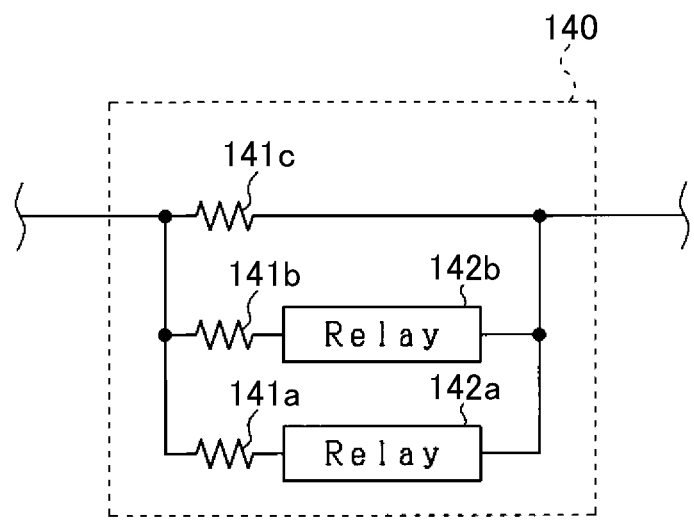
FIG. 25 is a diagram of a configuration of a connecting unit.

As shown in FIG. 25, the connecting unit 140 according to the present embodiment includes first to third resistors 141a to 141c, and first and second relays 142a and 142b. Specifically, the connecting unit 140 is configured such that a serial-connection body composed of the first resistor 141a and the first relay 142a, a serial-connection body composed of the second resistor 141b and the second relay 142b, and the third resistor 141c are connected in parallel. As a result of this configuration, the first battery 110 and the second battery 120 are electrically connected at all times by at least the third resistor 141c. According to the present embodiment, direct-current relays are used as the first and second relays 142a and 142b.

Returning to the foregoing description of FIG. 24, the power supply system includes a first module 111 and a second module 121. The first module 111 is connected in parallel to the first battery 110. The second module 121 is connected in parallel to the second battery 120. According to the present embodiment, the first module 111 and the second module 112 configure an electric power steering apparatus. The electric power steering apparatus will be described hereafter, with reference to FIG. 26.

The first module 111 includes a first drive circuit 111a and a first motor 111b. According to the present embodiment, the first drive circuit 111a is a three-phase inverter device that converts direct-current power supplied from the first battery 110 and direct-current power supplied from the second battery 120 via the connecting unit 140 to alternating-current power and outputs the alternating-current power. The alternating-current power outputted from the first drive circuit 111a is supplied to the first motor 111b. The first motor 111b is driven by receiving the supply of alternating-current power, and generates torque. According to the present embodiment, the first motor 111 is a three-phase motor. Specifically, for example, a permanent magnet synchronous machine can be used as the first motor 111b.

The first module 111 further includes a first diode 111c. The positive terminal of the first battery 110 is connected to an anode of the first diode 111c, via the first electrical path 130a. A first end of the first drive circuit 111a is connected to a cathode of the first diode 111c. A second end of the first drive circuit 111a is connected to ground potential. A configuration that includes a MOSFET instead of the first diode 111c can also be used. In the configuration, the orientations of the anode and cathode of a body diode is matched with the orientations of the anode and cathode of the first diode 111c. The MOSFET is turned ON during driving of the first module 111. Specifically, for example, the MOSFET is an n-channel MOSFET of which a source is connected to the first electrical path 130a side and a drain is connected to the first drive circuit 111a side.

The second module 121 includes a second drive circuit 121a, a second motor 121b, and a second diode 121c. According to the present embodiment, the configuration of the second module 121 is similar to that of the first module 111. Therefore, according to the present embodiment, a detailed description of the second module 121 is omitted.

Figure 26:
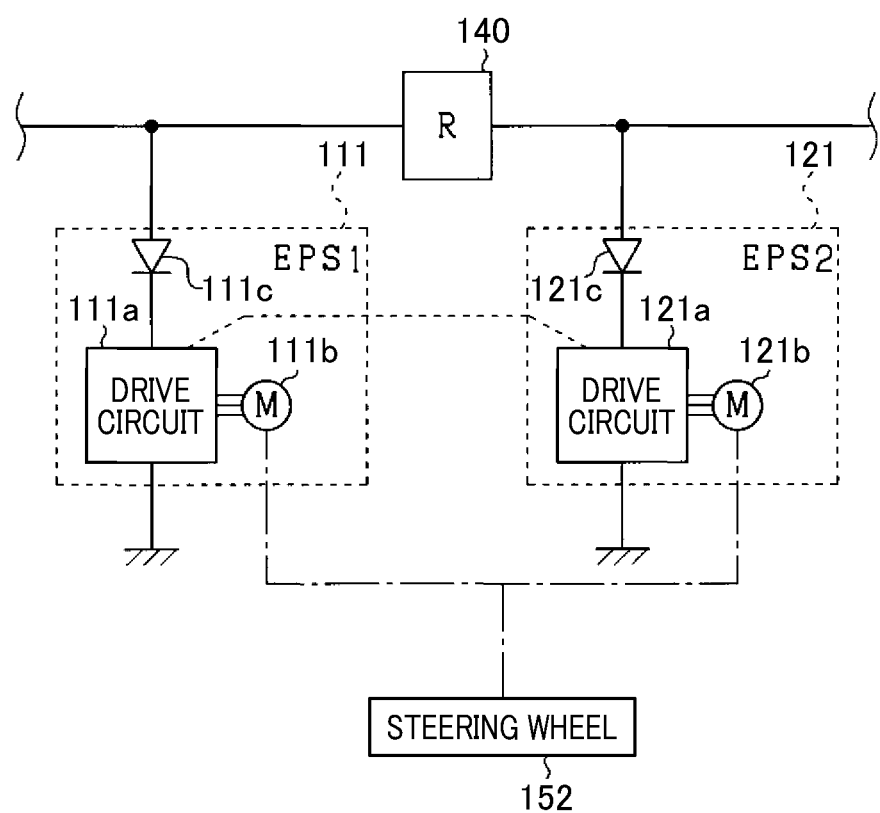
FIG. 26 is a diagram of a configuration of an electric power steering apparatus.

An output shaft (not shown) is connected to respective rotors of the first motor 111b and the second motor 121b. A steering wheel 152 for steering is connected to the output shafts, via a reducer or the like. In cooperation, the first module 111 and the second module 121 generate assistance torque to assist steering by a driver, while exchanging information between the first drive circuit 111a and the second drive circuit 121a. In FIG. 26, a configuration in which two motors are separately installed is shown for convenience. However, this configuration is not limited thereto. For example, a configuration in which two sets of three-phase windings are wound in a single motor, and the sets of windings are respectively energized by drive circuits can also be used.

Returning to the foregoing description of FIG. 24, the power supply system includes a first detecting unit 112 and a second detecting unit 122. The first detecting unit 112 is connected in parallel to the first battery 110. The second detecting unit 122 is connected in parallel to the second battery 120. According to the present embodiment, the first detecting unit 112 and the second detecting unit 122 are on-board cameras that capture images of a course ahead of the own vehicle. The first detecting unit 112 and the second detecting unit 122 are respectively operated using the first battery 110 and the second battery 120 as the power supply.

The power supply system includes a first basic electrical load 113 and a second basic electrical load 123. The first basic electrical load 113 is connected in parallel to the first battery 10. The second basic electrical load 123 is connected in parallel to the second battery 120. The first basic electrical load 113 and the second basic electrical load 123 are respectively operated using the first battery 110 and the second battery 120 as the power supply.

The power supply system includes a starter 114. The starter 114 is connected in parallel to the first battery 110. The starter 114 is driven by receiving electric power, thereby applying an initial rotation to a crank shaft 150a and starting an engine 150. After startup of the engine 150 is completed, power outputted from the engine 150 is transmitted to a drive wheel 151. According to the present embodiment, power consumption when the starter 114 operates exceeds 300 W. In addition, other loads that are connected to the first battery 110 and of which power consumption exceeds 300 W may include, for example, at least one of a compressor for an electric air-conditioner and an electric stabilizer.

The starter 114 is driven by receiving electric power from the first battery 110, and from the second battery 120 via the connecting unit 140. As a result, the starter 114 can be supplied sufficient electric power from the two batteries. In addition, because the connecting unit 140 is provided, even when the starter 114 is driven and electric power is consumed, the amount of decrease in the output voltage of the second battery 120 is less than the amount of decrease in the output voltage of the first battery 110. Therefore, supply voltage supplied to an electrical load connected further on the second battery 120 side than the connecting unit 140 can be stabilized. In particular, according to the present embodiment, an allowable lower-limit value of the supply voltage to the second basic electrical load 123 at which operational reliability can be guaranteed is higher than the respective allowable lower-limit values of the supply voltages of the first basic electrical load 113 and the starter 114 at which operational reliability can be guaranteed. Therefore, as a result of the second basic electrical load 123 being connected further on the second battery 120 side than the connecting unit 140, operational reliability of the second basic electrical load 123 when the starter 114 is driven can be guaranteed.

Diodes that serve a role similar that of the first and second diodes 111c and 121c provided in the first and second modules 111 and 121 are also provided on the respective input sides of the first detecting unit 112, the first basic electrical load 113, the starter 114, the second detecting unit 122, and the second basic electrical load 123.

According to the present embodiment, the first module 111, the first detecting unit 112, the first basic electrical load 113, and the starter 114 correspond to a first electrical load. The second module 112, the second detecting unit 122, and the second basic electrical load 123 correspond to a second electrical load.

The power supply system includes an alternator 116. The alternator 116 generates power by receiving power from the crank shaft 150a. The first battery 110 and the second battery 120 can be charged, and other electrical loads can be supplied electric power, through the electric power generated by the alternator 116. The alternator 116 and a peripheral configuration thereof will be described in detail hereafter.

The power supply system includes a first voltage detecting unit 160 and a second voltage detecting unit 161. The first voltage detecting unit 160 detects the output voltage of the first battery 110. The second voltage detecting unit 161 detects the output voltage of the second battery 120. The power supply system includes a first current detecting unit 162 and a second current detecting unit 163. The first current detecting unit 162 detects a load current supplied from the first battery 110 to each of the electrical loads 111 to 114. The second current detecting unit 163 detects a load current supplied from the second battery 120 to each of the electrical loads 121 to 123.

The power supply system includes a control unit 170 that performs various types of control in the vehicle. Detection values from the detecting units 160 to 163 are inputted to the control unit 170. The control unit 170 performs open-close control of the first and second relays 142a and 142b of the connecting unit 140, drive control of the starter 114, combustion control of the engine 150, and the like. In addition, the control unit 170 performs charge-discharge control to control the state of charge (SOC) of the first battery 110 and the second battery 120 to a target value thereof. The controls described above may actually be executed by separate control units. However, these control units are collectively expressed by the single control unit 170 in FIG. 24. In addition, for convenience, arrows indicating control commands from the control unit 170 are shown for only the connecting unit 140 and the alternator 116.

The open-close control of the first and second relays 142a and 142b is performed such that a resistance value of the connecting unit 140 is increased from an initial value thereof when degradation occurs in the second battery 120. Specifically, when an internal resistance value of the second battery 120 is equal to or less than a first threshold Rth1, the first and second relays 142a and 142b are closed (i.e., turned ON). Subsequently, when the internal resistance value of the second battery 120 becomes greater than the first threshold Rth1 and equal to or less than a second threshold Rth2 (>Rth1), the second relay 142b changed so as to be opened (turned OFF), while the first relay 142a is kept closed. Subsequently, when the internal resistance value of the second battery 120 becomes greater than the second threshold Rth2, the first and second relays 142a and 142b are both opened.

The control unit 170 includes a redundancy control unit 170a. The redundancy control unit 170a performs control to improve the reliability of various types of travelling control. In particular, according to the present embodiment, the redundancy control unit 170a configures a lane keeping assistance system, together with the first and second modules 111 and 121 and the first and second detecting units 112 and 122. The system recognizes a traffic lane on a road in which an own vehicle is traveling, based on detection information from the first and second detecting units 112 and 122. The first and second detecting units 112 and 122 are on-board cameras. When the own vehicle attempts to deviate from the traffic lane in which the own vehicle is traveling, the system performs control to return the own vehicle to the center of the traffic lane through assistance torque from the electric power steering apparatus.

According to the present embodiment, the electric power steering apparatus is divided into the first and second modules 111 and 121, and includes two detecting units, that is, the first and second detecting units 112 and 122 as the on-board cameras, for lane keeping assistance control performed by the lane keeping assistance system. As a result, for example, even in cases in which an abnormality occurs in either of the first and second detecting units 112 and 122, the detection information from the other can be used for control. A situation in which the lane keeping assistance control is suddenly unable to be performed can be avoided. In addition, as a result of the first battery 110 and the second battery 120 being included, even in cases in which an abnormality occurs in either of the first and second batteries 110 and 120, the power supply can be made redundant. Operational reliability of the first and second modules 111 and 121 and the first and second detecting units 112 and 122 can be improved. As a result, reliability of the lane keeping assistance control can be improved.

Figure 27:
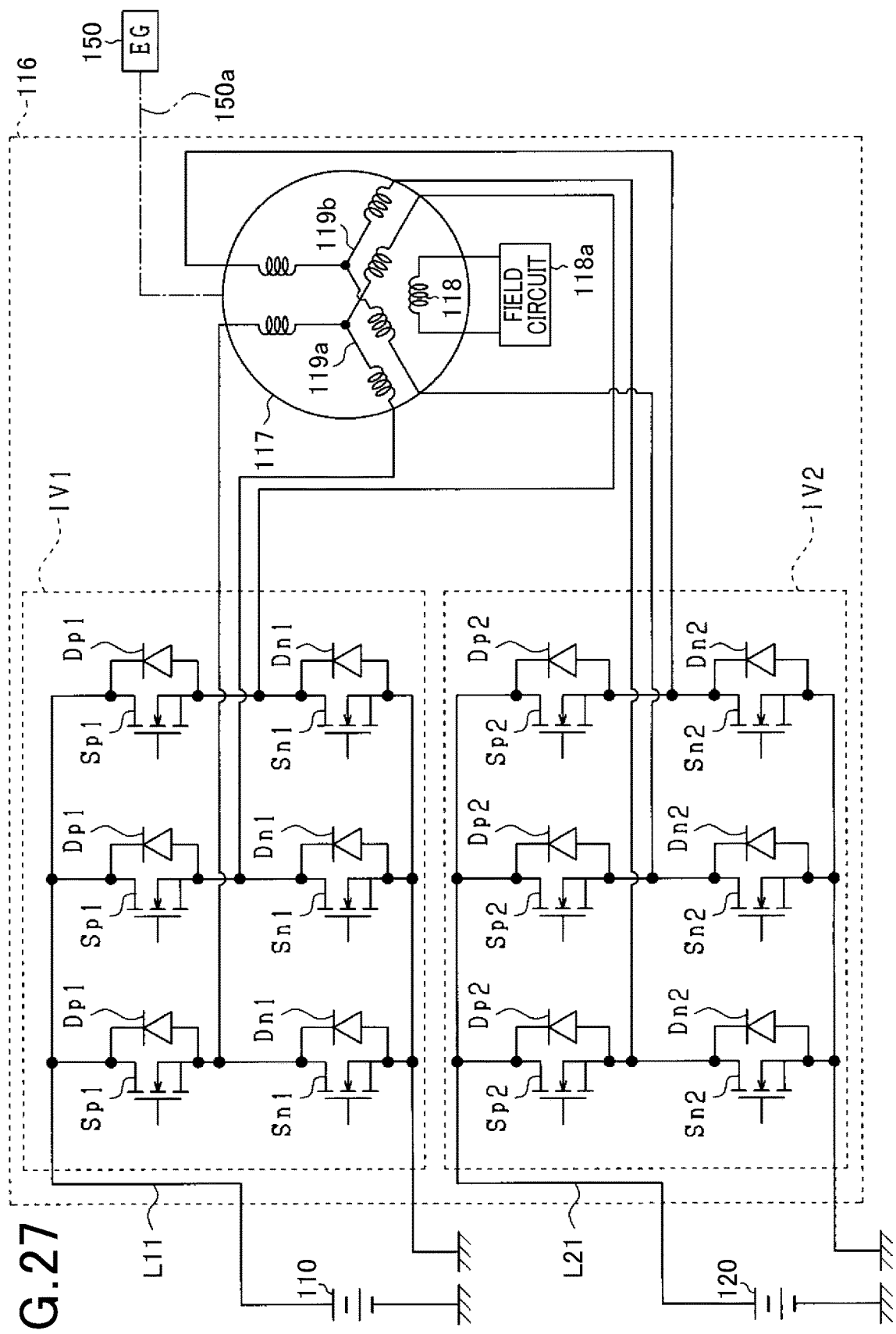
FIG. 27 is a diagram of a configuration of an alternator.

Next, the alternator 116 and the peripheral configuration thereof will be described with reference to FIG. 27.

The alternator 116 is a three-phase, double-layer winding, rotating electric machine. Specifically, the alternator 116 is a wound-field synchronous machine. A rotor 117 that configures the alternator 116 includes a field winding 118 and is capable of performing power transmission with the crank shaft 150a. A field current flowing to the field winding 118 is controlled by a field circuit 118a. The field circuit 118a is controlled by the control unit 170.

Two winding groups, that is, a first winding group 119a and a second winding group 119b are wound around a stator that configures the alternator 116. The rotor 117 is shared between the first and second winding groups 119a and 119b. The first winding group 119a and the second winding group 119b are composed of three-phase windings that have differing neutral points.

The alternator 116 includes a first inverter IV1 and a second inverter IV2. The first inverter IV1 is electrically connected to the first winding group 119a. The second inverter IV2 is electrically connected to the second winding group 119b. According to the present embodiment, the number of turns in each winding configuring the first winding group 119a and the number of turns in each winding configuring the second winding group 119b are set to be equal.

The first inverter IV1 includes serial-connection bodies respectively composed of first upper arm switches Sp1 corresponding to the U, V, and W phases and first lower arm switches Sn1 corresponding to the U, V, and W phases. The connection points of the U-, V-, and W-phase serial-connection bodies are respectively connected to the U-, V-, and W-phase terminals of the first winding group 119a. According to the present embodiment, n-channel MOSFETs are used as the first upper arm switches Sp1. First upper and lower arm diodes Dp1 and Dn1 are respectively connected in reverse parallel to the first upper and lower arm switches Sp1 and Sn1. The diodes Dp1 and Dn1 may be body diodes of the switches Sp1 and Sn1.

The second inverter IV2 includes serial-connection bodies respectively composed of second upper arm switches Sp2 corresponding to the U, V, and W phases and second lower arm switches Sn2 corresponding to the U, V, and W phases. The connection points of the U-, V-, and W-phase serial-connection bodies are respectively connected to the U-, V-, and W-phase terminals of the second winding group 119b. According to the present embodiment, n-channel MOSFETs are used as the second upper arm switches Sp2. Second upper and lower arm diodes Dp2 and Dn2 are respectively connected in reverse parallel to the second upper and lower arm switches Sp2 and Sn2. The diodes Dp2 and Dn2 may be body diodes of the switches Sp2 and Sn2.

The positive terminal of the first battery 110 is connected to a drain of the first upper arm switch Sp1, via a first main output unit L11 that is a conductive member. A source of the first lower arm switch Sn1 is connected to ground potential. The positive terminal of the first battery 110 is connected to a drain of the second upper arm switch Sp2, via a second main output unit L21 that is a conductive member. According to the present embodiment, the first main output unit L11 and the second main output unit L21 are differing components. A source of the second lower arm switch Sn2 is connected to ground potential.

Next, a power generation control process of the alternator 116 will be described with reference to FIG. 28. The power generation control process is repeatedly performed by the control unit 170, for example, at a predetermined cycle.

In this series of processes, first, at step S110, the control unit 170 acquires the current detected by the first current detecting unit 162 as a first load current IL1 and the current detected by the second current detecting unit 163 as a second load current IL2. In addition, the control unit 170 acquires the voltage detected by the first voltage detecting unit 160 as a first voltage V1, and the voltage detected by the second voltage detecting unit 161 as a second voltage V2. The first and second load currents IL1 and IL2 are not limited to the detection values of the first and second current detecting units 162 and 163. For example, the first and second load currents IL1 and IL2 may be current values estimated from the operating states of the electrical loads 111 to 114 and 121 to 123.

At subsequent step S112, the control unit 170 estimates a first open-circuit voltage OCV1 and a second open-circuit voltage OCV2. The first open-circuit voltage OCV1 is the current open-circuit voltage of the first battery 110. The second open-circuit voltage OCV2 is the current open-circuit voltage of the second battery 120. The first open-circuit voltage OCV1 is merely required to be estimated based on the first load current IL1 and the first voltage V1. The second open-circuit voltage OCV2 is merely required to be estimated based on the second load current IL2 and the second voltage V2. In addition, the control unit 170 estimates a first state of charge SOC1 and a second state of charge SOC2. The first state of charge SOC1 is the current state of charge of the first battery 110 and is estimated based on the first open-circuit voltage OCV1. The second state of charge SOC2 is the current state of charge of the second battery 120 and is estimated based on the second open-circuit voltage OCV2. According to the present embodiment, the process at step S112 corresponds to a first voltage estimating unit.

At subsequent step S114, the control unit 170 calculates a first maximum voltage B1 max, a first minimum voltage B1 min (<B1 max), a second maximum voltage B2 max, and a second minimum voltage B2 min (<B2 max). Each voltage will be described below with reference to FIG. 29. The solid lines in FIG. 29 are characteristics information indicating: a relationship between the state of charge (SOC) and a closed-circuit voltage (terminal voltage) CCV1 of the first battery 110; and a relationship between the state of charge (SOC) and a closed-circuit voltage (terminal voltage) CCV2 of the first second battery 120.

Figure 29:
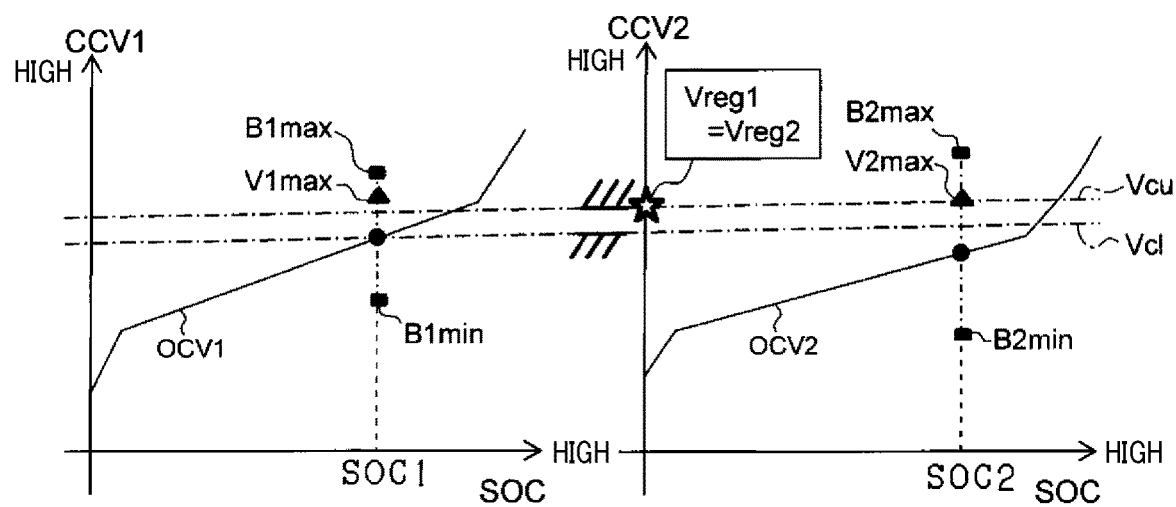
FIG. 29 is a battery characteristics diagram of a relationship between state of charge (SOC) and output voltage.

As shown in FIG. 29, the first maximum voltage B1 max is the closed-circuit voltage (terminal voltage) of the first battery 110 when maximum input power that can be inputted to the first battery 110 is inputted to the first battery 110. The first maximum voltage B1 max is higher than the current first open-circuit voltage OCV1. The first minimum voltage B1 min is the closed-circuit voltage (terminal voltage) of the first battery 110 when maximum output power that can be outputted from the first battery 110 is outputted from the first battery 110. The first minimum voltage B1 min is lower than the current first open-circuit voltage OCV1.

The second maximum voltage B2 max is the closed-circuit (terminal voltage) of the second battery 120 when maximum input power that can be inputted to the second battery 120 is inputted to the second battery 120. The second maximum voltage B2 max is higher than the current second open-circuit voltage OCV2. The second minimum voltage B2 min is the closed-circuit voltage (terminal voltage) of the second battery 120 when maximum output power that can be outputted from the second battery 120 is outputted from the second battery 120. The second minimum voltage B2 min is lower than the current second open-circuit voltage OCV2.

Figure 28:
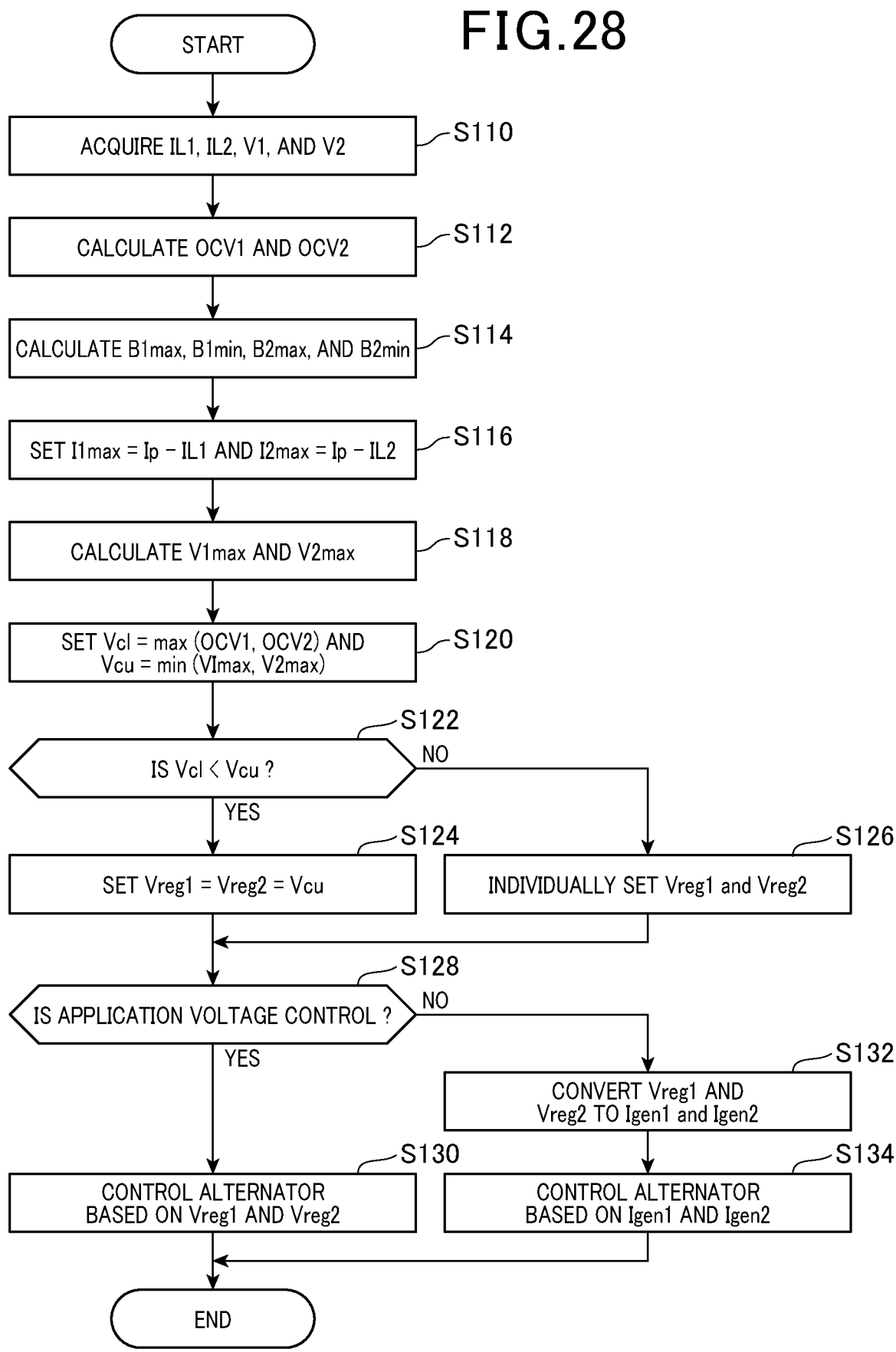
FIG. 28 is a flowchart of the steps in a power generation process.

Returning to the foregoing description of FIG. 28, at subsequent step S116, the control unit 170 calculates a first maximum current I1 max that can be charged to the first battery 110 from the alternator 116, via the first main output unit L11. The first maximum current I1 max is calculated as a value obtained by the first load current IL1 being subtracted from a maximum current capacity Ip of the alternator 116. According to the present embodiment, the maximum current capacity Ip refers to a maximum output current that can be outputted to the output units L11 and L21 from the alternator 116. The maximum current capacity Ip corresponds to half of the total output current of the alternator 116. In addition, the control unit 170 calculates a second maximum current I2 max that can be charged to the second battery 120 from the alternator 116, via the second main output unit L21. The second maximum current I2 max is calculated as a value obtained by the second load current IL2 being subtracted from the maximum current capacity Ip.

Figure 30:
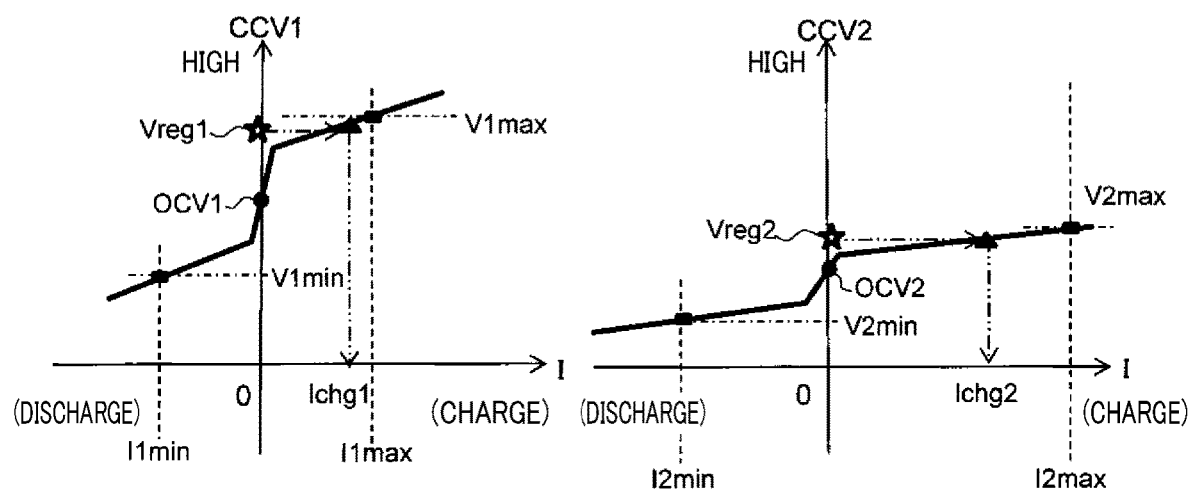
FIG. 30 is a battery characteristics diagram of a relationship between charge-discharge current and output voltage.

At subsequent step S118, the control unit 170 calculates a first maximum charge voltage V1 max that is the supply voltage to the first battery 110 required when the first battery 110 is charged by the first maximum current I1 max. Specifically, as shown in FIG. 30, the first maximum charge voltage V1 max is calculated based on the first maximum current I1 max, and the characteristics information prescribing the relationship between the charge-discharge current of the first battery 110 and the closed-circuit voltage CCV1 of the first battery 110. That is, the control unit 170 calculates the closed-circuit voltage of the first battery 110 when the first battery 110 is charged by the first maximum current I1 max that is provisionally set, as the first maximum charge voltage V1 max. The first maximum charge voltage V1 max is a value within a voltage range from the first minimum voltage B1 min to the first maximum voltage B1 max.

In addition, at step S118, the control unit 170 calculates a second maximum charge voltage V2 max that is the supply voltage to the second battery 120 required when the second battery 120 is charged by the second maximum current I2 max. Specifically, as shown in FIG. 30, the second maximum charge voltage V2 max is calculated based on the second maximum current I2 max, and the characteristics information prescribing the relationship between the charge-discharge current of the second battery 120 and the closed-circuit voltage CCV2 of the second battery 120. That is, the control unit 170 calculates the closed-circuit voltage of the second battery 120 when the second battery 120 is charged by the second maximum current I2 max that is provisionally set, as the second maximum charge voltage V2 max. The second maximum charge voltage V2 max is a value within a voltage range from the second minimum voltage B2 min to the second maximum voltage B2 max. According to the present embodiment, the processes at steps S116 and S118 correspond to a second voltage estimating unit.

Returning to the foregoing description of FIG. 28, at subsequent step S120, the control unit 170 sets the greater of the first open-circuit voltage OCV1 and the second open-circuit voltage OCV2 as a first determination voltage Vcl. In addition, the control unit 170 sets the lesser of the first open-circuit voltage OCV1 and the second open-circuit voltage OCV2 as a second determination voltage Vcu. According to the present embodiment, the process at step S120 corresponds to a first setting unit and a second setting unit.

At step S122, the control unit 170 determines whether or not the first determination voltage Vcl is lower than the second determination voltage Vcu. The control unit 170 performs this process to determine whether or not a charge command voltage Vreg1 of the first battery 110 and a charge command voltage Vreg2 of the second battery 120 can be set to the same value. In addition, the control unit 170 performs this process to determine whether or not charging of either of the first battery 110 and the second battery 120 should be prioritized over that of the other. According to the present embodiment, the process at step S122 corresponds to a priority determining unit.

When determined YES at step S122, the control unit 170 proceeds to step S124. The control unit 170 sets each of the first charge command voltage Vreg1 and the second charge command voltage Vreg2 to the second determination voltage Vcu. As a result of this setting, the voltage becomes equal on both ends of the connecting unit 40 when the first and second batteries 110 and 120 are charged by the electric power generated by the alternator 116. The current passing through the connecting unit 140 becomes zero. Therefore, loss that occurs when the first battery 110 and the second battery 120 are charged by the electric power generated by the alternator 116 can be reduced. In addition, at step S124, the control unit 170 can set the charge command voltages Vreg1 and Vreg2 to the second determination value Vcu that is the maximum value of the voltage range that can be set.

Figure 31:
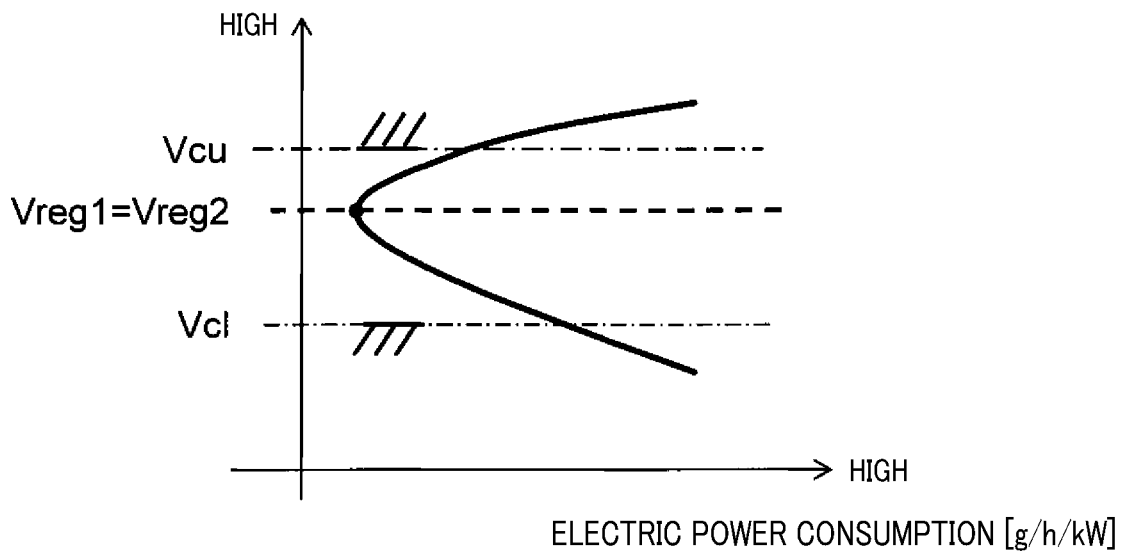
FIG. 31 is a characteristics diagram of a relationship between battery output voltage and electric power consumption.

At step S124, the first charge command voltage Vreg1 and the second charge command voltage Vreg2 may be set in a manner described below. As shown in FIG. 31, the first charge command voltage Vreg1 and the second charge command voltage Vreg2 may be set to a charge command voltage that is included in the voltage range from the first determination voltage Vcl to the second determination voltage Vcu, and of which electric power consumption becomes minimum. Here, electric power consumption refers to an amount of increase in fuel consumption of the engine 150 per unit generated electric power of the alternator 116. As a result of this setting method, an effect of reducing fuel consumption in the engine 150 can be improved. A method for calculating electric power consumption is described in, for example, JP-A-2004-260908 and JP-A-2005-12971. Therefore, a detailed description thereof is omitted.

Figure 32:
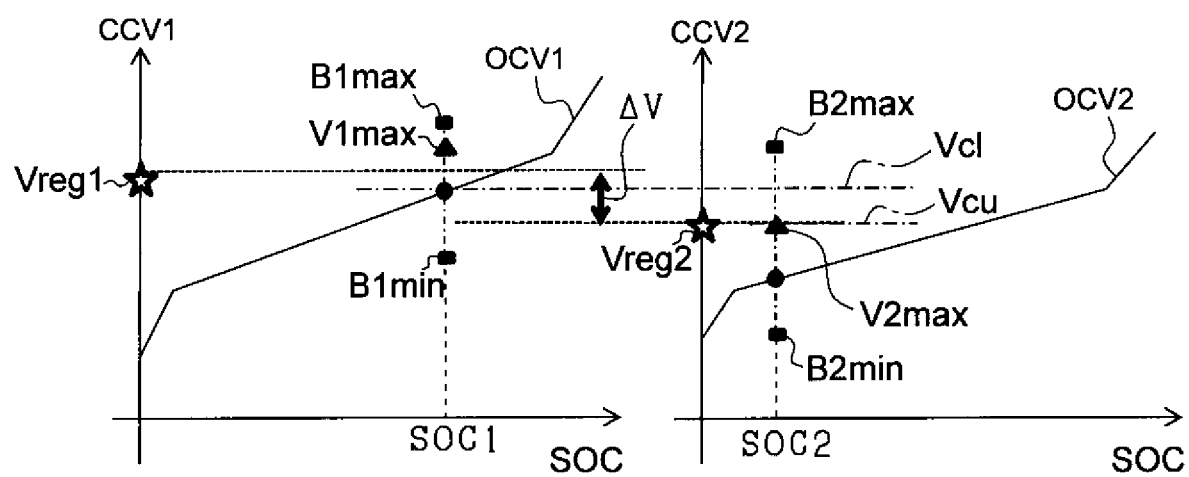
FIG. 32 is a battery characteristics diagram of a relationship between SOC and output voltage.

Returning to the foregoing description of FIG. 28, when determined NO at step S122, the control unit 70 proceeds to step S126. The control unit 170 individually sets the first charge command voltage Vreg1 and the second charge command voltage Vreg2. According to the present embodiment, the control unit 170 selects, from the first and second batteries 110 and 120, the battery corresponding to the maximum charge voltage, of the first maximum charge voltage V1 max and the second maximum charge voltage V2 max, that is the same value as the second determination voltage Vcu. Then, the control unit 170 sets the charge command voltage of the selected battery to the second determination voltage Vcu. FIG. 32 shows an example in which the second charge command voltage Vreg2 is set to the second determination voltage Vcu.

In addition, the control unit 170 selects, from the first and second batteries 110 and 120, the battery corresponding to the maximum charge voltage, of the first maximum charge voltage V1 max and the second maximum charge voltage V2 max, that is not the same value as the second determination voltage Vcu. Then, the control unit 170 sets the charge command voltage of the selected battery to a value that is greater than the second determination voltage Vcu and is equal to or less than the first maximum charge voltage V1 max. FIG. 32 shows an example in which the first maximum charge voltage Vreg1 is set to a value that is greater than the second determination voltage Vcu by a predetermined amount $\Delta V$.

As a result of the setting method for the charge command voltages Vreg1 and Vreg2 at step S126, for example, when charging of the second battery 120 is to be completed at an early stage, the second battery 120 can be charged by the generated electric power outputted from the first main output unit L11, in addition to the generated electric power outputted from the second main output unit L21.

According to the present embodiment, the processes at steps S124 and S126 correspond to a command value setting unit.

Returning to the foregoing description of FIG. 28, when the processes at steps S124 and S126 are completed, the control unit 170 proceeds to step S128. At step S128, the control unit 170 determines whether the application of the alternator 116 provided in the power supply system is voltage control application or current control application.

When determined that the application is voltage control application at step S128, the control unit 170 proceeds to step S130. The control unit 170 operates the first and second inverters IV1 and IV2 based on the first and second charge command voltages Vreg1 and Vreg2 set at step S124 or step S126. Specifically, the control unit 170 opens and closes the switches Sp1 and Sn1 configuring the first inverter IV1 so as to control the direct-current voltage outputted from the first inverter IV1 to the first battery 110 to the first charge command voltage Vreg1. In addition, the control unit 170 opens and closes the switches Sp2 and Sn2 configuring the second inverter IV2 so as to control the direct-current voltage outputted from the second inverter IV2 to the second battery 120 to the second charge command voltage Vreg2.

Meanwhile, when determined NO at step S128, the control unit 170 determines that the application is current control application and proceeds to step S132. At step S132, the control unit 170 converts the first charge command voltage Vreg1 to a first charge command current Igen1, and converts the second charge command voltage Vreg1 to a second charge command current Igen2. According to the present embodiment, the process at step S132 corresponds to a converting unit. The converting method will be described below.

First, a case in which the first charge command voltage Vreg1 and the second charge command voltage Vreg2 are set to the same value will be described. When the charge current flowing through the first battery 110 is defined as Ichg1 and the current flowing through the connecting unit 140 is defined as Itrans, the first charge command current Igen1 that is the current outputted from the first main output unit L11 can be calculated by a following expression (eq1).

$$I gen1 = I chg1 + IL1 + I trans \quad (eq1)$$

Here, the direction from the first battery 110 side towards the second battery 120 side of the current Itrans flowing through the connecting unit 140 is defined as positive. When the charge current flowing through the second battery 120 is defined as Ichg2, the second charge command current Igen2 that is the current outputted from the second main output unit L21 can be calculated by a following expression (eq2).

$$I gen2 = I chg2 + IL2 - I trans \quad (eq2)$$

Here, when the first charge command voltage Vreg1 and the second charge command voltage Vreg2 are set to the same value, Itrans=0. That is, the above-described expressions (eq1) and (eq2) become following expressions (eq3) and (eq4).

$$I gen1 = I chg1 + IL1 \quad (eq3)$$

$$I gen2 = I chg2 + IL2 \quad (eq4)$$

The control unit 170 converts the first charge command voltage Vreg1 to the charge current Ichg1 flowing through the first battery 110, based on the relationship between the charge-discharge current and the closed-circuit voltage CCV1 of the first battery 110 shown in FIG. 30. Then, the control unit 170 calculates the first charge command current Igen1 based on the converted charge current Ichg1, the first load current IL1, and the above-described expression (eq3). Meanwhile, the control unit 170 converts the second charge command voltage Vreg2 to the charge current Ichg2 flowing through the second battery 120, based on the relationship between the charge-discharge current and the closed-circuit voltage CCV2 of the second battery 120 shown in FIG. 30. Then, the control unit 170 calculates the second charge command current Igen2 based on the converted charge current Ichg2, the second load current IL2, and the above-described expression (eq4).

Next, a case in which the first charge command voltage Vreg1 and the second charge command voltage Vreg2 differ will be described. According to the present embodiment, the resistance value of the connecting unit 140 is Ra. A charge potential difference $\Delta V$ that is the difference between the first charge command voltage Vreg1 and the second charge command voltage Vreg2 is calculated from a following expression (eq5).

$$\Delta V = Vreg1 - Vreg2 \quad (eq5)$$

The current flowing through the connecting unit 140 is calculated based on the charge potential difference ΔV calculated from the above-described expression (eq5) and a following expression (eq6).

$$Itrans = \frac{\Delta V}{Ra} \quad (eq\ 6)$$

Then, the control unit 170 calculates the first charge command current Igen1 based on the converted charge current Ichg1, the first load current IL1, the current Itrans calculated from the above-described expression (eq6), and the above-described expression (eq1). In addition, the control unit 170 calculates the second charge command current Igen2 based on the converted charge current Ichg2, the second load current IL2, the current Itrans calculated from the above-described expression (eq6), and the above-described expression (eq2).

At subsequent step S134, the control unit 170 operates the first and second inverters IV1 and IV2 based on the first and second charge command currents Igen1 and Igen2 converted at step S132. Specifically, the control unit 170 opens and closes the switches Sp1 and Sn1 configuring the first inverter IV1 so as to control the direct-current outputted from the first inverter IV1 to the first battery 110 to the first charge command current Igen1. In addition, the control unit 170 opens and closes the switches Sp2 and Sn2 configuring the second inverter IV2 so as to control the direct-current outputted from the second inverter IV2 to the second battery 120 to the second charge command current Igen2.

According to the present embodiment, the processes at steps S130 and S134 correspond to an operating unit.

According to the present embodiment described in detail above, the following effects can be achieved.

The first main output unit 1L1 is connected to the first electrical path 130a. The second main output unit 1L2 is connected to the second electrical path 130b. Therefore, compared to a configuration in which a main output unit is connected to only either of the first electrical path 130a and the second electrical path 130b, the potential difference between both ends of the connecting unit 140 can be reduced, and the current flowing through the connecting unit 140 can be reduced. In particular, according to the present embodiment, the first charge command voltage Vreg1 and the second charge command voltage Vreg2 are set to the same value. Therefore, loss that occurs when the first battery 110 and the second battery 120 are each charged by the electric power generated by the alternator 116 can be suitably reduced. In addition, as a result of loss being reduced, heat generation caused by the current flowing through the connecting unit 140 can be suppressed. Therefore, the physical construction of a heat releasing portion, such as fins, can be made smaller. Furthermore, the power supply system can be more easily mounted in the vehicle.

When a determination is made that charging of either of the first battery 110 and the second battery 120 is prioritized over that of the other battery, the charge command voltage of the prioritized battery is set to be greater than the charge command voltage of the other battery. Therefore, charging of the battery to be preferentially charged can be promoted.

When determined that the application of the alternator 116 is current control application, the charge command voltages Vreg1 and Vreg2 are respectively converted to charge command currents Igen1 and Igen2. The inverters IV1 and IV2 are then operated based on the converted charge command currents Igen1 and Igen2. Therefore, the current amount can be used as a direct controlled variable, and charge control of the batteries 110 and 120 can be performed with high accuracy.

Twelfth Embodiment

Figure 33:
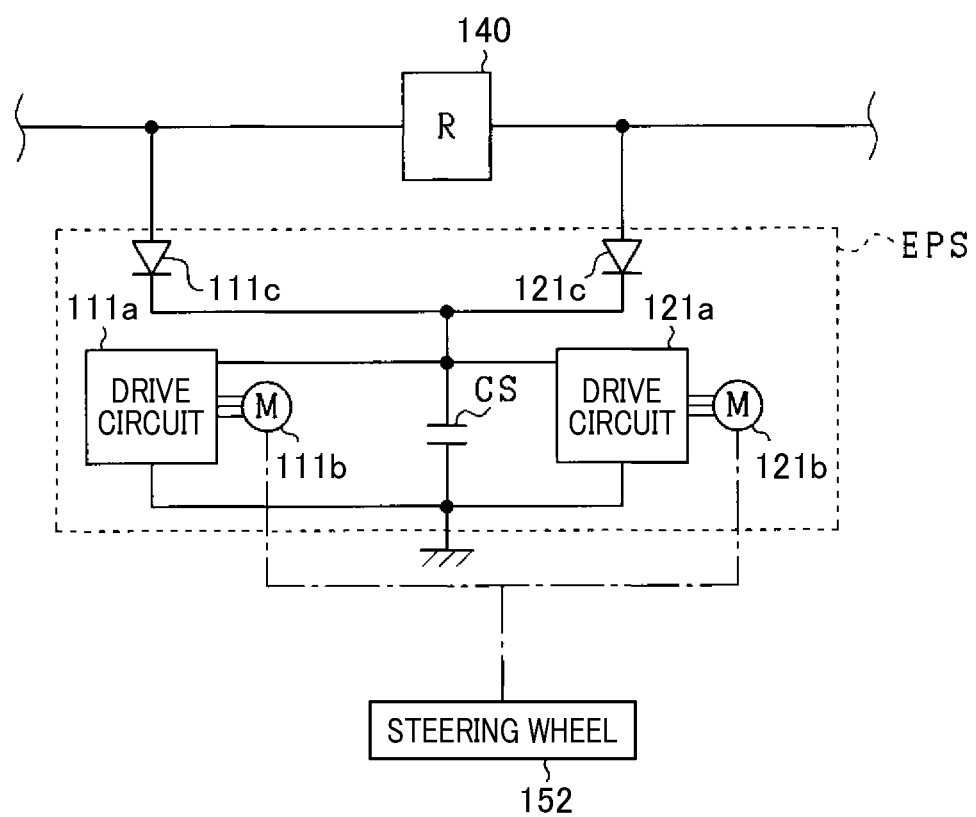
FIG. 33 is a diagram of a portion of a power supply system according to a twelfth embodiment.

A twelfth embodiment will be described below with reference to the drawings, mainly focusing on the differences from the above-described eleventh embodiment. According to the present embodiment, as shown in FIG. 33, the configuration of an electric power steering apparatus EPS is modified. In FIG. 33, configurations that are identical to the configurations shown in foregoing FIG. 26 are given the same reference numbers for convenience.

As shown in FIG. 33, a first end of a common power supply CS of the first drive circuit 111a and the second drive circuit 121a is connected to the respective cathodes of the first diode 111c and the second diode 121c. A second end of the common power supply CS is connected to ground potential. According to the present embodiment, a capacitor is used as the power supply CS.

In the configuration described above, the effects described below are achieved by diodes being provided on the input side of the electrical loads 111 to 114 and 121 to 123. Specifically, exchange of electric power between the first battery 110 and the second battery 120 via the electrical loads 111 to 114 and 121 to 123 can be prevented. A situation in which power generation control of the alternator 116 cannot be correctly performed can be avoided. In this case, when a MOSFET in which the orientations of the anode and cathode of the body diode are matched with the orientations of the anode and cathode of the diode is used instead of using the diode, exchange of electric power via the common power supply CS can be prevented by the MOSFET being turned OFF and electric power being received by only the body diode, when the charge potential difference ΔV is set to a value other than zero. Should the MOSFET be described based on an example of the first diode 111c side, the MOSFET is an n-channel MOSFET of which the source is connected to the first electrical path 130a side and the drain is connected to the power supply CS side.

Thirteenth Embodiment

A thirteenth embodiment will be described below with reference to the drawings, mainly focusing on the differences from the above-described eleventh embodiment. According to the present embodiment, an abnormality determination process for the second battery 120 is performed. According to the present embodiment, abnormalities in the second battery 120 include degradation of the second battery 120.

Figure 34:
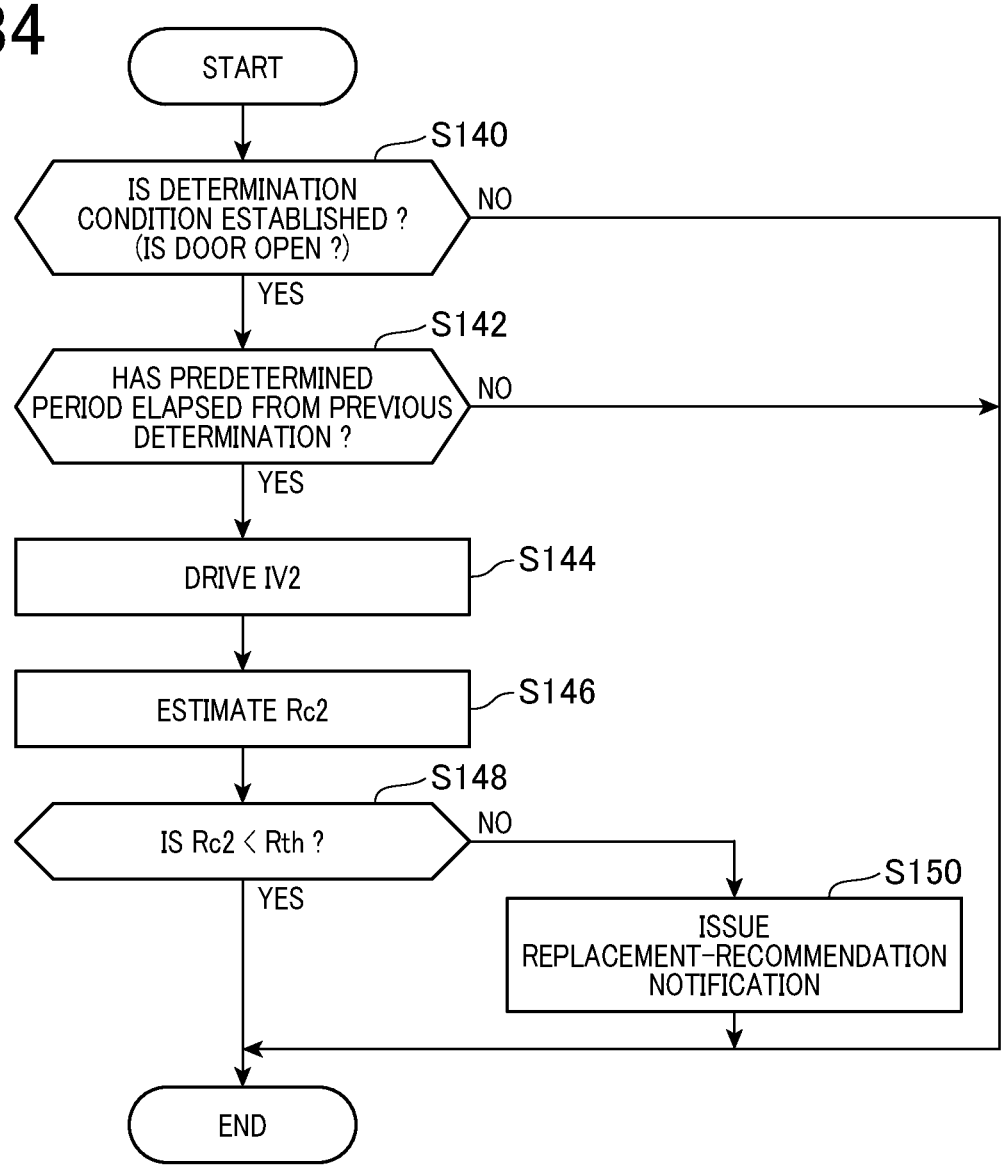
FIG. 34 is a flowchart of the steps in a battery abnormality determination process according to a thirteenth embodiment.

FIG. 34 shows the steps in the abnormality determination process. The abnormality determination process is repeatedly performed by the control unit 170, for example, at a predetermined cycle.

In the series of processes, first, at step S140, the control unit 170 determines whether or not an abnormality determination condition for the second battery 120 is established.

According to the present embodiment, a condition that a door of the vehicle is open is used as the abnormality determination condition.

When determined that the abnormality determination condition is established at step S140, the control unit 170 proceeds to step S142. The control unit 170 determines whether or not a predetermined period has elapsed from the previous abnormality determination. Here, for example, the predetermined period is set to several days.

When determined YES at step S142, the control unit 170 proceeds to step S144. The control unit 170 converts the direct-current voltage outputted from the second battery 120 to an alternating-current voltage and applies the alternating-current voltage to the second winding group 119b. The control unit 170 operates the second inverter IV2 so as to output torque from the alternator 116.

At subsequent step S46, the control unit 170 estimates an internal resistance value Rc2 of the second battery 120 based on the second load current IL2 and the second voltage V2 during the operating period of the second inverter IV2. According to the present embodiment, the internal resistance value Rc2 is estimated as a ratio of the amount of change in the second voltage V2 in relation to the amount of change in the second load current IL2. Therefore, the second inverter IV2 is merely required to be operated such that the change in current and the change in voltage is such that the ratio is easily ascertained.

The alternator 116 may be provided with a brake apparatus that applies a brake to the rotation of the rotor 117 such that the rotor 117 does not rotate during the operating period of the second inverter IV2. In addition, the first and second inverters IV1 and IV2 may be operated such that the torque generated by energization of the first winding group 119a and the torque generated by energization of the second winding group 119b are in opposite directions. As a result, the rotor 117 can be prevented from rotating without a brake apparatus being provided.

At subsequent step S148, the control unit 70 determines whether or not the estimated internal resistance value Rc2 is less than a predetermined value Rth. The control unit 170 performs this process to notify the user of replacement-recommendation information that recommends that the second battery 120 currently mounted in the vehicle is replaced with a new battery.

When determined NO at step S148, the control unit 170 determines that an abnormality has occurred in the second battery 120 and proceeds to step S150. At step S150, the control unit 170 notifies the user of the replacement-recommendation information. Here, for example, notification of the replacement-recommendation information may be issued by a display unit, such as a warning lamp, provided on an instrument panel of the vehicle, or through transmission of email to a portable terminal belonging to the user.

According to the above-described embodiment, an abnormality in the second battery 120 can be detected, and replacement of the second battery 120 can be prompted.

Fourteenth Embodiment

Figure 35:
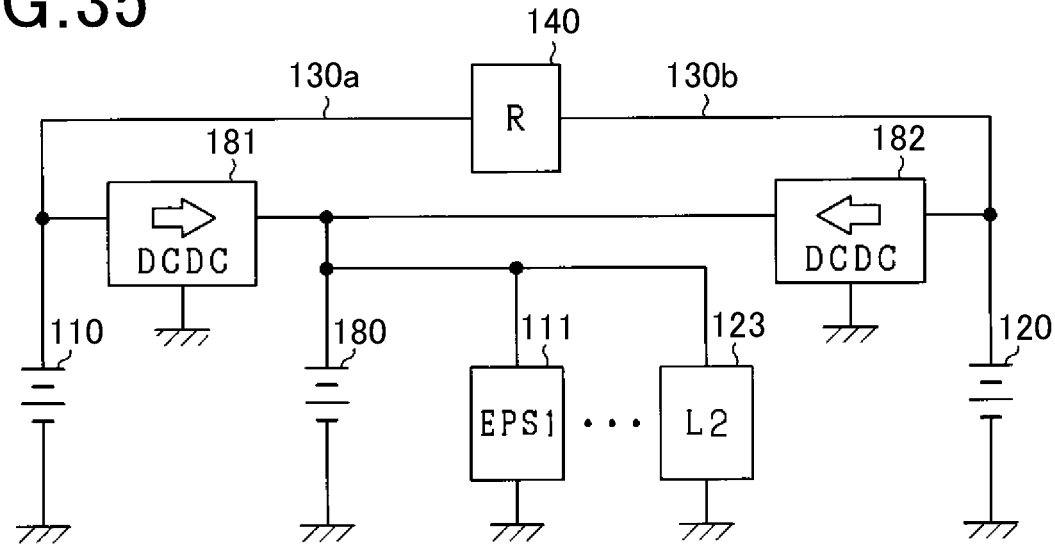
FIG. 35 is a configuration diagram of a power supply system according to a fourteenth embodiment.

A fourteenth embodiment will be described below with reference to the drawings, mainly focusing on the differences from the above-described twelfth embodiment. According to the present embodiment, a configuration shown in FIG. 35 is used instead of the diodes 111c and 121c shown in FIG. 33. In FIG. 35, configurations that are identical to the configurations shown in foregoing FIG. 24 are given the same reference numbers for convenience. In addition, the alternator 116 and the like are omitted in FIG. 35.

As shown in FIG. 35, electric power of the first battery 110 and the second battery 120 are stored in a common power supply 180. According to the present embodiment, a battery is used as the power supply 180. The power supply 180 is not limited to a battery and may be, for example, a capacitor.

An input side of a first voltage transforming unit 181 is connected to the first electrical path 130a. The first voltage transforming unit 181 transforms the direct-current voltage outputted from the first battery 110 and outputs the transformed voltage. According to the present embodiment, the first voltage transforming unit 181 is a direct current-to-direct current (DC-DC) converter. The first voltage transforming unit 181 functions to allow movement of electric power from the first battery 110 side to the power supply 180 side and prevent movement of electric power from the power supply 180 side to the first battery 110 side.

An input side of a second voltage transforming unit 182 is connected to the second electrical path 130b. The second voltage transforming unit 182 transforms the direct-current voltage outputted from the second battery 120 and outputs the transformed voltage. According to the present embodiment, the second voltage transforming unit 182 is a DC-DC converter. The second voltage transforming unit 182 functions to allow movement of electric power from the second battery 120 side to the power supply 180 side and prevent movement of electric power from the power supply 180 side to the second battery 120 side. According to the present embodiment, the output voltage of the first voltage transforming unit 181 is set to be the same value as the output voltage of the second voltage transforming unit 182. The voltage transformation function of the first voltage transforming unit 181 and the second voltage transforming unit 182 is, specifically, at least one of a step-up function and a step-down function.

The first module 111, the first detecting unit 112, the first basic electrical load 113, the starter 114, the second module 121, the second detecting unit 122, and the second basic electrical load 113 are each connected in parallel to the power supply 180.

According to the present embodiment described above, the movement of electric power from the common power supply 180 to the first and second batteries 110 and 120 is prevented by the first and second voltage transforming units 181 and 182. Therefore, the exchange of electric power between the first battery 110 and the second battery 120 via the electrical loads 111 to 114 and 121 to 123 can be prevented.

Fifteenth Embodiment

Figure 36:
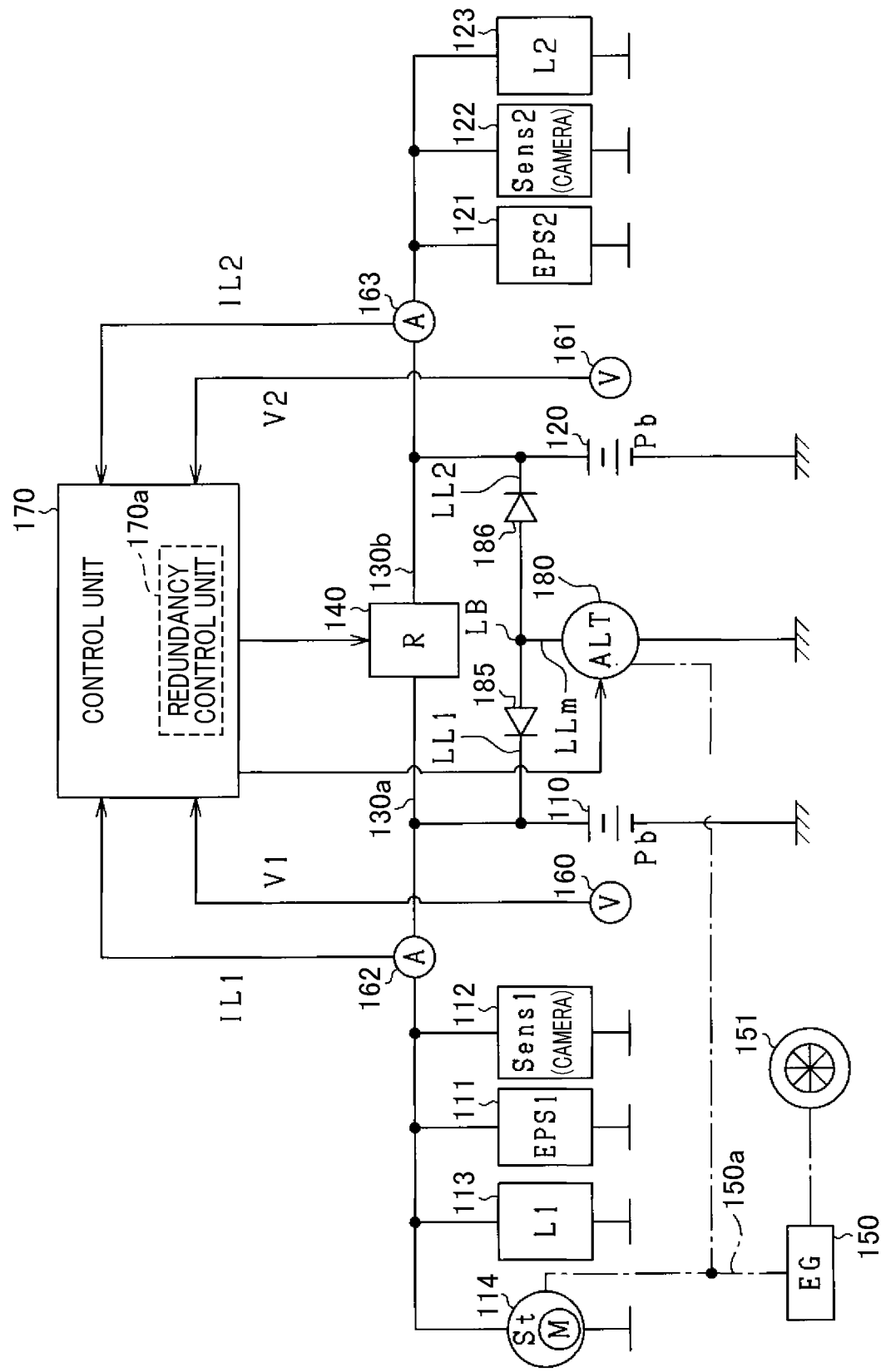
FIG. 36 is an overall configuration diagram of an on-board power supply system according to a fifteenth embodiment.
Figure 37:
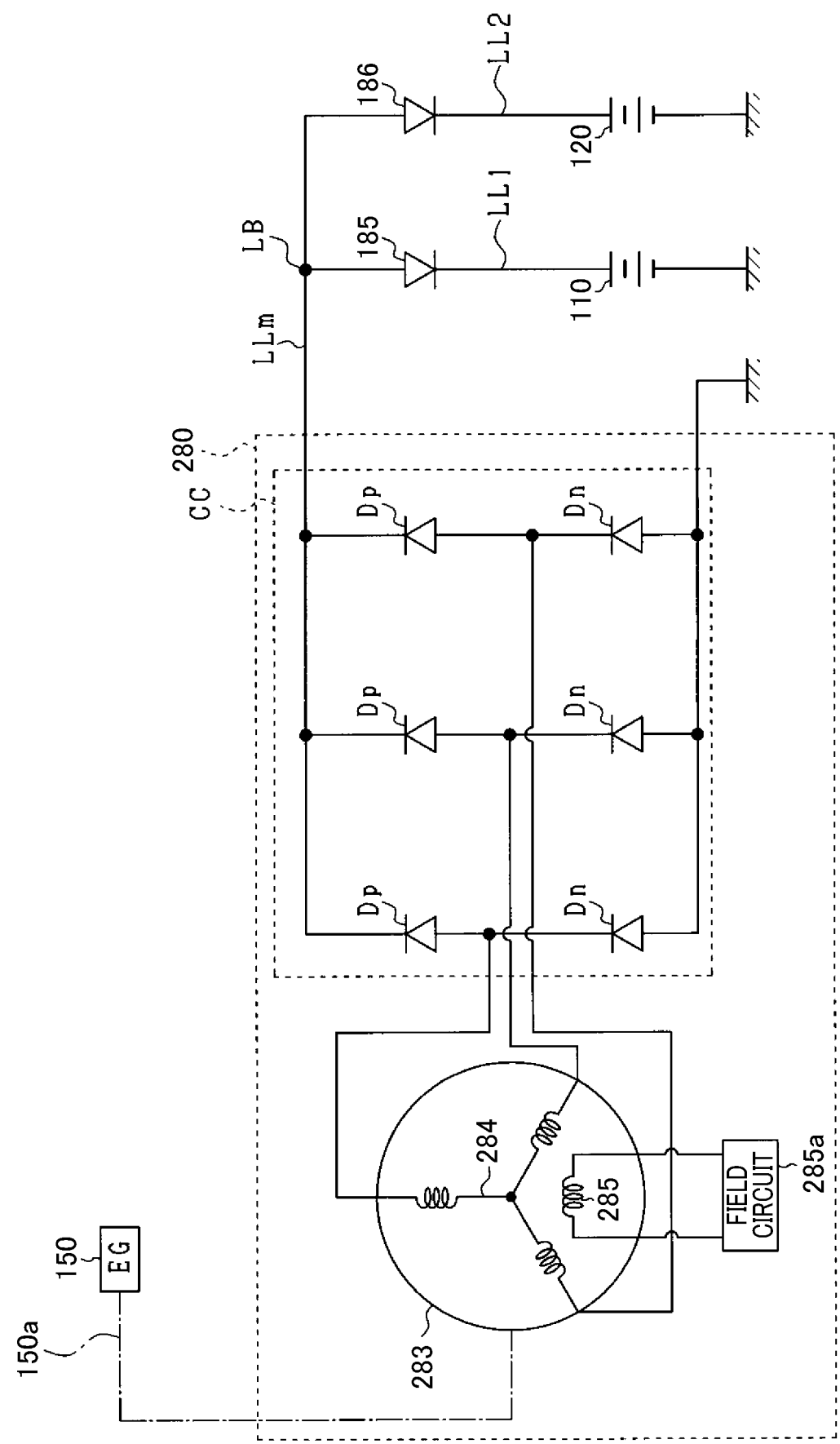
FIG. 37 is a diagram of a configuration of an alternator.

A fifteenth embodiment will be described below with reference to the drawings, mainly focusing on the differences from the above-described eleventh embodiment. According to the present embodiment, as shown in FIGS. 36 and 37, an alternator and a peripheral configuration thereof are modified. In FIGS. 36 and 37, configurations that are identical to the configurations shown in foregoing FIG. 24 are given the same reference numbers for convenience.

The alternator 280 is a wound-field synchronous machine. A rotor 283 that configures the alternator 280 includes a field winding 285 and is capable of performing power transmission with the crank shaft 150a. A field current flowing to the field winding 285 is controlled by a field circuit 285a. The field circuit 285a is controlled by the control unit 170.

A single winding group 284 is wound around a stator configuring the alternator 280. The winding group 284 is composed of three-phase windings that have differing neutral points. The alternator 280 includes a rectifier circuit CC that is electrically connected to the winding group 284. According to the present embodiment, the rectifier circuit CC is a full-wave rectifier circuit configured by upper arm diodes Dp and lower arm diodes Dn.

An anode of the lower arm diode Dn is connected to ground potential. A main output unit LLm that is a conductive member is connected to a cathode of the upper arm diode Dp. The positive terminal of the first battery 110 is connected to a branching portion LB of the main output unit LLm via a first output unit LL1. In addition, the positive terminal of the second battery 120 is connected to the branching portion LB via a second output unit LL2.

A first rectifying diode 185 is provided in the first output unit LL1. The branching portion LB side is connected to an anode of the first rectifying diode 185. The positive terminal side of the first battery 110 is connected to a cathode of the first rectifying diode 185.

A second rectifying diode 186 is provided in the second output unit LL2. The branching portion LB side is connected to an anode of the second rectifying diode 186. The positive terminal side of the second battery 120 is connected to a cathode of the second rectifying diode 186.

In a power generation control process according to the present embodiment, the process at S126 in foregoing FIG. 28 may be eliminated. A reason for this is that, according to the present embodiment, the charge command voltages Vreg1 and Vreg2 are set to the same value.

According to the present embodiment described above, even when the output voltage of the first battery 110 is higher than the output voltage of the second battery 120, current can be prevented from flowing from the first battery 110 to the second battery 120 via the first output unit LL1, the branching portion LB, and the second output unit LL2 by the first rectifying diode 185. Meanwhile, even when the output voltage of the second battery 120 is higher than the output voltage of the first battery 110, current can be prevented from flowing from the second battery 120 to the first battery 110 via the second output unit LL2, the branching portion LB, and the first output unit LL1 by the second rectifying diode 186.

Sixteenth Embodiment

A sixteenth embodiment will be described below with reference to the drawings, mainly focusing on the differences from the above-described eleventh embodiment. According to the present embodiment, as shown in FIG. 38, a safety plug 131 that serves as a blocking member is provided on the second electrical path 130b.

Figure 38:
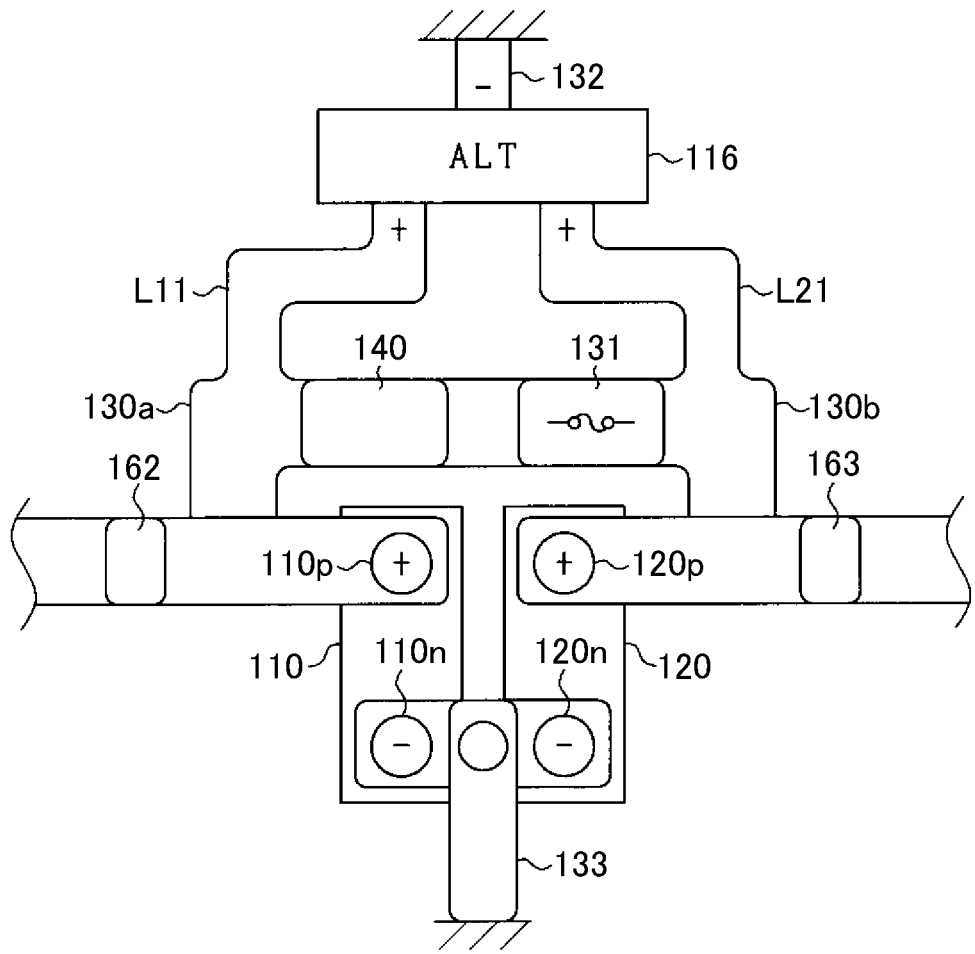
FIG. 38 is a diagram of an arrangement aspect of a safety plug according to a sixteenth embodiment.

As shown in FIG. 38, the safety plug 131 electrically connects the first battery 110 and the second battery 120 in a state in which the safety plug 131 is inserted into the second electrical path 130b. Meanwhile, as a result of the user removing the safety plug 131 from the second electrical path 30b, the first battery 110 and the second battery 120 are electrically blocked from each other.

In FIG. 38, the positive and negative terminals of the first battery 110 are indicated by 110p and 110n. The positive and negative terminals of the second battery 120 are indicated by 120p and 120n. In addition, an electrical path connecting the negative terminals 110n and 120n to ground potential is indicated by 133. An electrical path connecting the alternator 116 and ground potential is indicated by 132.

The user removes the safety plug 131 when the user does not use the vehicle over a long period of time. Subsequently, the user inserts the safety plug 131 when the user uses the vehicle. Here, a case in which the user does not use the vehicle for a long period of time is when, for example, the vehicle is parked for a long period of time in a parking lot of an airport. The effects of the safety plug 131 will be described below.

In a state in which the first battery 110 and the second battery 120 are connected via the connecting unit 140, dark current flows between the first battery 110 and the second battery 120. Electric power is consumed in the connecting unit 140. When this electric power consumption continues for a long period of time, the charge capacities of the first battery 110 and the second battery 120 decrease. A situation such as this can be prevented by the safety plug 131 being removed. An electrical load that operates a vehicle theft prevention function and an electrical load for locking the doors of the vehicle may be electrically connected to the second battery 120.

According to the present embodiment, the safety plug 131 is provided with a fuse. In a state in which the safety plug 131 is inserted into the second electrical path 130b, the fuse is directly connected to the first battery 110 and the second battery 120. The effect of the fuse will be described below.

In foregoing FIG. 24, when a short circuit occurs at a grounding site in a portion of wiring that connects the positive terminal of the second battery 120 to each of: the second battery 120 side of the connecting unit 140; each of the electrical loads 121 to 123; and the second main output unit 1L2 of the alternator 116, a large current flows from the first battery 10 towards the second battery 120 side via the connecting unit 140. Meanwhile, when a short circuit occurs at a grounding site in a portion of wiring that connects the positive terminal of the first battery 110 to each of: the first battery 110 side of the connecting unit 140; each of the electrical loads 111 to 114; and the first main output unit 1L1 of the alternator 116, a large current flows from the second battery 120 towards the first battery 110 side via the connecting unit 140. In this case, as a result of the fuse melting, the first battery 110 and the second battery 120 are electrically blocked from each other. As a result, the functions of the system, of the first battery 110 or the second battery 120, in which the short circuit has not occurred can be maintained. That is, either of the electrical load connected to the first battery 110 and the electrical load connected to the second battery 120 can be operated.

(Modifications)

The above-described eleventh to sixteenth embodiments may be modified in the following manner.

According to the above-described eleventh embodiment, an integrated starter generator (ISG) may be used instead of the alternator 116. The ISG integrates the functions of the starter and the alternator (power generator). In this case, the starter 114 is merely required to be removed from the power supply system.

Figure 39:
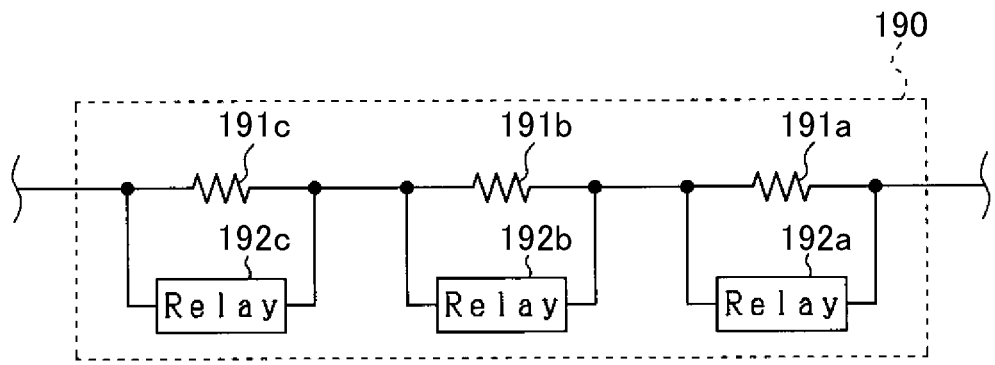
FIG. 39 is a diagram of a configuration of a connecting unit according to a modification of the eleventh embodiment.

The connecting unit is not limited to that described according to the above-described eleventh embodiment. For example, the connecting unit may be a connecting unit 190 shown in FIG. 39. Specifically, the connecting unit 190 includes a series-connection body composed of first to third resistors 191a to 191c, and first to third relays 192a to 192c. The first relay 192a is connected in parallel to the first resistor 191a. The second relay 192b is connected in parallel to the second resistor 191b. The third relay 192c is connected in parallel to the third resistor 191c. In this case, the functions of the safety plug 131 according to the above-described sixteenth embodiment can be actualized as a result of the relays 192a to 192c being opened and closed.

In addition, a relay may be connected in series to the third resistor 141c in FIG. 25. In this case, the functions of the safety plug 131 can be actualized as a result of all of the relays configuring the connecting unit 140 being opened.

In addition, as described in JP-A-2011-78147, the connecting unit may be configured by only a connection switch, such as a MOSFET. In this case, the positive terminal of the first battery 110 is connected to the positive terminal of the second battery 120 via the first electrical path 130a, the connection switch, and the second electrical path 130b. In addition, a DC-DC converter may be set as the connecting unit. In either configuration including the connection switch or the DC-DC converter, the current passing through the connecting unit can be reduced, thereby reducing loss.

In FIG. 34 of the above-described thirteenth embodiment, the determination condition at step S140 may include a condition that an ignition switch of the vehicle has just been turned OFF. In this case, the abnormality determination process is performed after the user has finished using the vehicle.

In FIG. 34 of the above-described thirteenth embodiment, the process at step S144 may be a process in which the starter 114 is driven. In this case, a brake apparatus may apply a brake on the crank shaft 150a to prevent the crank shaft 150a from rotating.

According to the above-described eleventh embodiment, the lane keeping assistance control is performed as travelling control. However, travelling control is not limited thereto. For example, anti-lock brake control or automatic brake control of the vehicle may be performed.

According to the above-described sixteenth embodiment, the safety plug 131 may be provided in the first electrical path 130a.

According to the above-described eleventh embodiment, the switches configuring the connecting unit is not limited to relays. For example, the switches may be semiconductor switching elements. As the semiconductor switching element, for example, a MOSFET or an insulated-gate bipolar transistor (IGBT) can be used.

The battery type is not limited to a lead battery. For example, the battery may be a lithium ion battery or a nickel-metal hydride battery.

The first battery and the second battery are not limited to the same type of battery and may be of differing types. In addition, according to the above-described embodiments, the full-charge capacities of the first battery and the second battery may be the same or may differ.

What is claimed is:

1. An on-board power supply apparatus that is mounted in a vehicle, the on-board power supply apparatus comprising:
   a control unit that performs control of the vehicle;
   a plurality of power supplies that are provided in the vehicle, the plurality of power supplies comprising at least a first power supply and a second power supply;
   a plurality of electrical loads that are provided in the vehicle, the plurality of electrical loads comprising:
      at least one first electrical load that is connected to the first power supply and includes a sensor or an actuator for the control of the vehicle performed by the control unit,
      at least one second electrical load that is connected to the second power supply and includes a sensor or an actuator for the control of the vehicle performed by the control unit, and
      at least one target electrical load that is connected to the first power supply or the second power supply; and
   a connection path that is provided between the first power supply and the second power supply and comprises a resistor unit,
   wherein the control unit is configured to determine a desired resistance value of the resistor unit and change a resistance of the resistor unit to the desired resistance value to electrically connect the first power supply and the second power supply through the resistor unit with the desired resistance value during a period over which the first electrical load and the second electrical load are operated in response to the control unit performing the control of the vehicle.

2. The on-board power supply apparatus according to claim 1, wherein:
   a resistance value of the resistor unit is variably set by energization operation of the resistor unit being performed;
   the on-board power supply apparatus includes:
      a voltage detecting unit that detects an output voltage of the first power supply or the second power supply other than the first power supply or the second power supply connected to the target electrical load; and
   the control unit is further configured to:
      determine whether the output voltage detected by the voltage detecting unit during operation of the target electrical load is lower than a predetermined voltage; and
      perform energization operation of the resistor unit so as to increase the resistance value of the resistor unit from an initial value thereof, if the control unit determines that the output voltage is lower than the predetermined voltage.

3. The on-board power supply apparatus according to claim 1, wherein:
   the control unit is further configured to:
      estimate an internal resistance value the first power supply or the second power supply other than the first power supply or the second power supply connected to the target electrical load;
      determine whether the internal resistance value estimated by the control unit has increased from an initial value thereof; and
      perform energization operation of the resistor unit so as to increase the resistance value of the resistor unit from the initial value thereof, if the control unit determines that the internal resistance value has increased.

4. The on-board power supply apparatus according to claim 2, wherein:
   the resistor unit includes:
      a plurality of resistors, and
      a switch that is electrically connected to the resistor; and
   the resistance value of the resistor unit is variably set by the switch being operated.

5. The on-board power supply apparatus according to claim 4, wherein:
   the switch is a rotary switch that includes:
      a cylindrical member having a circular cylindrical shape, an electrode that is provided in the cylindrical member so as to extend in a circumferential direction of the cylindrical member and is exposed on an outer circumferential side of the cylindrical member, and a conductive member that is disposed on an inner circumferential side of the cylindrical member and is electrically connected to the electrode;

a plurality of the electrodes are provided, each of the electrodes corresponding to each of the resistors in a state in which the electrodes are separated from each other in a center axis line direction of the cylindrical member;

the electrodes differ from each other in terms of length extending in the circumferential direction from a reference axis line that passes through an outer circumferential surface of the cylindrical member and extends in the center axis line direction, when the cylindrical member is viewed from the center axis line direction;

the conductive member is electrically connected to the second power supply;

first ends of the resistors are electrically connected to the first power supply side and second ends are in contact with the outer peripheral surface of the cylindrical member; and the resistance value of the resistor unit is variably set depending on a rotation position of the cylindrical member with the center axis line as a center of rotation.

6. The on-board power supply apparatus according to claim 2, wherein:

the resistor unit includes:

a cylindrical member having a circular cylindrical shape, an electrode that is provided in the cylindrical member so as to extend in a circumferential direction of the cylindrical member and is exposed on an outer circumferential side of the cylindrical member, a first conductive member that is disposed on an inner circumferential side of the cylindrical member and is electrically connected to the electrode, and a second conductive member that is electrically connected to the first power supply;

the electrode is provided such as not to extend completely around the outer circumferential surface of the cylindrical member when the cylindrical member is viewed from a center axis line direction;

the first conductive member is electrically connected to the second power supply;

the second conductive member is in contact with the electrode on the outer circumferential surface side of the cylindrical member; and the resistance value of the resistor unit is variably set depending on a rotation position of the cylindrical member with the center axis line as a center of rotation.

7. The on-board power supply apparatus according to claim 1, wherein:

the control unit is further configured to set the resistance value of the resistor unit such that an output voltage of each of the plurality of power supplies does not fall below an allowable lower limit thereof, when electric power is discharged from each of the plurality of power supplies.

8. The on-board power supply apparatus according to claim 7, wherein:

the control unit is further configured to set the resistance value of the resistor unit such that loss occurring as a result of a current flowing to the resistor unit is minimized, when electric power is discharged from each of the plurality of power supplies.

9. The on-board power supply apparatus according to claim 1, wherein:

the vehicle is provided with an internal combustion engine as a main on-board engine;

the target electrical load includes an engine starter that imparts an initial rotation on a crank shaft of the internal combustion engine; and the control unit is further configured to:

determine whether an abnormality has occurred in the power supply connected to the engine starter, among the plurality of power supplies, before the engine starter is driven and imparts initial rotation on the crank shaft; and perform energization operation of the resistor unit so as to reduce the resistance value of the resistor unit from the initial value thereof before the engine starter is driven and imparts initial rotation on the crank shaft, when the control unit determines that an abnormality has occurred.

10. The on-board power supply apparatus according to claim 1, wherein:

the control unit is further configured to perform, when the on-board power supply apparatus is in an off state, energization operation of the resistor unit so as to increase the resistance value of the resistor unit from a resistance value when the on-board power supply apparatus is in an off state, and the control unit receives electric power from each of the plurality of power supplies.

11. The on-board power supply apparatus according to claim 1, wherein:

the control unit is further configured to:

calculate the resistance value of the resistor unit;

determine whether an abnormality has occurred in the resistor unit based on the resistance value calculated by the control unit; and issue a notification that an abnormality has occurred when the control unit determines that an abnormality has occurred.

12. The on-board power supply apparatus according to claim 11, wherein:

the control unit is further configured to determine whether an abnormality has occurred in the resistor unit before the vehicle starts traveling.

13. The on-board power supply apparatus according to claim 12, wherein:

the control unit is further configured to:

determine whether an abnormality has occurred in a function for varying the resistance value of the resistor unit, after the engine starter is driven and imparts initial rotation on the crank shaft, and before the vehicle starts to travel; and issue a notification that an abnormality has occurred when the control unit determines that an abnormality has occurred in the function for varying the resistance value of the resistor.

14. The on-board power supply apparatus according to claim 1, wherein:

the control unit is configured to perform, as the control of the vehicle, travelling control of the vehicle.

15. The on-board power supply apparatus according to claim 1, wherein:

the vehicle is provided with an internal combustion engine as a main on-board engine;

the target electrical load includes at least one of a starter that imparts initial rotation on a crank shaft of the internal combustion engine, an electric supercharger that supercharges intake air supplied to the internal combustion engine, and an electrical load that is separate from the starter and the electric supercharger, and of which power consumption exceeds 300 W.

16. The on-board power supply apparatus according to claim 1, wherein:
the control unit is further configured to:
estimate an internal resistance value of each of the first power supply and the second power supply; and
issue a notification of information related to a degradation state of each of the first power supply and the second power supply based on the internal resistance value estimated by the control unit.

17. The on-board power supply apparatus according to claim 16, wherein:
the control unit is further configured to:
determine whether the internal resistance value of the first power supply estimated by the control unit exceeds a first predetermined value;
determine whether the internal resistance value of the first power supply estimated by the control unit exceeds a second predetermined value that is greater than the first predetermined value; and
issue a notification of information recommending that the first power supply and the second power supply are interchanged when the control unit determines that the internal resistance value exceeds the first predetermined value, and issue a notification of information recommending that the first power supply is replaced when the control unit determines that the internal resistance value exceeds the second predetermined value.

18. The on-board power supply apparatus according to claim 16, wherein:
the control unit is further configured to:
determine whether the internal resistance value of the first power supply estimated by the control unit is greater than the internal resistance value of the second power supply estimated by the control unit by a predetermined value or more; and
issue a notification of information recommending that the first power supply and the second power supply are interchanged when the control unit determines that the internal resistance value of the first power supply is greater than the internal resistance value of the second power by the predetermined value or more.

19. The on-board power supply apparatus according to claim 1, further comprising:
a blocking member that is provided on the connection path and electrically connects each of the plurality of power supplies in a state in which the blocking member is provided on the connection path, wherein
the blocking member electrically blocks the plurality of power supplies from each other in a state in which the blocking member is removed from the connection path.

20. The on-board power supply apparatus according to claim 1, further comprising:
a fuse that is provided on the connection path and electrically connects each of the plurality of power supplies.

21. The on-board power supply apparatus according to claim 1, wherein:
the target electrical load is connected to the first power supply; and
a difference between an inductance of an electrical path connecting from a positive terminal of the first power supply to the target electrical load and an inductance of an electrical path connecting from a positive terminal of the second power supply to the target electrical load is 10 mH or less.

22. The on-board power supply apparatus according to claim 1, wherein:
an output voltage of a target power supply that is a part of the plurality of power supplies is set to a voltage differing from an output voltage of the remaining power supply; and
the on-board power supply apparatus includes a direct current-to-direct current converter that is provided between the target power supply and the remaining power supply, and transforms an input voltage and outputs the transformed voltage.

23. The on-board power supply apparatus according to claim 1, wherein:
at least one of power supply type and capacity is the same among the plurality of power supplies.

* * * * *